(12) United States Patent
Matsuzaki

(10) Patent No.: US 6,239,635 B1
(45) Date of Patent: May 29, 2001

(54) SELF-TIMING CONTROL CIRCUIT

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/325,555

(22) Filed: Jun. 4, 1999

(30) Foreign Application Priority Data

Jul. 6, 1998 (JP) .................................................. 10-190227
Apr. 19, 1999 (JP) .................................................. 11-110478

(51) Int. Cl.[7] ........................................................ H03L 7/00
(52) U.S. Cl. .............................................................. 327/160
(58) Field of Search .................................... 327/141, 142, 327/160–163, 291, 299; 375/354, 359, 362; 377/78

(56) References Cited

U.S. PATENT DOCUMENTS

| | | | |
|---|---|---|---|
| 4,841,167 | * 6/1989 | Saegusa | 375/119 |
| 4,912,734 | * 3/1990 | Frauenglass | 377/20 |
| 5,461,345 | * 10/1995 | Taki | 331/1 A |
| 5,920,214 | * 7/1999 | Lee et al. | 327/147 |
| 6,009,133 | * 12/1999 | Nielsen | 375/374 |

\* cited by examiner

*Primary Examiner*—My-Trang Nu Ton
(74) *Attorney, Agent, or Firm*—Arent Fox Kintner Plotkin & Kahn, PLLC

(57) ABSTRACT

A self-timing control circuit relating to the present invention comprises a clock cycle counting circuit for counting ocillation pulses during a period corresponding to a cycle of the master clock and generating a clock cycle count value. The count value for a period corresponding to the cycle of the master clock is calculated with this clock cycle counting circuit. The self-timing control circuit further comprises a control clock generating portion for generating the control clock, as timed by synchronizing with the master clock, starting a count of the oscillation pulses, and counting up to the clock cycle count value. As a result, the control clock generated is delayed from the master clock by the time taken to count to the measured count value. The timing of the control clock is delayed from the master clock by one cycle or an integer multiple thereof.

24 Claims, 40 Drawing Sheets

Outline of self-timing control circuit

Outline of self-timing control circuit

Fig. 4 FIRST EMBODIMENT

First embodiment (external CLK → data out buffer)

(a) Delay of input buffer
(b) Delay of OSC + DOWN counter
(c) Delay of data out buffer Oscillator for UP counter and DOWN counter Oscillator control portion 23

Oscillator control portion

Second embodiment

Third embodimet(RESET-DOWN counter initializaion)

Third embodiment (external CLK-data output buffer)

Oscillators 119, 121

Oscillators 125, 128

Oscillators 125, 128

Fourth embodiment

Fourth embodiment(2)

19F(OSC(FO))

Fifth embodiment

Oscillator speed select circuit

Oscillator speed selection circuit

Fig.37 SIXTH EMBODIMENT

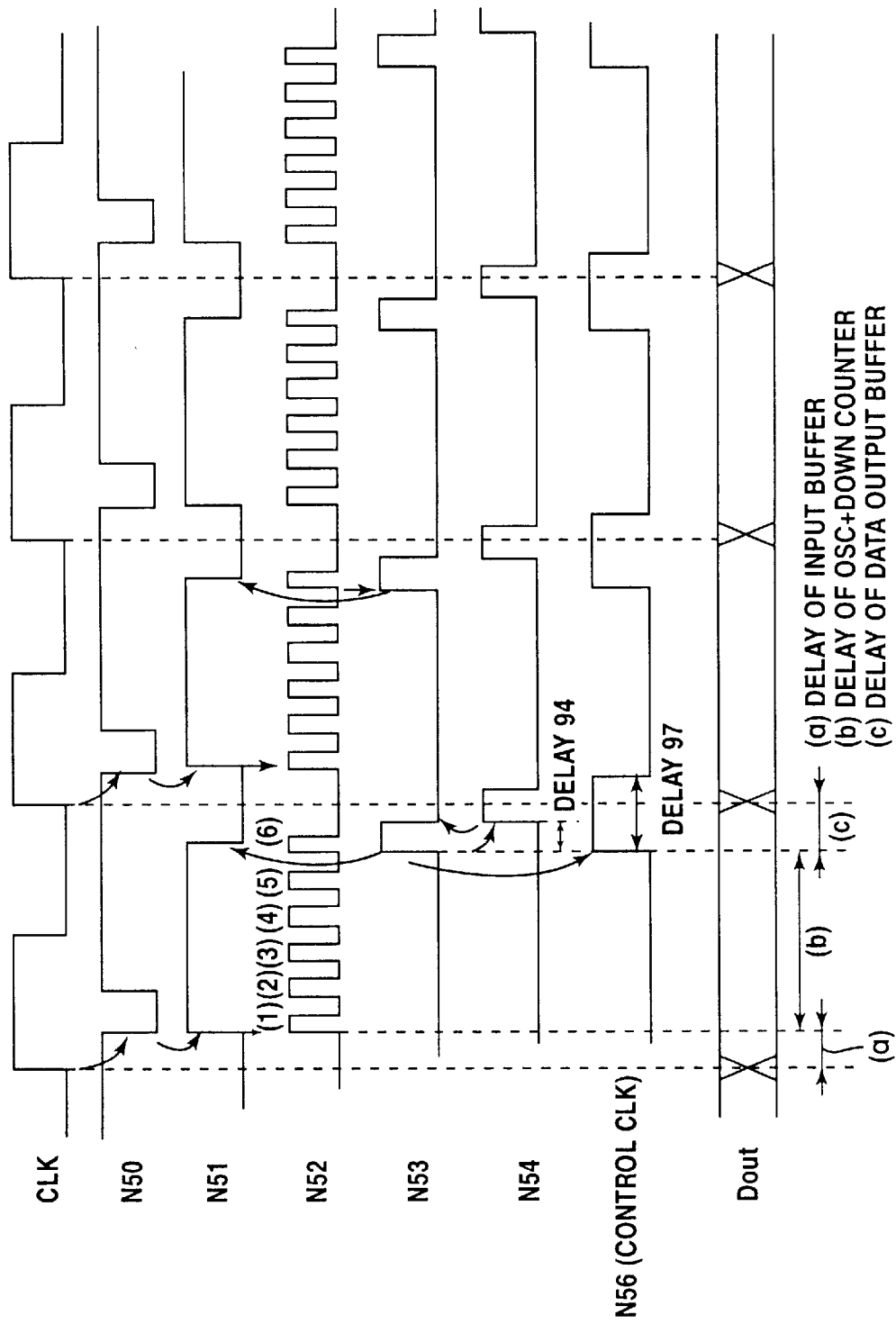

SELF-TIMING CONTROL CIRCUIT

BACKGROUND OF THE INVENTION

1. Field of the Invention

The present invention relates to a self-timing control circuit for generating a control clock synchronized in a prescribed phase relationship to a master clock; and to a self-timing control circuit with a simple circuit structure which can lock on in a short time and which can carry out highly precise timing control for a high speed clock.

2. Description of the Related Art

Synchronous DRAM is one of the latest high speed memory devices. Such a high speed device is supplied command signals, address signals, data signals, and the like in synchronized with a clock by a controller; outputs a data signal in synchronized with the clock. As noted above, high speed operations are realized through the use of the clock as a strobe signal.

In such a device, an external clock is input once into the device and a control signal, being a strobe signal, is generated; in such a case, the phase of the control signal becomes unmatched with the supplied clock due to the delay characteristics of the internal circuitry. For this reason, a self-timing control circuit, to generate a control clock, synchronized in a prescribed phase relationship to a master clock, is established within the device.

Conventional self-timing control circuits utilize a delay locked loop circuitry (DLL circuitsry below) for generating a control clock delayed by one or more cycles of the supplied clock.

FIG. 1 shows the DLL circuitry constituting a conventional self-timing control circuit. In FIG. 1, the external clock signal CLK is supplied by means of an input buffer 1 to a variable delay circuit 2 and a variable delay circuit 4, and is supplied as a first input for a phase comparison circuit 7 at the same time. A delay clock signal d-i-clk is generated from the clock signal c-clk, which is input to the variable delay circuit 4, passes through a dummy data output buffer 5 and a dummy input buffer 6. This delay clock signal d-i-clk is supplied as a second input to the phase comparison circuit 7. The phase comparison circuit 7 compares the phases of the two input signals c-clk and d-i-clk and outputs the results of the comparison to the delay control circuit 8. The delay control circuit 8 controls the amount of the delay of the variable delay circuit 2 and variable delay circuit 4 according to the phase comparison results. The amount of the delay, controlled by the delay control circuit 8, is applied to the clock signal c-clk input to the variable delay circuit 2, the clock signal c-clk is supplied to the data output buffer 3 as a control clock n0. The data output buffer 3 is synchronized with the control clock signal n0 supplied thereto, takes up data DATA, and outputs this data externally as the data output data Dout.

Moreover, the dummy data output buffer 5 is unnecessary when the control clock n0 is used as a strobe signal for the input buffer.

Such DLL circuits are noted in detail in Japanese Patent Application No. 8-339988 (Dec. 19, 1996 application, Japanese Patent Laid-open Publication No. 10-112182, laid open Apr. 28, 1998), for which the present applicants have already applied.

In the aforementioned DLL circuits, however, the variable delay circuits 2, 4 comprise a plurality of serially connected unit delay circuits. Consequently, highly precise control of the timing of the control clock generated requires that the amount of the delay of the unit delay circuits be small and the number of those circuits be large. As a result, the variable delay circuits become large in scale and occupy increased area on the chip, whereby the variable delay circuits become an obstacle to higher integration of integrated circuit devices.

Furthermore, highly precise timing control is necessary in order to have operating speeds in excess of 100 MHz, for example. Even with large scale variable delay circuits, the device cannot handle timing control with finer precision than the amount of delay of the unit delay circuits, as long as digitally control the timing wherein the amount of delay of the unit delay circuits is a variable unit.

Also, a problem is that locking on requires a long period of time when power is turned on or when the device is returning from a powered down state, because the conventional DLL circuits are reset once and then perform a feedback operation for phase matching.

SUMMARY OF THE INVENTION

It is an object of the present invention to provide a self-timing control circuit which can control the timing of the control clock with high precision and with small scale circuitry.

It is another object of the present invention to provide a self-timing control circuit including analog control of the timing of the control clock.

It is another object of the present invention to provide a self-timing control circuit which can enter a locked on state within a short period of time from reset.

A self-timing control circuit relating to the present invention comprises a clock cycle counting circuit for counting ocillation pulses during a period corresponding to a cycle of the master clock and generating a clock cycle count value. The count value for a period corresponding to the cycle of the master clock is calculated with this clock cycle counting circuit. The self-timing control circuit further comprises a control clock generating portion for generating the control clock, as timed by synchronizing with the master clock, starting a count of the oscillation pulses, and counting up to the clock cycle count value. As a result, the control clock generated is delayed from the master clock by the time taken to count to the measured count value. The timing of the control clock is delayed from the master clock by one cycle or an integer multiple thereof.

With this constitution, the period from reset to lock on can be shortened because the delay time of the control clock generating portion is set to a period corresponding to a cycle of the supplied master clock.

A self-timing control circuit relating to another invention further comprises a delay time adjusting circuit, for synchronizing with the master clock, starting a count of oscillation pulses, and generating an oscillator control signal, according to the adjusting count value at the end of a period corresponding to a cycle of the master clock. The frequency of the aforementioned pulses is controlled so that the adjusting count value matches the aforementioned clock cycle count value, according to the oscillator control signal.

Consequently, it is not necessary to establish a large scale variable delay circuit and a delay control circuit corresponding thereto, as the prior art. Also, because fine adjustment of the oscillator frequency is comparatively easy, the range of timing adjustment can be narrowed, making possible highly precise timing control.

Furthermore, in another invention, the frequency of the oscillation clock can be controlled to a high or low frequency, depending on whether the clock cycle count value is high or low. As a result, control clocks corresponding to the frequencies of a wide range of master clocks can be generated without an increase in the number of counters installed. Therefore, different types of oscillators for generating the oscillation clock are installed and those oscillators are switched among depending on the size of the clock cycle count value. Another possibility is to switch operations within the oscillator.

In order to achieve the aforementioned objects, the present invention is a self-timing control circuit for generating a control clock, synchronized in a prescribed phase relationship to a master clock, comprising:

a clock cycle counting circuit for counting oscillation pulses for a period corresponding to a cycle of the master clock and generating a clock cycle count value; and a control clock generating portion for starting a count of the oscillation pulses in synchronized with the master clock, and generating the control clock at a timing when counting up to the clock cycle count value.

With such a constitution, the period corresponding to the master clock cycle is measured and then the master clock is delayed according to the measurement results. The generated control clock therefore becomes a clock which is delayed from the master clock by a period corresponding to one cycle.

In order to achieve the aforementioned objects, another invention is a self-timing control circuit for generating a control clock, synchronized in a prescribed phase relationship to a master clock, comprising:

a clock cycle counting circuit for counting oscillation pulses for a period corresponding to a cycle of the master clock and generating a clock cycle count value;

a delay time adjusting circuit for starting a count of oscillation pulses in synchronized with the master clock, and generating an oscillator control signal, according to an adjusting count value at the end of the period corresponding to the cycle of the master clock; and a control clock generating portion for starting a count of the oscillation pulses in synchronized with the master clock, and generating the control clock at a timing when counting up to the clock cycle count value;

wherein the frequency of the oscillation pulses, counted by the delay time adjusting circuit and control clock generating portion, is controlled by the oscillator control signal so that the adjusting count value is matched to the clock cycle count value.

With the aforementioned constitution, the period corresponding to the master clock cycle is measured and then the master clock is delayed according to the measurement results. Thereafter, the delay time of the control clock can be correctly adjusted to a period corresponding to a cycle of the supplied master clock through analog control of the frequency of the pulses in a period corresponding to the master clock cycle.

Furthermore, in order to achieve the aforementioned objects, another invention is a self-timing control circuit for generating a control clock, synchronized in a prescribed phase relationship to a master clock, comprising:

a clock cycle counting circuit including a first oscillator for generating oscillation pulses for a period corresponding to the master clock cycle, and a first counter for counting the oscillation pulses generated by the first oscillator and generating a clock cycle count value; and a control clock generating portion including a second oscillator for starting oscillation in response to the master clock, and a second counter for counting the oscillation pulses generated by the second oscillator and generating the control clock as timed by counting up to the clock cycle count value; wherein the frequency of the first and second oscillators is raised or lowered depending on the presence of an overflow operation of the first counter.

With the aforementioned constitution, the cycle length of the supplied master clock can be made flexible.

Furthermore, in order to achieve the aforementioned objects, another invention is a self-timing control circuit for generating a control clock, synchronized in a prescribed phase relationship to a master clock, comprising: a clock cycle counting circuit including a first oscillator for generating oscillation pulses for a period corresponding to the master clock cycle, in response to a reset signal, and a first counter for counting the oscillation pulses generated by the first oscillator and generating a clock cycle count value;

a control clock generating portion including a second oscillator for starting oscillation in response to the master clock, and a second counter for counting the oscillation pulses generated by the second oscillator and generating the control clock as timed by counting up to the clock cycle count value; and a delay time adjusting circuit including a third oscillator for starting oscillation in response to the master clock and a third counter for counting the oscillation pulses generated by the third oscillator; said delay time adjusting circuit generating an oscillator control signal according to the phase of the oscillation pulses at the end of a period corresponding to the master clock cycle;

wherein the frequency of the oscillation pulses, counted by the delay time adjusting circuit and the control clock generating portion, is controlled by the oscillator control signal, so that a count value of the third counter at the end is matched to the clock cycle count value; and wherein the frequency of the first and second oscillators is raised or lowered according to the presence of an overflow operation of the first counter.

With the aforementioned constitution, the cycle length of the supplied master clock can be made flexible.

BRIEF DESCRIPTION OF THE DRAWINGS

FIGS. 39 and 40 are timing charts showing the operations of the self-timing control circuit in the sixth embodiment.

DESCRIPTION OF THE PREFERRED EMBODIMENTS

The preferred embodiments of the present invention are explained below with reference to the figures. However, the technical scope of the present invention is not limited to these embodiments.

Figure 1:
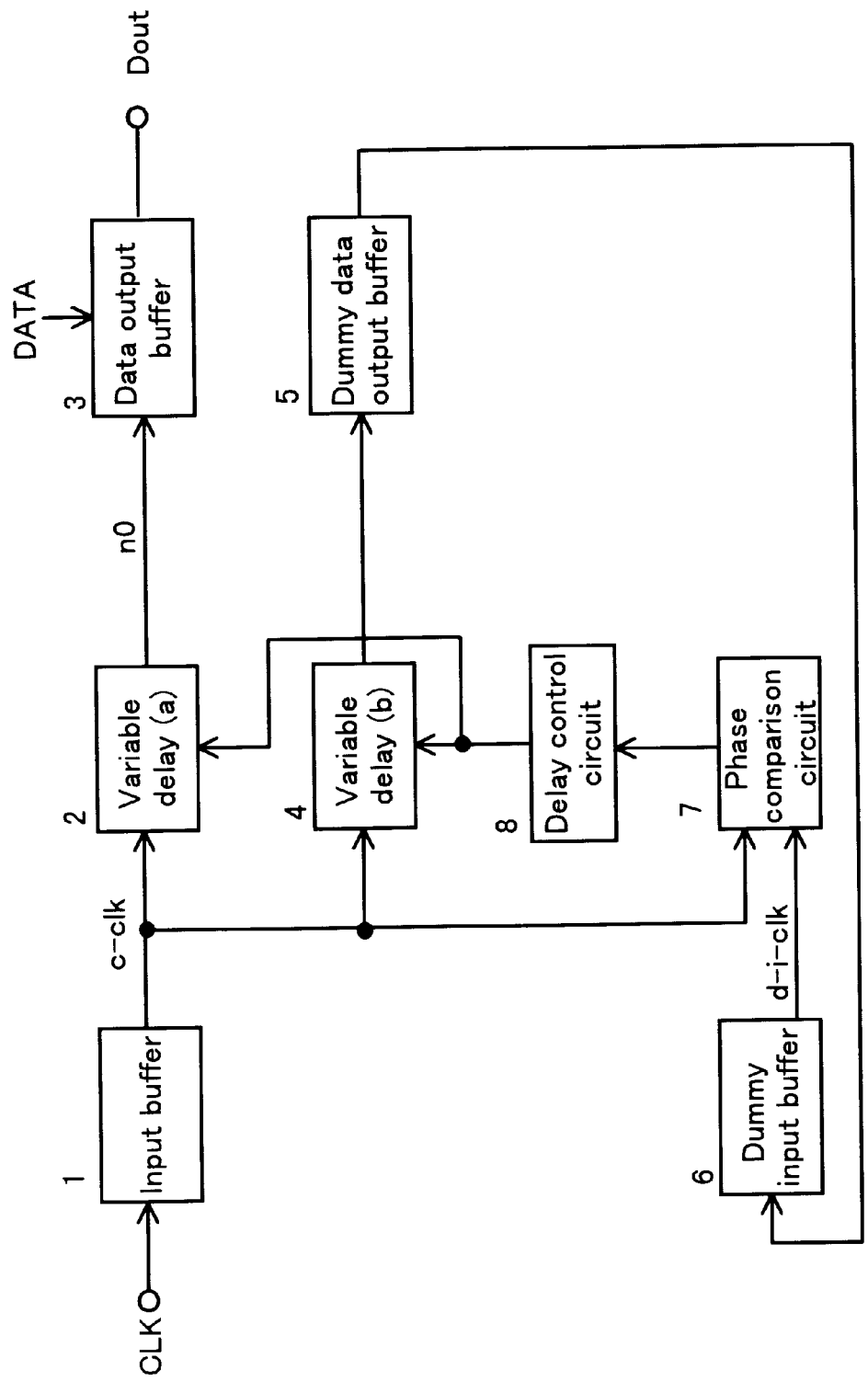
FIG. 1 shows the DLL circuitry, which is a conventional self-timing control circuit.
Figure 2:
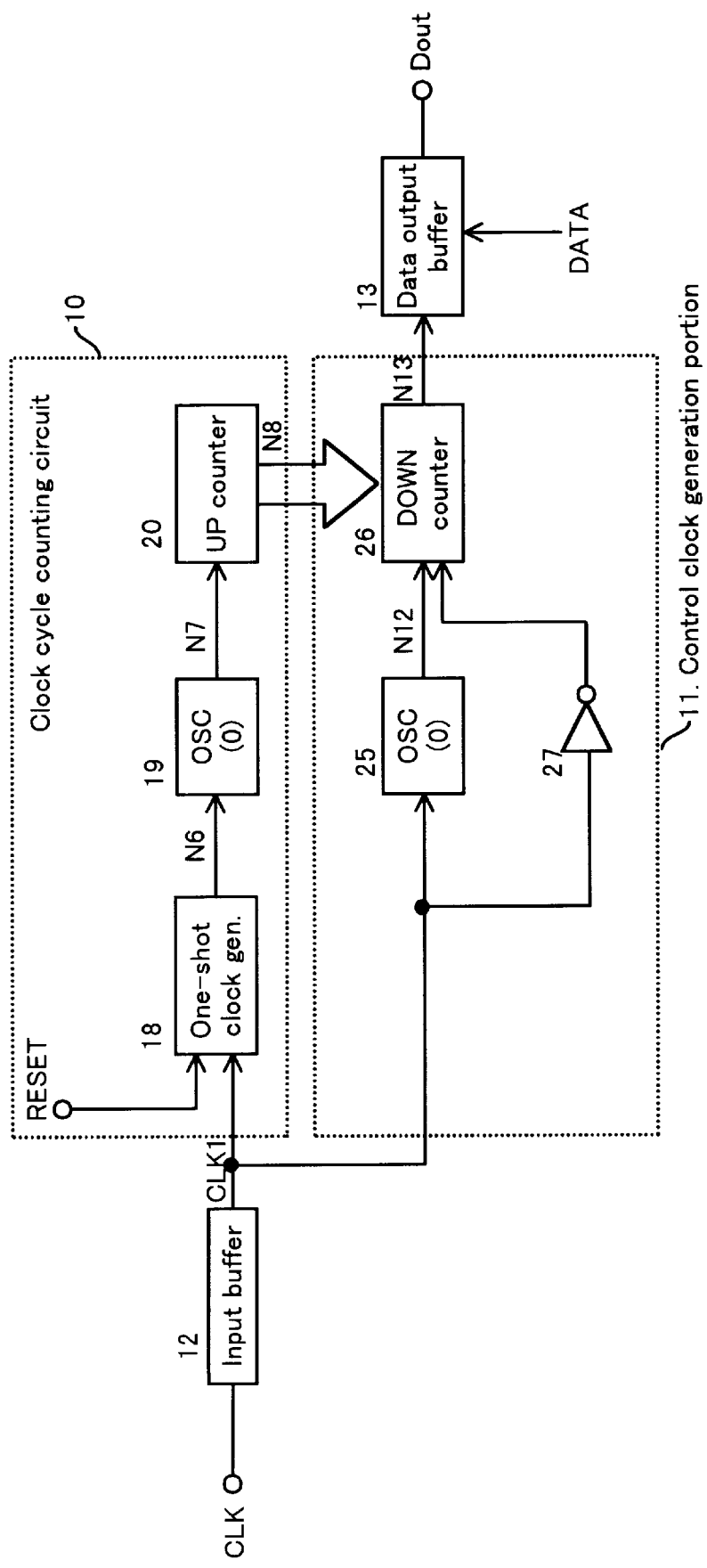
FIG. 2 is an outline of the self-timing control circuit relating to the present invention.

FIG. 2 is an outline of the self-timing control circuit relating to the present invention. With the general constitution shown in FIG. 2, the self-timing control circuit generates a control clock N13 synchronized in a phase relationship to an external master clock CLK. The control clock N13 is a clock synchronized with the rising edge of the master clock CLK and the rise of the control clock N13 is delayed by one cycle. In response to the rising edge of the control clock N13, data DATA is output from the data output buffer 13 as output data Dout. Consequently, the control clock generating portion 11 has the function of delaying the clock CLK1 by a time consisting of one cycle of the master clock CLK less the delay time of the input buffer 12 and output buffer 13. In the case of generating the control clock N13 for taking up an input signal from an internal input buffer in synchronized with the master clock CLK, the delay time of the control clock generating portion 11 becomes a time consisting of one cycle of the master clock CLK less the delay time of the input buffer 12.

The self-timing control circuit in FIG. 2 comprises a clock cycle counting circuit 10 for counting the pulses N7 for a period corresponding to a cycle of the clock CLK1 and generating a clock cycle count value N8; and a control clock generating portion 11 which starts to count pulses N9 in synchronized with the clock CLK1, and generates the control clock N13 at a timing when counting up to the clock cycle count value N8. The clock cycle counting circuit 10 includes the following: a one-shot clock producing portion 18 for forming in one shot a clock N6 with pulse width corresponding to one cycle of the clock CLK1 (more correctly, pulse width for the delay time of the control clock generating portion 11) in response to a reset signal RESET; an oscillator 19 for oscillating during the pulse width of the clock N6; and an up counter 20 for counting the number of oscillation pulses N7. With such a constitution, the clock cycle counting circuit 10 generates a number of oscillation pulses N7 in a period corresponding to a cycle of the supplied master clock CLK, as a counter value N8 of the up counter 20, in response to the reset signal RESET. This clock cycle count value N8 is set in the down counter 26.

Also, the control clock generating portion 11 includes an oscillator 25 for starting oscillation at the rising edge of the clock CLK1 and a down counter 26 for counting the oscillation clock N12 up to the clock cycle count value N8. The control clock N13 is output at the time when the down counter 26 finishes counting the clock cycle count value N8. Consequently, the control clock N13 is delayed from the rising edge of the master clock CLK1, by a period corresponding to a cycle of the clock measured at reset. As a result, the control clock N13 is a clock synchronized with the rising edge of the master clock CLK1 and controls the operation timing for the output buffer 13.

Figure 3:
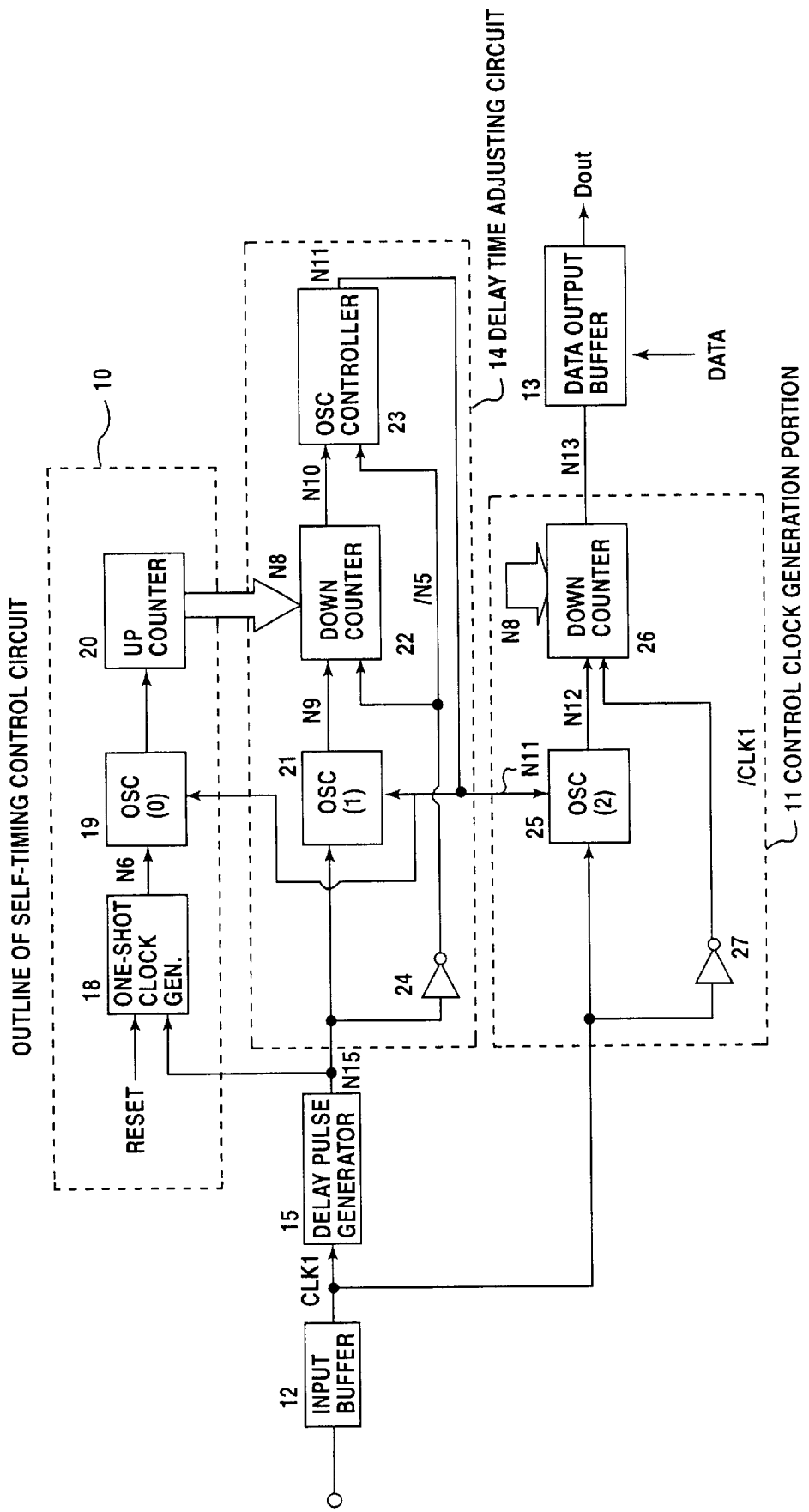
FIG. 3 is an outline of the self-timing control circuit relating to a second invention.

FIG. 3 shows the self-timing control circuit relating to a second invention. This self-timing control circuit generates a control clock N13 which is synchronized in a prescribed phase relationship to the master clock CLK. In response to a reset signal RESET, the clock cycle counting circuit 10 counts the oscillation pulses N7 for a period corresponding to a cycle of the clock CLK1 and generates the clock cycle count value N8. The delay time adjusting circuit 14 starts counting the oscillation pulses N9 in synchronized with the clock CLK1, and generates the oscillator control signal N11 according to the adjusting count value N10 at the end of the period corresponding to a cycle of the master clock.

Then, the control clock generating portion 11 starts counting oscillation pulses N12 in synchronized with the clock CLK1, and generates the control clock N13 upon counting up to the clock cycle count value N8. Then, the frequency of the oscillation pulses N9, N12, counted by the delay control adjusting circuit 14 and control clock generating portion 11, is controlled by the oscillator control signal N11 so that the adjusting count value N10 is matched to the clock cycle count value N8.

The constitutions of the control clock generating portion and clock cycle counting circuit 10 in FIG. 3 are different from the example in FIG. 2, in regards to the frequency of the oscillator being controlled by the oscillator control signal N11. In the example in FIG. 3, the output clock CLK1 of the input buffer 12 is supplied to the delay pulse generating portion 15, and a clock N5, having a pulse width comprising the clock cycle excluding the delay time of the input buffer 12 and data output buffer 13, is generated. In response to the reset signal RESET, a one shot pulse signal N6 is generated from this clock N5 and used for counting the clock cycle count value N8.

In the delay time adjusting circuit 14, the oscillator 21 continually generates the oscillation pulses N9 during a period corresponding to the pulse width of the clock N5; the down counter 22, wherein the clock cycle count value N8 is set, counts down the oscillation clock N9. The adjusting count value N10 is output at the falling edge of the clock N5. More specifically, the high level or low level signal N10 is output at that time. Depending on this signal N10, the oscillator control portion 23 generates the oscillator control signal N11 for controlling the oscillator frequency. With this oscillator control signal Nil, the frequencies of the oscillators 19, 21, 25 are controlled so that the output N10 of the down counter 22 matches the clock cycle count value at the end of the cycle of the clock N5. As a result, the timing of the control clock N13, which is generated by the down counter 26 counting the oscillator clock N12 with the same frequency, is controlled to match the timing of the end of the cycle of the clock N5.

With the aforementioned constitution, the delay time is set in the control clock generating circuit 11 roughly in response to the reset signal. Afterwards, the frequency of the oscillator is controlled according to the cycle of the supplied clock CLK, and the delay time of the aforementioned control clock generating circuit 11 is controlled to the delay time corresponding to that cycle. Oscillator frequency can be controlled with a roughly analog system as discussed below; timing control can therefore be carried out with high precision using small scale circuitry.

First Embodiment

Figure 4:
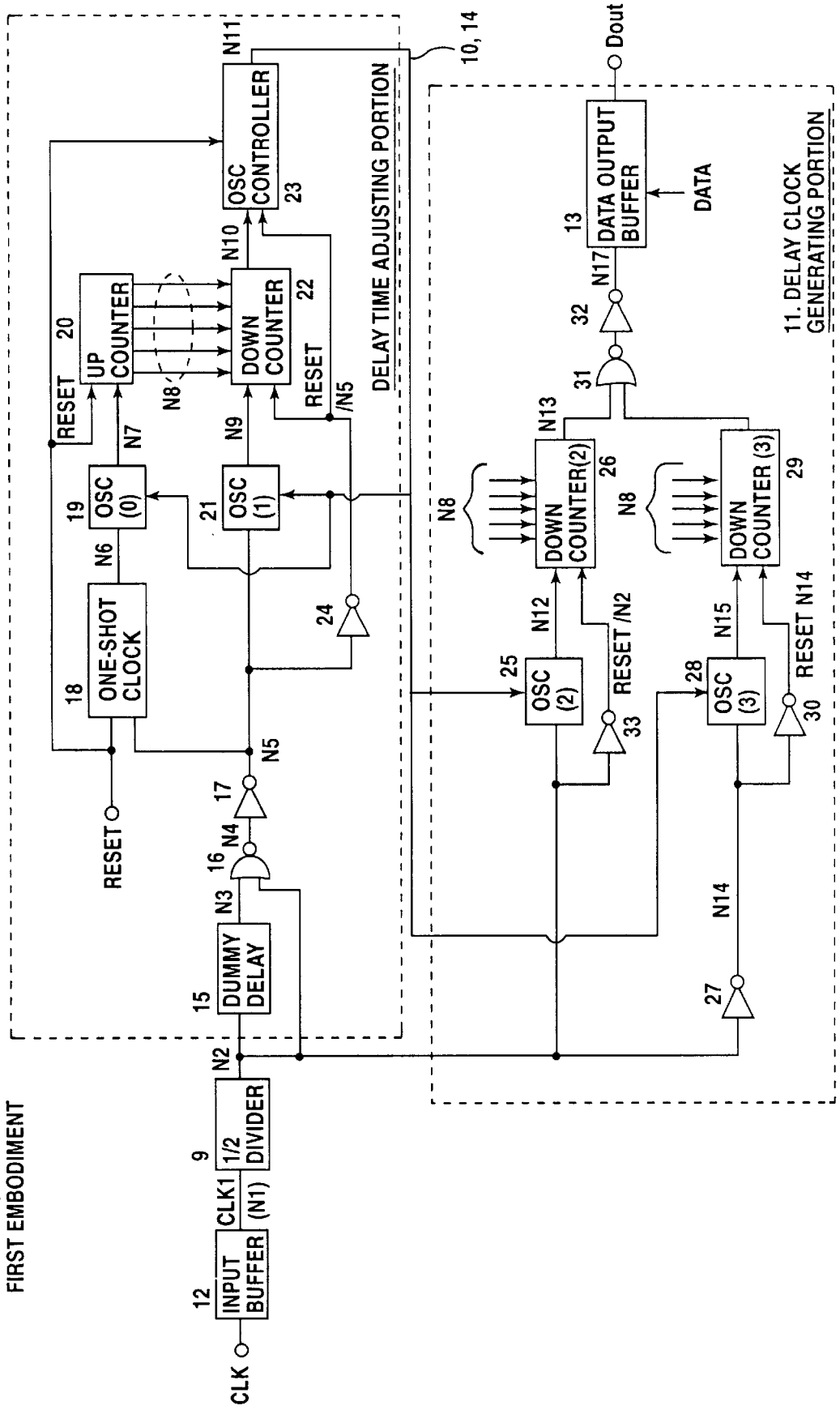
FIG. 4 is a detail of the constitution of the self-timing control circuit relating to a first embodiment of the present invention.
Figure 5:
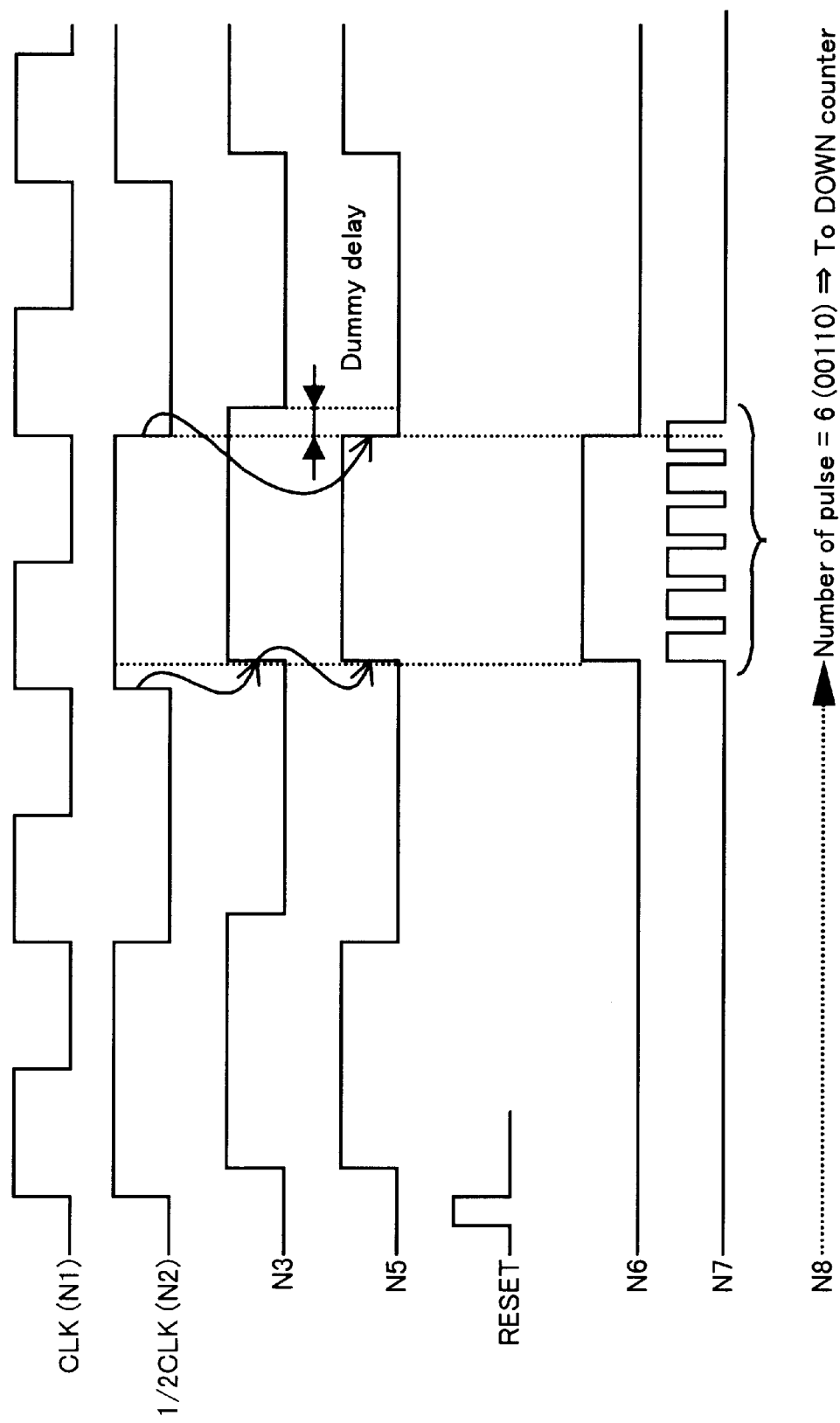
FIG. 5 is a timing chart for the first embodiment.
Figure 6:
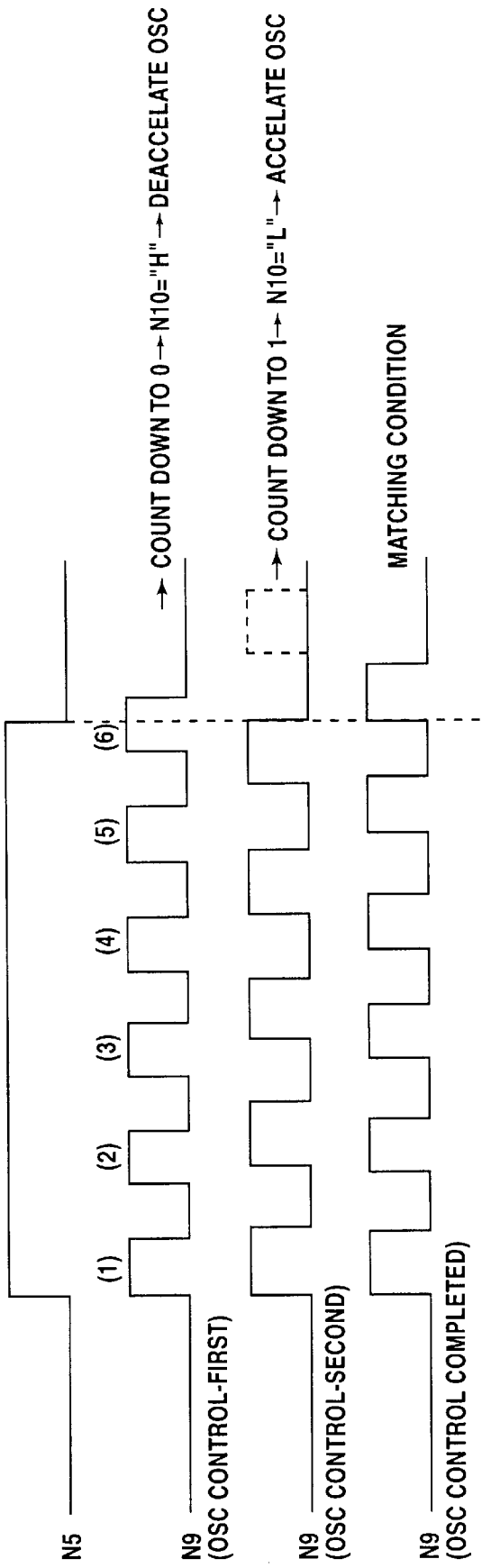
FIG. 6 is a timing chart for the first embodiment.
Figure 7:
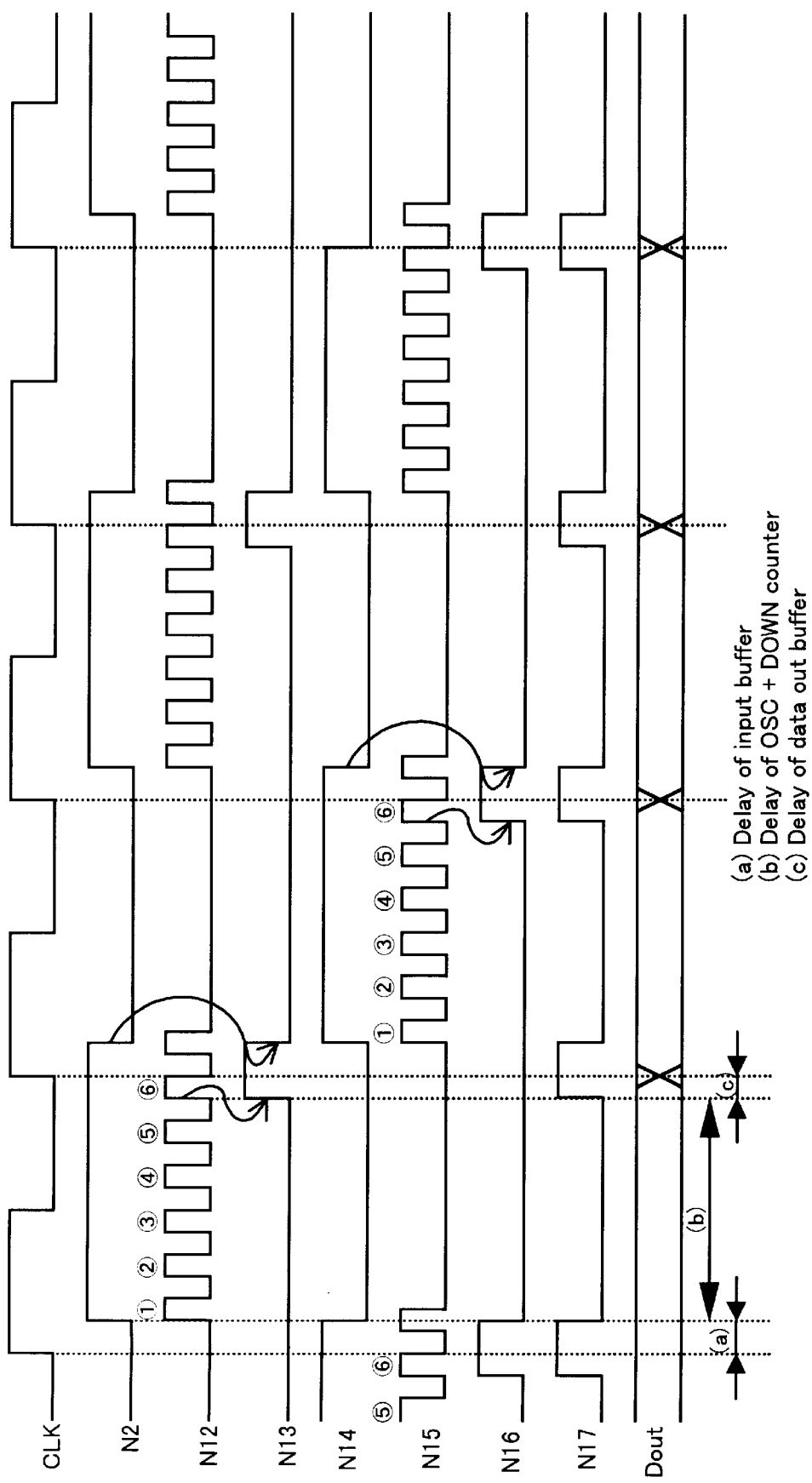
FIG. 7 is a timing chart for the first embodiment.

FIG. 4 shows in detail the structure of the self-timing control circuit of the first embodiment of the present invention. FIGS. 5, 6, and 7 are timing charts for the first embodiment. This first embodiment is an embodiment corresponding to the second invention shown in FIG. 3. This is explained in detail below with reference to these figures.

As in FIG. 3, the present embodiment comprises a clock cycle counting circuit 10, delay time adjusting portion 14, and a control clock generating portion 11. The external clock signal CLK is supplied to ½ frequency divider 9 by means of the input buffer 12. The ½ frequency divider 9 generates a half clock N2 having a pulse width of one cycle of the clock signal N1. The ½ frequency devided clock N2 is input to the NAND circuit 16 along with the clock signal N3 delayed by the dummy delay circuit 15. The output N4 of the NAND circuit 16 is supplied to the one-shot clock emitter 18 and oscillator 21 by means of the inverter 17. As shown in FIG. 5, the pulse width of the clock signal N5 signal becomes shorter than the pulse width of the half clock N2 by the amount of delay of the dummy delay circuit 15. The delay time of this dummy delay circuit 15 is set at the delay time of the data output circuit 13, The ½ frequency divider 9, and input buffer 12, for example. Also, the ½ frequency divided clock N2 and the inverse signal N14 of the clock N2 are supplied to the oscillator 28 and oscillator 25 within the delay clock generating portion 11. Clock cycle counting operation (See FIG. 5)

The initial values of the down counters ((1), (2), (3)) 22, 26, 29 are set when power is applied to an integrated circuit device and the supply of clock CLK begins. When the initial values are set, the reset signal RESET is supplied to the one-shot clock emitter 18, up counter 20, and oscillator control portion 23.

One cycle after the reset signal RESET is supplied, the one-shot clock emitter 18 supplies the signal N6 for one pulse of the clock signal N5 to the oscillator 19. The oscillator 19 starts emitting a pulse signal in synchronized with the rising edge of the signal N6. Then, while the signal N6 is high level, the oscillator 19 generates the oscillation pulse signal N7 and supplies this to the up counter 20. Moreover, examples and operations of the one-shot clock emitter 18 and oscillator 19 are discussed below.

The up counter 20 counts up the rising edges of the oscillation pulse signal N7 from the oscillator 19 and supplies the number of pulses N8 calculated as a result thereof to the down counters ((1), (2), (3)) 22, 26, 29 as initial values for down counter. In the case in FIG. 5, six rising edges are counted and binary data N8, being 00110, is set in the down counters ((1), (2), (3)) 22, 26, 29.

Oscillator Frequency Control (See FIG. 6)

The aforementioned clock signal N5 is supplied to the oscillator 21 in the delay time controlling portion 14; the inverse signal of the clock signal N5 is supplied to the down counter 22 as the reset signal. The oscillator 21 starts generating the pulse signal N9 in synchronized with the rising edge of the supplied clock signal N5. Then, while the clock signal N5 is high level, the oscillator 21 generates the pulse signal N9 and supplies this to the down counter 22. The down counter 22 counts down the rising edges of the pulse signal N9 supplied from the oscillator 21 from the initial value of N8=6. The countdown ends at the falling edge of the clock signal N5. In the case of counting down to zero, the low level signal N10 is output, and in case of not counting down to zero, the high level signal N10 is output and the signal N10 is supplied to the oscillator control portion 23. The down counter 22 is reset at the fall of the clock signal N5; after resetting, the signal N10 becomes low level and the counter value is returned to the initial value.

The oscillator control portion 23 finely adjusts the frequencies of the pulse signals N7, N9, N12, N15, emitted by each oscillator, by supplying the oscillator control signal N11 to the oscillators ((0)–(3)) 19, 21, 25, 28 on the basis of the level at reset of the output signal N10 of the down counter 22. As shown in FIG. 6, the oscillators are controlled so that the frequency of the pulse signal from the oscillator becomes low when the signal N10 is high level and the frequency of the pulse signal from the oscillator becomes high when low level. The oscillator control portion 23 repeats this operation and, as shown in FIG. 6, matches the rising edge of the final pulse signal N9 emitted by the oscillator 21 with the falling edge of the pulse signal N5.

Data Output Timing Control (See FIG. 7)

The ½ frequency divided clock N2 is supplied to the oscillator 25; the inverse signal /N2 of the divided clock N2 is supplied as a reset signal to the down counter 26. The oscillator 25 synchronizes with the rising edge of the supplied divided clock N2 and initiates output of the pulse signal N12. Then, while the divided clock N2 becomes high level, the oscillator 25 emits the pulse signal N12 and supplies this to the down counter 26. The down counter 26 counts the rising edges of the pulse signal N12 from the oscillator 25 down from the initial value N8=6. When the counter value reaches zero, the high level signal N13 is supplied to the final NOR circuit 31. The down counter 26 is reset as timed by the fall of the divided clock N2; the output signal N13 of the down counter 26 becomes low level; and the counter value is returned to the initial value.

The operation of the oscillator 28 and down counter 29 is basically the same as that of the oscillator 25 and down counter 26. The difference is that the signals N14 and /N14 input to the oscillator 28 and down counter 29 are the inverse signals of the signals N2 and /N2 input to the oscillator 25 and down counter 26. For this reason, the pulse signals N13, N16 from the down counter 26 and down counter 29 are emitted with a 360 degree phase difference, as shown in FIG. 7, based on the external clock signal CLK.

The logical sum of the output signals N13, N16 from the down counter 26 and down counter 29 is taken by the NOR gate 31 and inverter 32 so that the control clock N17 is generated. The control signal N17 therefore becomes a pulse signal with the same cycle as the external clock CLK, wherein the timing of the rising edges conforms, and is supplied to the data output buffer 13. The data output buffer 13 synchronizes with the supplied control clock signal N17, takes up data DATA, and outputs this as output Dout.

The timing of the data output Dout has a 360 degree phase difference with the rising edge of the corresponding external clock signal CLK. FIG. 7 shows this breakdown of the phase difference: (a) delay due to input buffer 12 (actually includes ½ frequency divider a as well), (b) delay due to oscillators 25, 28 and down counters 26, 29, and (c) delay due to data output buffer 13. In this embodiment, (a) delay due to input buffer 12 and (c) delay due to data output buffer 13 are simulated by the dummy delay circuit 15. Furthermore, the present embodiment can provide a self-timing control circuit with very high precision because of the analog adjustment of the (b) delay due to oscillator and down counter within the control clock generating portion 11, using the oscillator control signal N11 from the oscillator control portion 23. The control of oscillator frequency is discussed below.

Moreover, an N-layered structure, rather than a two-layered structure, of the oscillators 25, 28 and down counters 26, 29 of the control clock generating portion 11 makes it possible to generate a control clock with a 360/2N phase difference, with respect to the divided clock N2 from the external clock CLK, which is the standard.

Example and Operation of the One-Shot Clock Emitter 18

Figure 8:
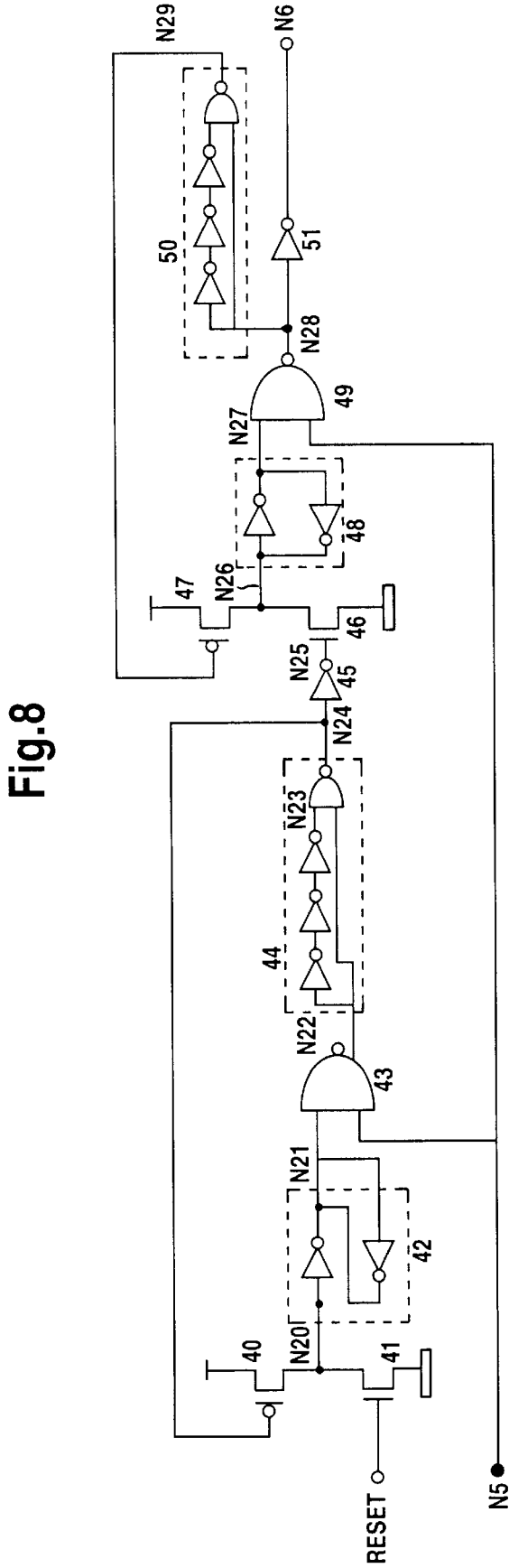
FIG. 8 shows an example of a one-shot clock generator 18.
Figure 9:
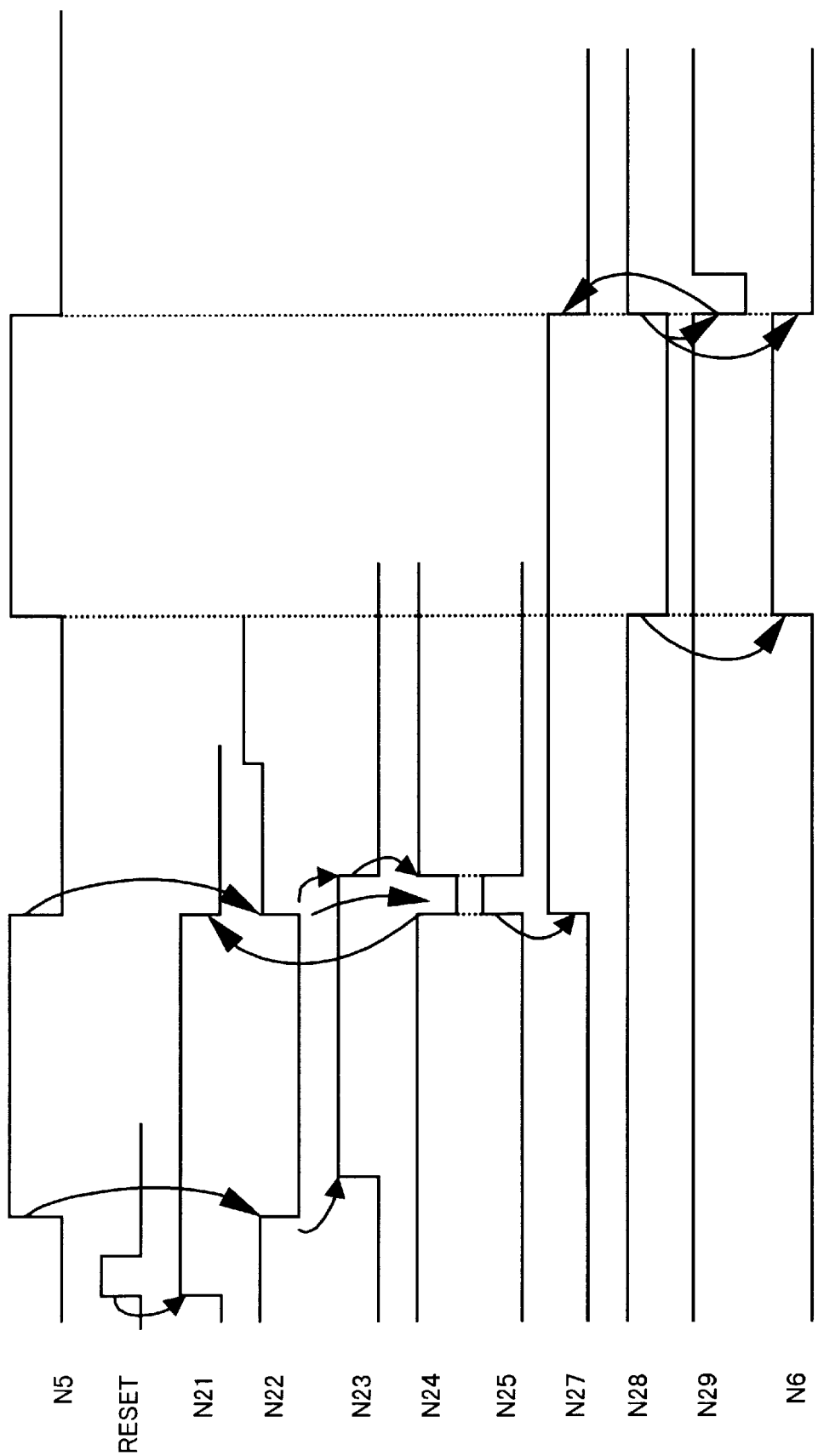
FIG. 9 shows the timing chart for the one-shot clock generator 18.

FIG. 8 shows an example of the one-shot clock emitter 18. FIG. 9 is a timing chart for the operation thereof. The one-shot clock emitter 18 is a circuit which, after emitting the reset signal RESET, generates one pulse signal N6 with the same pulse width as the clock signal N5, and supplies this to the oscillator 19.

When the reset signal RESET is emitted, the NMOS transistor 41 turns ON. Because the PMOS transistor 40 turns OFF at this time, the signal N20 becomes low level. The signal N20 is latched by the latch circuit 42; the output N21 thereof becomes high level and is supplied to the NAND circuit 43. The clock signal N5, emitted directly after the reset signal RESET is emitted, is also input to the NAND circuit 43. Because the signal N21 is high level at this time, the NAND circuit 43 outputs the inverse signal N22 of the clock signal N5.

Synchronized with the rising edge of the pulse signal N22, a negative pulse signal N24 is emitted from the pulse emitting circuit 44 and is supplied to the PMOS transistor 40. This turns on the PMOS transistor 40. Because the NMOS transistor 41 becomes OFF at this time, the node N20 becomes high level and the output N21 of the latch circuit 42 becomes low level. As a result, the high level signal N22 is output from the NAND circuit 43, regardless of the level of the clock signal N5, and the first circuit of the one-shot clock emitter 18 returns to the state prior to the emission of the reset signal RESET.

The negative pulse signal N24 emitted by the pulse emitting circuit 44 becomes a positive pulse signal N25 by means of the inverter 45 and turns ON the NMOS transistor 46. Because the PMOS transistor 47 becomes OFF at this time, the node N26 becomes low level. Then, the signal N26 is latched by the latch circuit 48; the output N27 thereof becomes high level and is supplied to the NAND circuit 49. The second clock signal N5, emitted after the reset signal RESET, is also input to the NAND circuit 49. Because the signal N27 becomes high level at this time, the NAND circuit 49 outputs the inverse signal N28 of the clock signal N5. This signal N28 is supplied to the oscillator 19 by means of the inverter 51 as a pulse signal N6 having the same pulse width as the clock signal N5.

Synchronized with the rising edges of the pulse signal N28, a negative pulse signal N29 is emitted from the pulse emitting circuit 50 and turns ON the PMOS transistor 47. Because the NMOS transistor 47 becomes OFF at this time, the node N26 becomes high level and the output N27 of the latch circuit 48 becomes low level. Regardless of the level of the clock signal N5, the high level signal N28 is output from the NAND circuit 49 and the second circuit of the one-shot clock emitter 18 returns to the state prior to the emission of the reset signal RESET.

As noted above, when the reset signal RESET is emitted before the falling edge of the first clock signal N5, the first circuit in the one-shot clock emitter 18 shown in FIG. 9 detects and latches it, and generates a one shot clock N6 synchronized with the rising edge and falling edge of the second clock signal N5. When the reset signal RESET is emitted after the falling edge of the clock signal N5, the reset signal RESET is detected at the rising edge of the second clock N5 in FIG. 9 and generates a one shot clock N6 synchronized with a third clock N5, not shown.

Example and Operation of Oscillator

Figure 10:
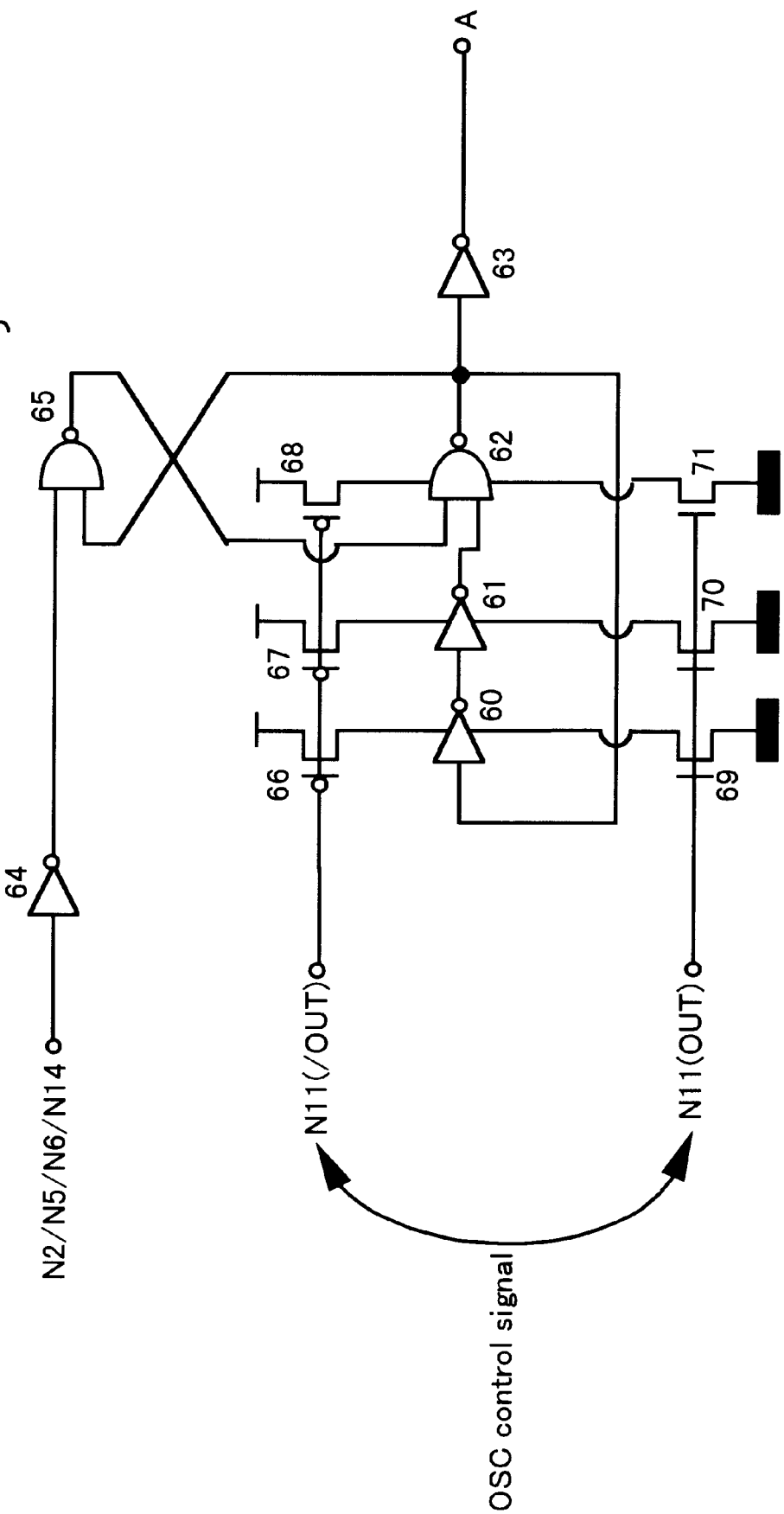
FIG. 10 shows examples of oscillators 19, 21, 25, and 28.
Figure 11:
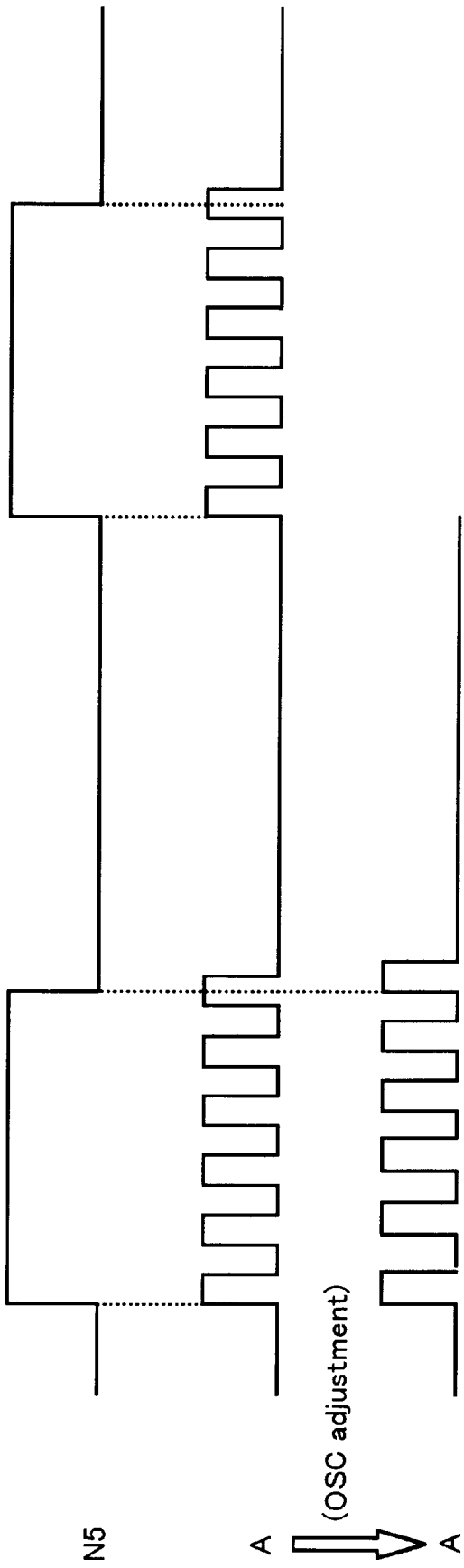
FIG. 11 shows a timing chart for an oscillator.

FIG. 10 shows examples of the oscillators 19, 21, 25, 28. FIG. 11 is a time chart for the operation thereof.

The oscillators 19, 21, 25, 28 are multivibrators comprising inverters 60, 61 and NAND circuit 62. Furthermore, the NAND circuit 62 forms an RS flip-flop with a NAND circuit 65. When the input clock signals (N2/N5/N6/N14) become high level, a set signal is input to the RS flip-flop circuits 62, 65 and the output of the NAND circuit 65 becomes high level. The NAND circuit 62 is opened thereby and output pulse of the multivibrators is output as an oscillation pulse A by means of the inverter 63. When the clock signals (N2/N5/N6/N14) become low level, the output of the NAND circuit 65 becomes low level at the point in time when the output A becomes low level, in effect, the output of the NAND circuit 62 becomes high level. For this reason, pulsed output from the output terminal A stops.

Power is supplied to each of the inverters 60, 61 and NAND circuit 62 comprising the multivibrator by means of the PMOS transistors 66, 67, 68 and the inverters 60, 61 and NAND circuit 62 are grounded by means of NMOS transistors 69, 70, 71. The oscillator control signal N11 (/OUT) is supplied as the gate voltage of the aforementioned PMOS transistors 66, 67, 68; the oscillator control signal N11 (OUT) is supplied as the gate voltage of the NMOS transistors 69, 70, 71.

When the timing of the rise of the final pulse signal N10 emitted by the oscillator 21 is sooner than the timing of the fall of the pulse signal N5, the voltage level of the oscillator control signal N11 (/OUT) rises and the voltage level of the signal N11 (OUT) drops. Accordingly, the rise time and fall time of the inverters 60, 61 and NAND circuit 62 become longer and the frequency of the oscillator decreases. In other words, this slows the oscillator.

On the other hand, when the timing of the rise of the final pulse signal N10 emitted by the oscillator 21 is later than the timing of the fall of the pulse signal N5, the voltage level of the oscillator control signal N11 (/OUT) drops and the voltage level of the signal N11 (OUT) signal rises. Accordingly, the rise time and fall time of the inverters 60, 61 and NAND circuit 62 become shorter and the frequency of the oscillator increases. In other words, this speeds up the oscillator.

In this way, the frequencies of the pulse signals emitted by all the oscillators 19, 21, 25, 28 are adjusted so that the falling edge of the pulse signal N5 coincides with the rising edge of the final pulse signal N10 emitted by the oscillator 21.

Figure 12:
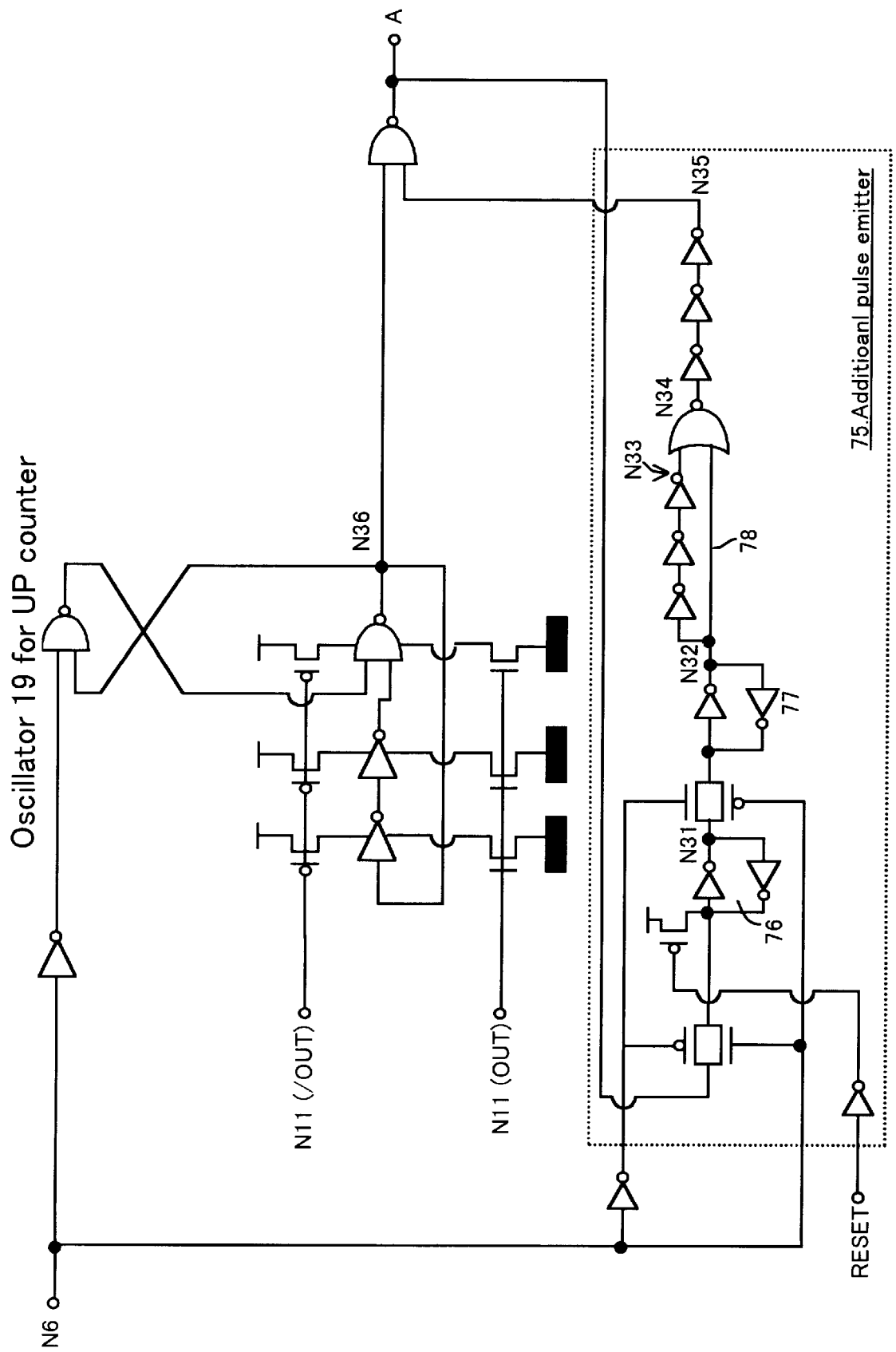
FIG. 12 shows a second example of the oscillator 19 for the up counter 20.
Figure 13:
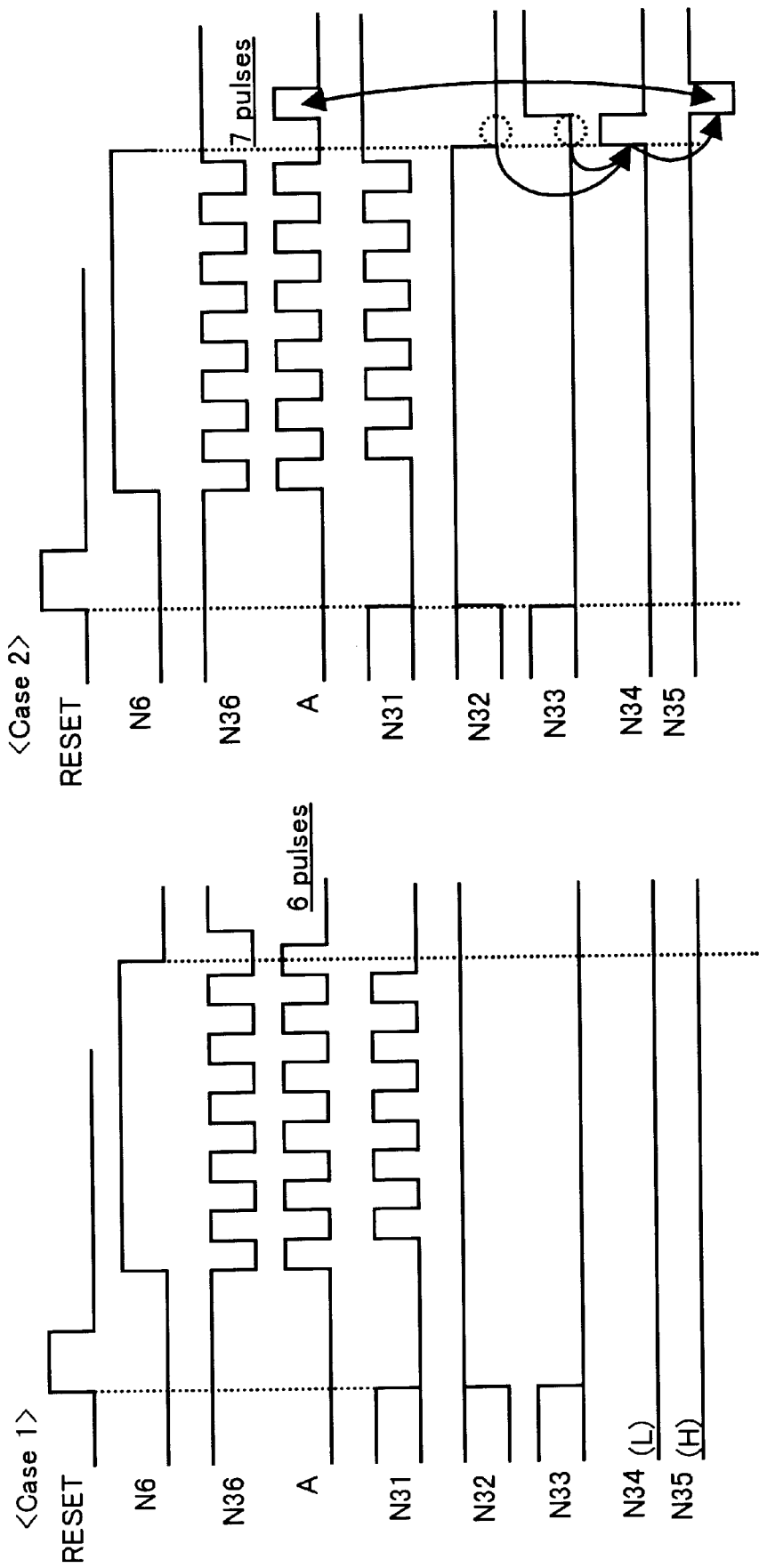
FIG. 13 is a timing chart for the oscillator 19.

FIG. 12 shows a second example of the oscillator 19 for the up counter 20. FIG. 13 is a timing chart for the operation thereof. This second example has an additional pulse emitter 75 added to the example shown in FIG. 10. Operations are the same as the oscillator in FIG. 10 when the signal level of the output terminal A is high level at the fall of the one shot clock signal N6 (Case 1 in FIG. 13). When the signal level of the output terminal A is L level at the fall of the one shot clock signal N6 (Case 2 in FIG. 13), the additional pulse emitter 75 emits one pulse signal which is added to the pulse signal N36 from the multivibrator and output from the output terminal A. In Case 1, the rising edge of the sixth pulse becomes closest to the falling edge of the clock signal N6. In Case 2, the rising edge of the seventh pulse, rather than the sixth pulse, becomes closest to the falling edge of the clock signal N6. With this example, the number of pulses having a rising edge closest to the falling edge of the clock signal N6 can be set as the initial value for the down counters 22, 26, 29. Consequently, the adjustment of the oscillator frequency with the oscillator control portion 23 varies relatively little from the initial value state; frequency adjustment can therefore be carried out more easily.

The level of the output terminal A is held in the latch circuit 76 at the time of the fall of the clock signal N6; in Case 2, the node N31 becomes high level as shown in FIG. 13. In response to the clock signal N6 being low, the latch circuit 77 takes up that state and the node N32 becomes L level. Then, a pulse, with a width of three inverters, is emitted by the pulse emitting circuit 78 to node N34 and applied as the final oscillation pulse to the output terminal A. The rising edge of this seventh pulse signal A is closer to the falling edge of the clock N6 than the rising edge of the sixth. The adjusted width of the oscillator frequency can be decreased by that amount.

Example and Operation of Oscillator Control Portion

Figure 14:
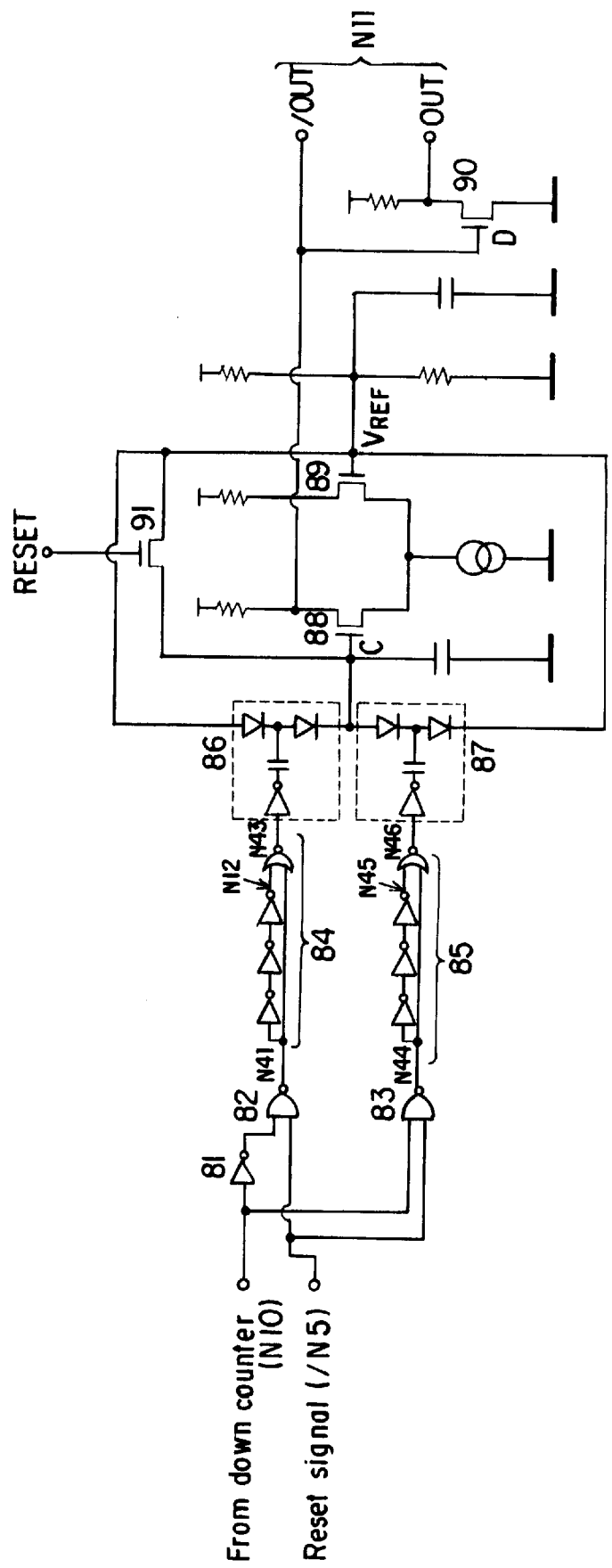
FIG. 14 shows an example of an oscillator control portion 23.
Figure 15:
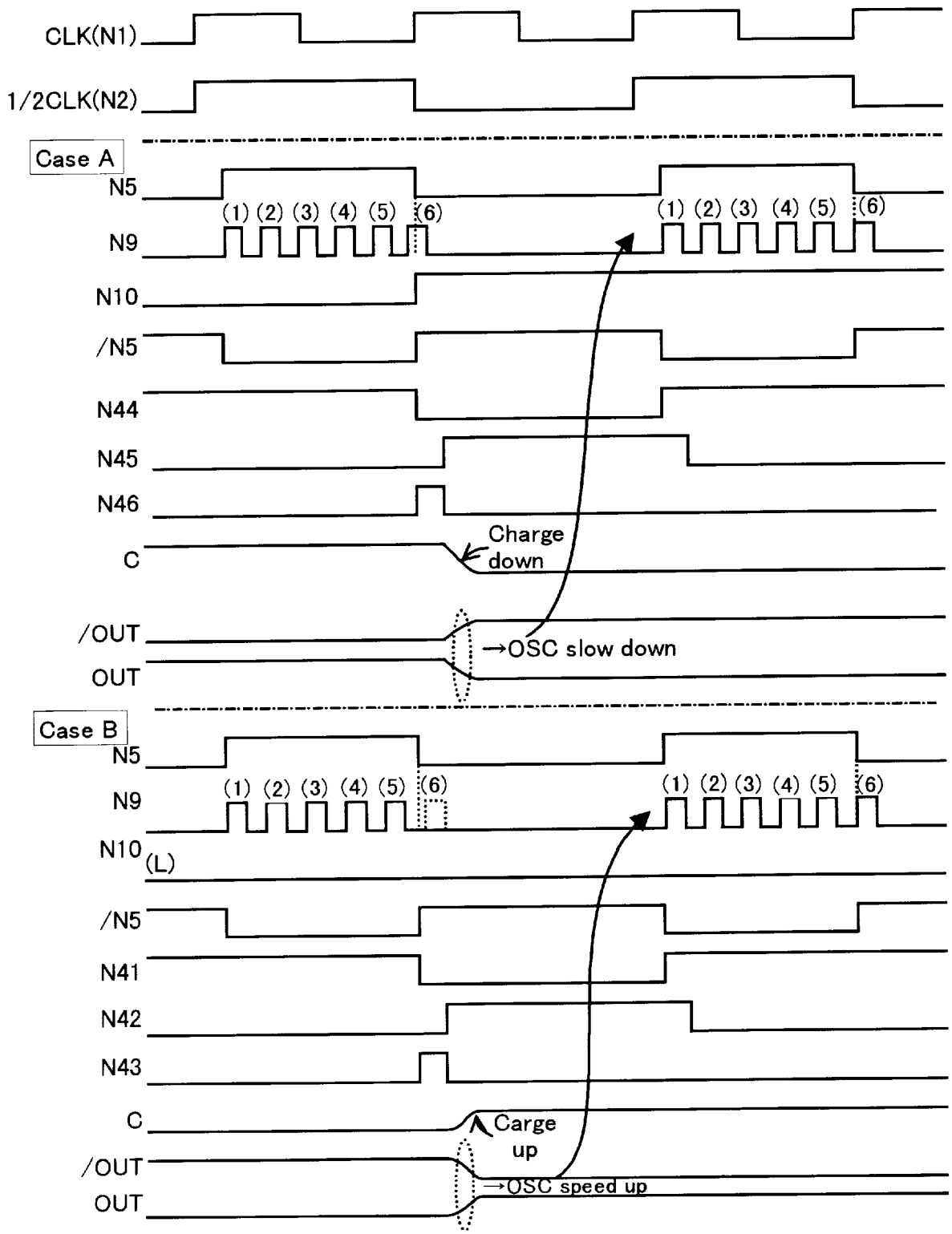
FIG. 15 is a timing chart for the oscillator control portion 23.

FIG. 14 shows an example of the oscillator control portion 23. FIG. 15 is a timing chart for the operation thereof. The oscillator control portion 23 is a circuit which generates the oscillator control signal N11 (/OUT and OUT) on the basis of the level of the signal N10 supplied from the down counter 22. In this example, the initial value of the down counter 22 is set to 6 as discussed above.

Depending on the level of the signal N10 at the timing of the rising edge of the reset signal /N5, the oscillator control portion 23 drives the charge up pump circuit 86 or the charge down pump circuit 87 for Node C and raises or lowers the potential of Node C. Accordingly, the levels of the output /OUT of the differential circuit, comprising transistors 88, 89, and of its inverse output OUT are raised or lowered with an analog system. The outputs /OUT, OUT are supplied as the frequency control signal N11 to the oscillators 19, 21, 25, 28 discussed above and used in frequency control. Next, the actual operations are explained.

Case A

In Case A, the down counter 22 finishes counting down from 6 at the time of the rising edge of the reset signal /N5. When six rising edges of the pulse signal N9 from the oscillator 21 are counted before the pulse signal N5 falls, the counter value of the down counter 22 is counted down to zero. Accordingly, an high level signal N10 is output from the down counter 22 to the oscillator control portion 23. At the falling edge of the pulse signal N5, the reset signal /N5 for the down counter 22 also becomes high level and is supplied to the oscillator control portion 23 as well. The output signal N10 from the down counter 22 is supplied to the NAND circuit 82 via the inverter 81 and to the NAND circuit 83 directly. The reset signal /N5 for the down counter 22 is supplied to the NAND circuits 82, 83 directly.

In this Case A, the output N41 of the NAND circuit 82 remains high level. For this reason, the output N43 of the pulse emitting circuit 84 also remains L level and a pulse signal is not emitted. Consequently, the charge up pump circuit 86 does not operate.

Meanwhile, the output N44 of the NAND circuit 83 becomes L level at the falling edge of the pulse signal N5. Accordingly, the pulse signal N46 is emitted from the pulse emitting circuit 85 and supplied to the charge down pump circuit 87. Because the voltage level on the inverter output side of the charge down pump circuit 87 decreases, charge is supplied to the charge down pump circuit 87 via the charge up pump circuit 86 and point C. Because the NMOS transistor 91 which is upstream of point C becomes OFF, the voltage level of point C also decreases and accordingly the drain current of the NMOS transistor 88 decreases as well. The signal level of the oscillator control signal N11 (/OUT) thereby increases, as does the gate voltage of the NMOS transistor 90. The increase of gate voltage of the NMOS transistor 90 results in an increase to the drain current thereof. As a result, the signal level of the oscillator control signal N11 (OUT) decreases. The signal /OUT with increased level and the signal OUT with decreased level are supplied to the oscillators 19, 21, 25, 28 as discussed above; the oscillators are slowed down; and the frequency of the oscillator pulse signal is decreased.

Case B

When six rising edges of the pulse signal N9 from the oscillator 21 are not counted before the pulse signal N5 falls, the counter value of the down counter 22 is not counted down to zero. The output signal N10 from the down counter 22 to the oscillator control portion 23 therefore remains L level. At the falling edge of the pulse signal N5, the reset signal /N5 for the down counter 22 becomes high level and is supplied to the oscillator control portion 23 as well.

In Case B, the output N44 of the NAND circuit 83 remains high level. The pulse signal N46 is therefore not emitted while the output of the pulse emitting circuit 85 also remains L level. Meanwhile, the output N41 of the NAND circuit 82 becomes L level at the falling edge of the pulse signal N5. Accordingly, one pulse signal N43 is emitted by the pulse emitting circuit 84 and is supplied to the charge up pump circuit 86. Because the voltage level on the inverter output side of the charge up pump circuit 86 decreases, charge flows into the charge up pump circuit 86 and the voltage level at point C therefore increases. As a result, the drain current of the NMOS transistor 88 increases, so that the signal level of the oscillator control signal N11 (/OUT) and gate voltage of the NMOS transistor 90 decrease. The signal level of the oscillator control signal N11 (OUT) increases because the decrease in gate voltage of the NMOS transistor 90 results in a decrease in the drain current thereof.

The signal OUT with increased level and the signal /OUT with decreased level are supplied to the oscillators 19, 21, 25, 28 as discussed above; the speed of the oscillators is increased; and the frequencies of the pulse signals of the oscillators are increased.

Also, the NMOS transistor 91 becomes ON when the reset signal RESET is emitted. The voltage level at point C is thereby reset to the reference voltage VREF and the levels of the oscillator control signals N11 (/OUT, OUT) are set to the initial values.

Second Embodiment

Figure 16:
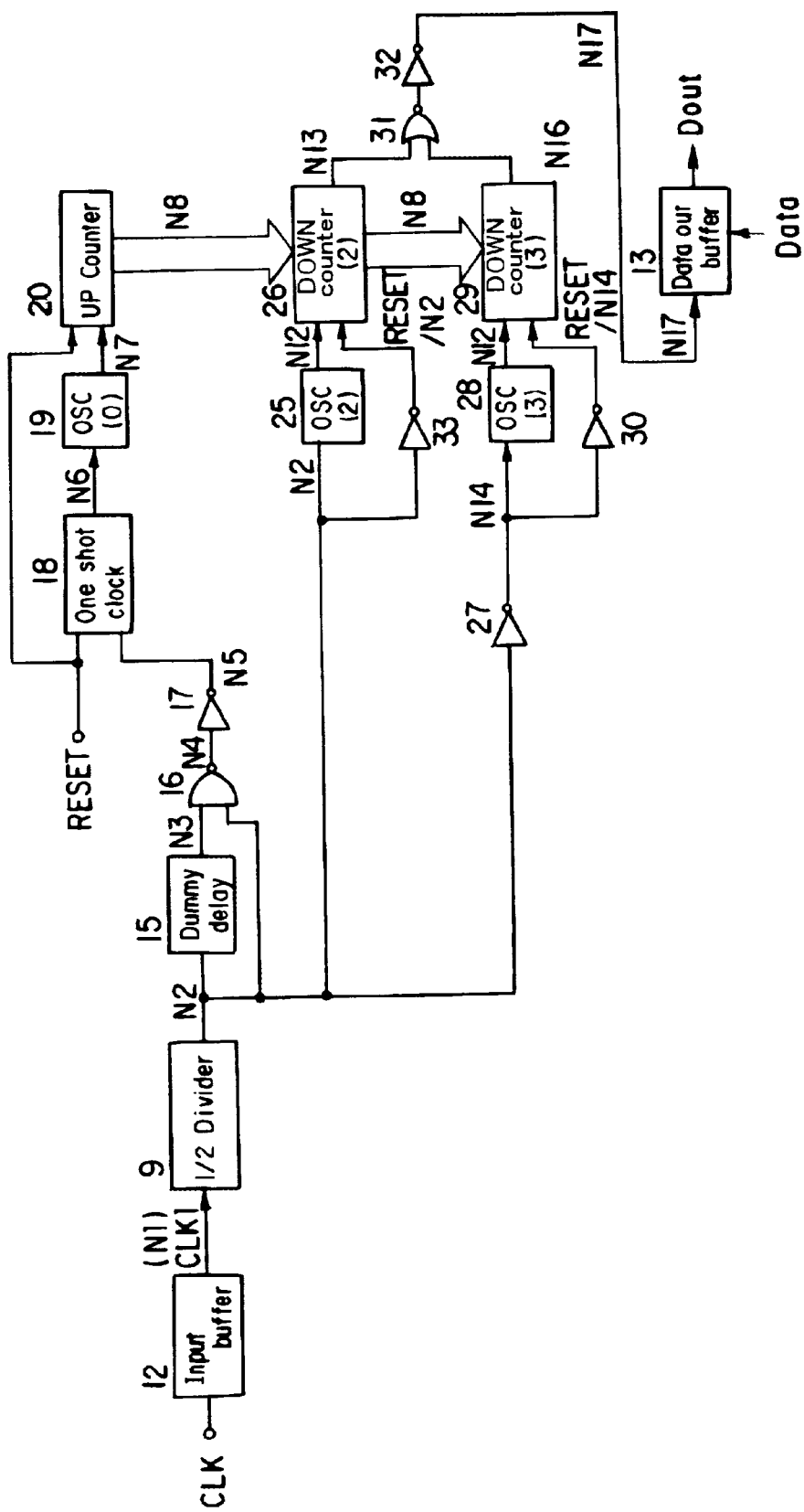
FIG. 16 shows the self-timing control circuit for a second embodiment.

FIG. 16 shows the constitution of the self-timing control circuit relating to the second embodiment. This embodiment corresponds to the outline of the invention shown in FIG. 2. In FIG. 16, the same references are used for portions corresponding to the first embodiment in FIG. 4. As clear from FIG. 16, the clock cycle count value N8 is measured by counting cycles, shorter than the master clock CLK cycle by the delay time of the dummy delay circuit 15, with the oscillation pulses N7 of the oscillator 19. That count value N8 is set in the down counters 26, 29 in the control clock generating portion. Afterwards, each oscillator 25, 28 starts oscillating and each down counter 26, 29 finishes the counting so as to output the control clock N13, N16 at a timing synchronized with the supplied master clock CLK. When the cycle of the supplied master clock CLK does not vary greatly after resetting, as in FIG. 16, the delay time adjusting portion 14 in FIG. 4 is not required. Also, variation in the cycle of the clock CLK can be followed by frequently generating the reset signal RESET internally and frequently resetting the count value N8.

Third Embodiment

The third embodiment is a self-timing control circuit for generating a control clock even at the falling edge (180 degrees), as well as the rising edge (0 degrees) of the external clock CLK. By using this control clock, the data output buffer 13 can output data in synchronized with the phase 0 degrees and 180 degrees of the external clock CLK, corresponding to a so-called DDR (Double Data Rate). If this control clock is used, command signals or the like from external can be latched in synchronized with the rising edge and falling edge of the external clock CLK; this could be applied to a future synchronous DRAM.

Constitution and Operation of the Entire Self-Timing Control Circuit

Figure 17:
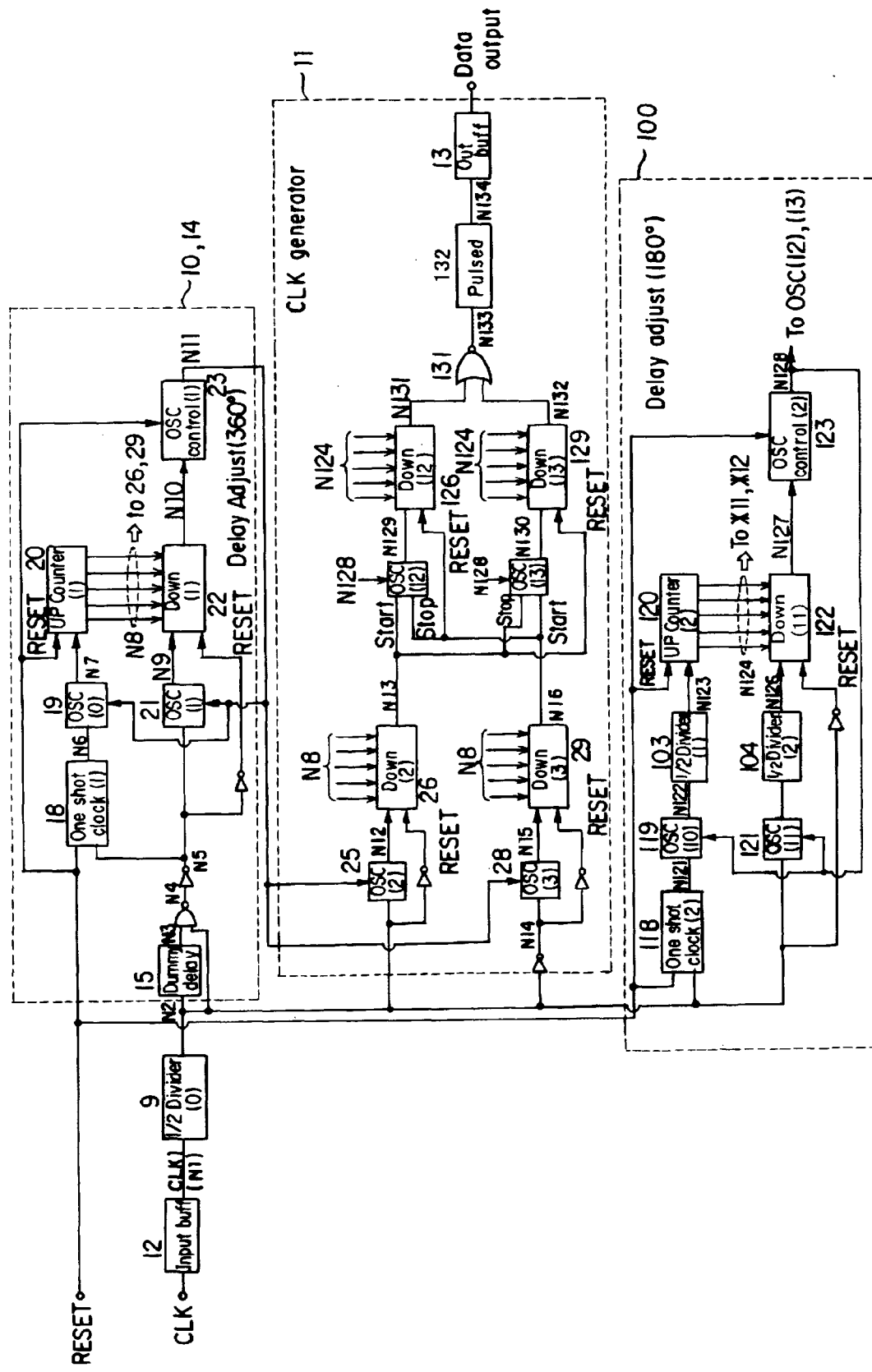
FIG. 17 shows an overview of the self-timing control circuit of a third embodiment.

FIG. 17 shows the entire constitution of the self-timing control circuit relating to the third embodiment. FIG. 17 includes a 180 degree delay time adjusting circuit 100, in addition to the clock cycle counting circuit 10, delay time adjusting circuit 14, and control clock generating portion 11. The clock cycle counting circuit 10 and delay time adjusting circuit 14 are the same as in the first embodiment shown in FIG. 4. Down counters 126, 129 are added to the control clock generating portion 11 so that a control clock is generated at 180 degrees.

Figure 18:
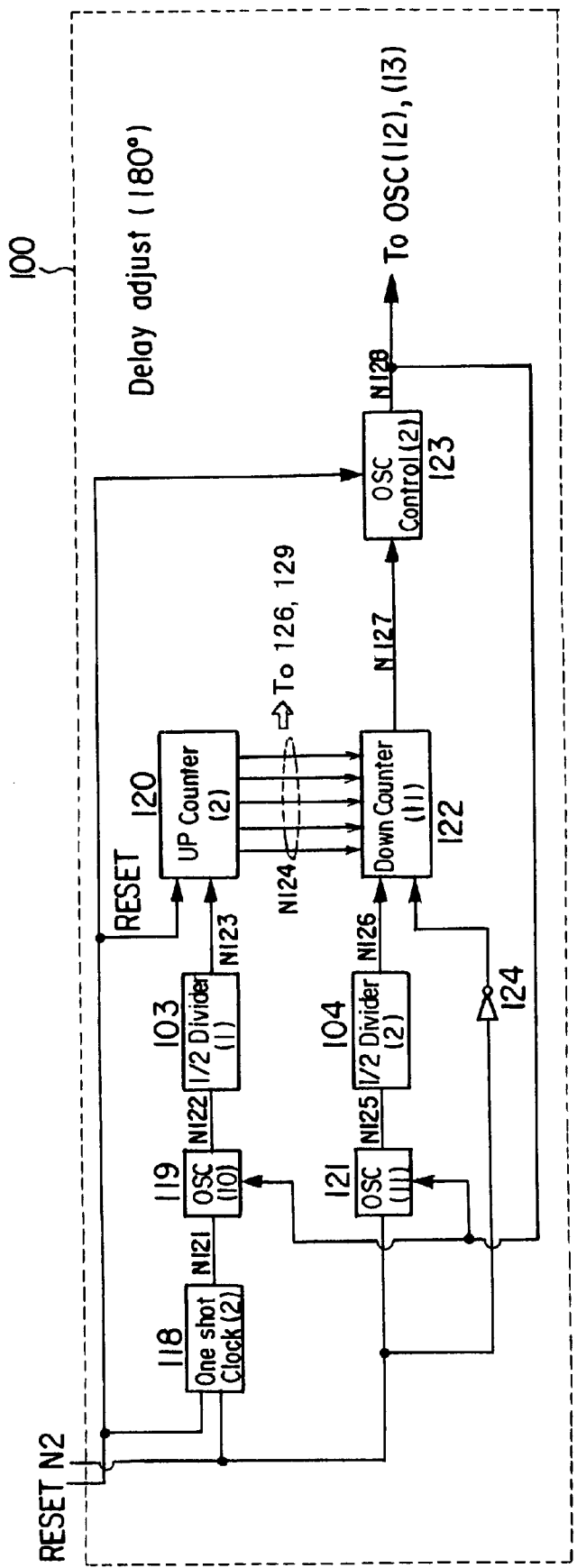
FIG. 18 is a detail of the delay time adjusting circuit 100 for 180 degrees in FIG. 17.
Figure 19:
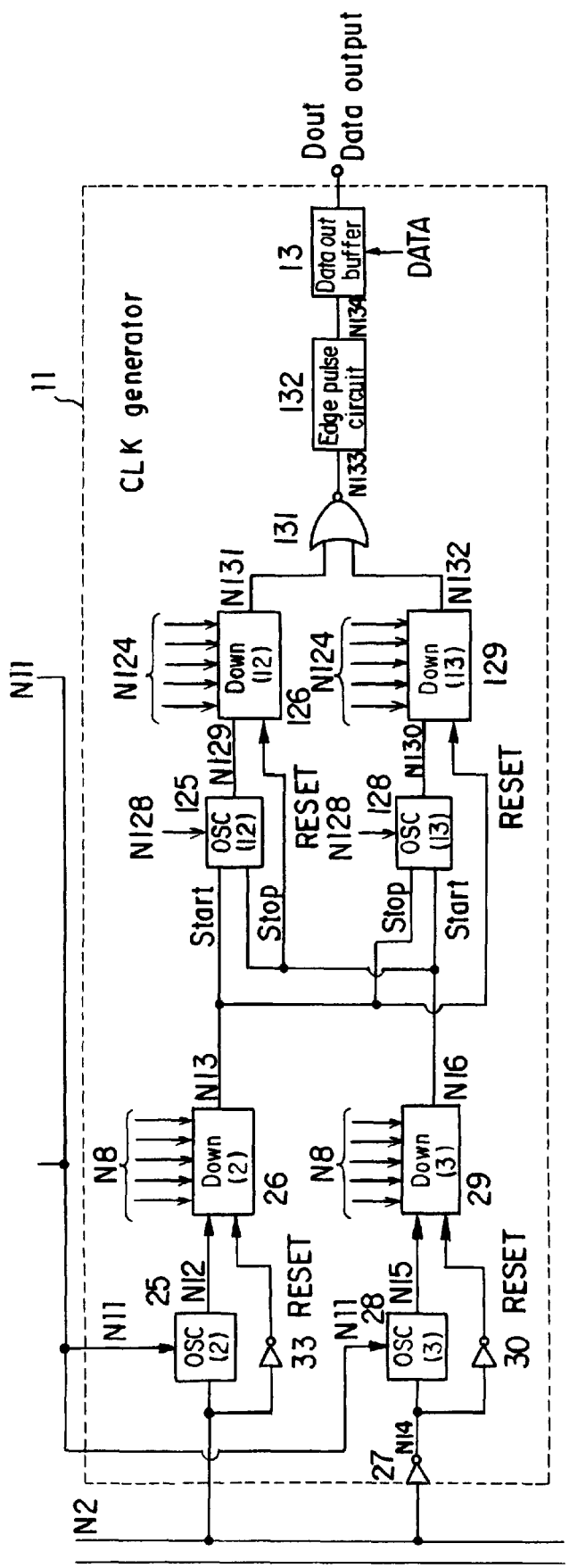
FIG. 19 is a detail of the control clock generating portion 11 in FIG. 17.
Figure 20:
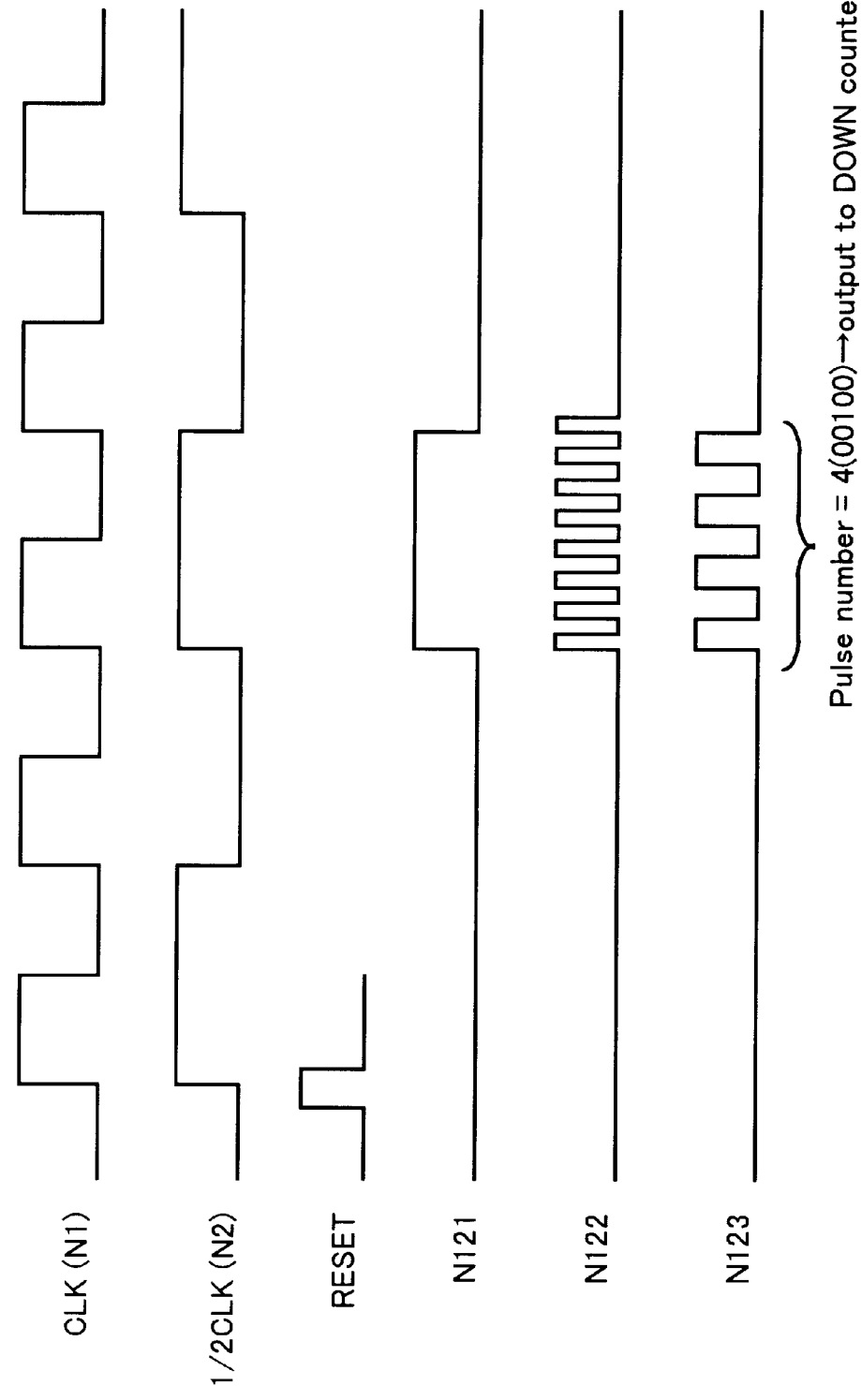
FIG. 20 is a timing chart for a third embodiment.
Figure 21:
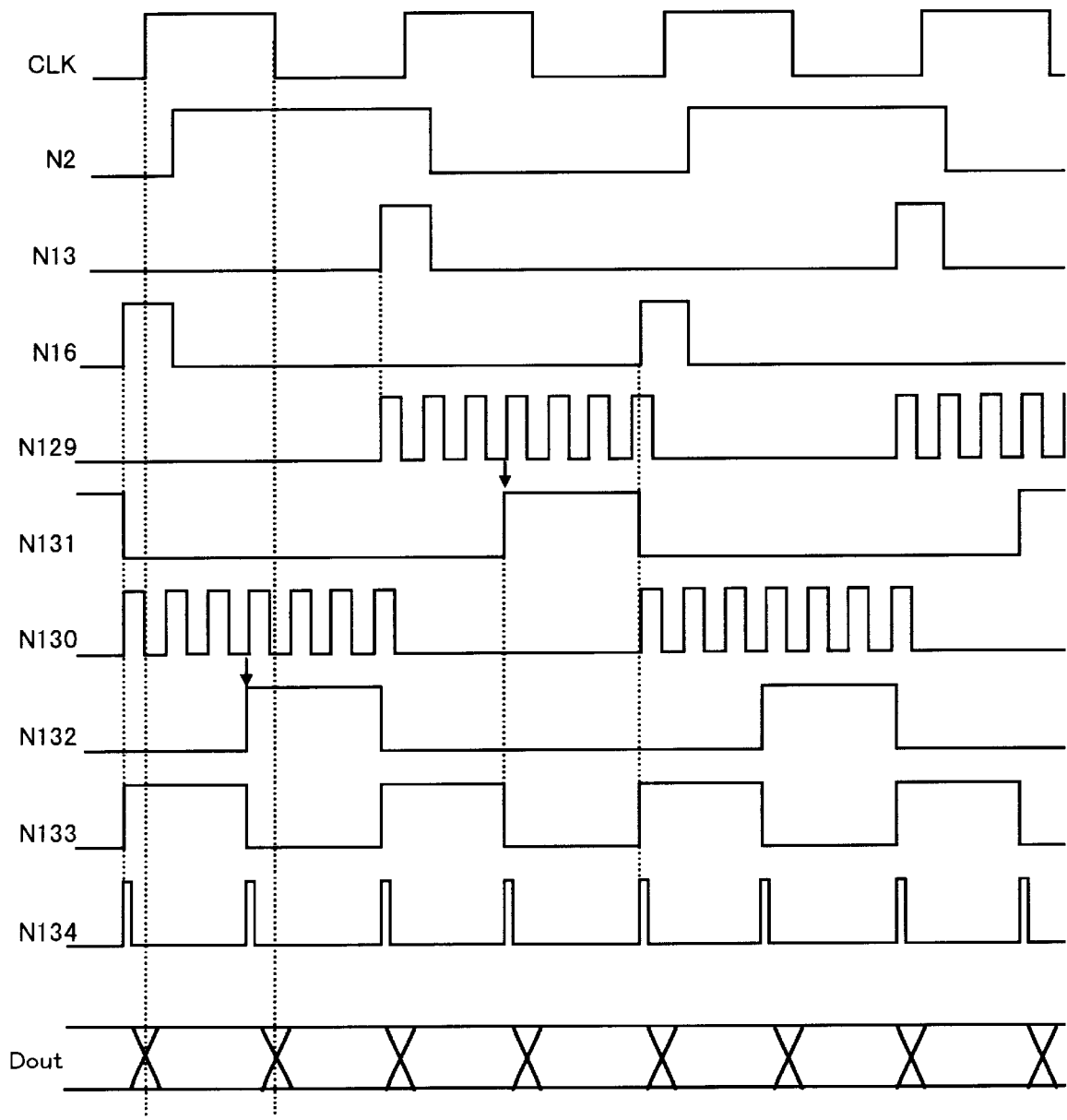
FIG. 21 is a timing chart for a third embodiment.

FIG. 18 is a detail of the 180 degree delay time adjusting circuit 100 in FIG. 17. FIG. 19 is a detail of the control clock generating portion 11 in FIG. 17. FIGS. 20 and 21 are timing charts for the operations thereof.

Generally speaking, the overall operations are as follows. The clock cycle counting circuit 10 measures the count value for the period corresponding to a cycle of the master clock CLK and sets the clock cycle count value N8. The 360 degree delay time adjusting circuit 14 generates an oscillator control signal N11, so that the count value for the period corresponding to a cycle of the clock CLK is matched to the set clock cycle count value N8. The frequencies of the first stage oscillators 25, 28 within the clock cycle counting circuit 11 are controlled by this oscillator control signal N11. Furthermore, the 180 degree delay time adjusting circuit 100 counts the oscillation pulses during the clock CLK cycle and generates the clock half cycle count value N124. The half cycle count value N124 can be generated by the up counter 120 counting the pulses which are half the oscillation pulses of the oscillator 119. This half cycle count value N124 is set in the later stage down counters 126, 129 within the clock cycle counting circuit 11. From the timing of the rise of the clocks N13 and N16 generated every 360 degrees, the down counters 126, 129 generate the control clocks N131, N132, as timed by the counting of each half cycle count value. A control clock N134, synchronized with the 0 degree and 180 degree phases of the master clock CLK, is generated with the synthesis of these control clocks N131, N132.

The 180 degree delay time control circuit 100 is a circuit for generating a clock every 180 degrees between the clocks N13, N16 generated every 360 degrees of the master clock CLK. The delay time is therefore adjusted with the standard being the clock N2 having the same pulse width as a cycle of the master clock CLK. The 180 degree oscillator adjusting signal N128 is supplied to the oscillators 119, 121, and 125, 128.

The operations of the third embodiment in FIG. 17 are as follows. A clock N5, with pulse width comprising the external clock signal CLK cycle less the delay time of the input buffer 12, ½ frequency divider 14, and data output buffer 13, is generated and the number of oscillation pulses during the pulse width of the clock N5 is counted; the clock cycle count value N8 is generated by the clock cycle counting circuit 10. This operation is the same as in the first embodiment. Also, the operations of the 360 degree delay time adjusting circuit 14 are the same as in the first embodiment.

Down Counter Initialization

The initialization of the down counters 22, 26, 29 is the same as in the first embodiment. Meanwhile, the initialization of the down counters 122, 126, 129, added to the third embodiment, is also essentially the same as in the first embodiment. However, as shown in FIG. 17, the difference lies in the installation of the ½ frequency dividers 103, 104 upstream of the up counter 120 and down counter 122, and in the clock signal N2 input to the one-shot emitter 118 being a clock N2 which does not pass through dummy delay, like 15.

After the reset signal RESET is supplied, the one-shot clock emitter 118 supplies the clock signal N2 to the oscillator 119 for one pulse (N121). The oscillator 119 starts emitting the pulse signal N122 in synchronized with the rising edge of the pulse signal N121. Then, the oscillator 119 emits the pulse signal N122 while the pulse signal N121 is high level and supplies this to the ½ frequency divider 103. The divider 103 divides the emitted pulse signal N122 and supplies the divided pulse N123 to the up counter 120. The one-shot CLK emitters 18, 118 are the same as those in the first embodiment shown in FIG. 8.

As shown in FIG. 20, the up counter 120 counts up the rising edges of the pulse signal N123 from the oscillator 119 via the divider 103 and supplies the number of pulses calculated as a result thereof, as the initial down counter values N124 to the down counters 122, 126, 129. Since four pulses are counted in the example shown in FIG. 20, binary data N124, being 00100 is set in the down counters 122, 126, 129. This set value N124 corresponds to the amount of delay for one half cycle (180 degrees) of the external clock CLK.

Oscillator Frequency Control

The examples and operations of the oscillator control portions 23, 123 are the same as those in the first embodiment shown in FIGS. 14 and 15. The oscillator control portion 23 supplies the oscillator control signal N11 to the oscillators 19, 21, 25, 28 and causes the falling edge of the pulse signal N5 to match with the rising edge of the final pulse signal N9 emitted by the oscillator 21. Likewise, the Oscillator control portion 123 supplies the oscillator control signal N128 to the oscillators 119, 121, 125, 128 and causes the falling edge of the pulse signal N2 to match the rising edge of the final pulse signal N125 emitted by the oscillator 121.

Data Output Timing Control

The timing chart in FIG. 21 shows the operation wherein the control clock N134 is generated every 180 degrees of the master clock CLK. As in the first embodiment, the pulse signal N13 from the down counter 26 and the pulse signal N16 from the down counter 29 are emitted with a 360 degree phase difference and with the standard being the external clock signal CLK. The pulse signal N13 is supplied as a start signal to the oscillator 125 and as a stop signal to the oscillator 128; the pulse signal N16 is supplied as a stop signal to the oscillator 125 and as a start signal to the oscillator 128.

The oscillator 125 starts outputting the pulse signal N129 in synchronized with the rising edge of the start signal N13. Until ending the output in synchronized with the rising edge of the stop signal N16, the oscillator 125 continues emitting the pulse signal N129 and supplying this to the down counter 126. The down counter 126 counts down from the initial value (N124=4) the rising edges of the pulse signal N129 from the oscillator 125. When the counter value reaches zero, the high level signal N131 is supplied to the final NOR circuit 131. The down counter 126 is reset at the timing of the rise of the stop signal N16 and the output signal N131 becomes low level; the counter value is returned to the initial value. As discussed above, the initial counter values N124 of down counters 122, 126, 129 correspond to the amount of delay of a half cycle of the external clock CLK. The rising edges of the pulse signals N13 and N16 have a phase difference of one cycle of the external clock CLK. Consequently, the clock signal N131 has a pulse width of a half cycle of the external clock CLK.

The operation of the oscillator 128 and down counter 129 is the same as that of the oscillator 125 and the down counter 126. However, the operation differs in that the start signal N16 and stop signal N13 input to the oscillator 128 are opposite to the signals supplied to the oscillator 125, and in that the signal N13 is used as a reset signal for the down counter 129. The pulse signal N131 from the down counter 126 and the pulse signal N132 from the down counter 129 are therefore emitted with a 360 degree phase difference, with the standard being a cycle of the external clock signal CLK.

The output signals N131 and N132 from the down counters 126 and 129 are supplied to the NOR circuit 131. The output N133 of the NOR circuit 131 becomes a clock signal with a 50% duty ratio and having the same cycle as the external clock CLK. The edge pulse circuit 132 generates a signal N134, which is pulsed at the rising edge and falling edge of this signal N133, and supplies this to the data output buffer 13. The data output buffer 13 takes up data DATA and outputs this externally in synchronized with the supplied clock signal N134. Consequently, as shown in FIG. 21, the data Dout is output at the timing of the rising and falling edges of the external clock signal CLK.

As noted above, according to the present invention, the above self-timing control circuit for analog adjustment of the internal clock delay time can be applied even to an integrated circuit device using a DDR system.

Oscillator and Operation Thereof

Figure 22:
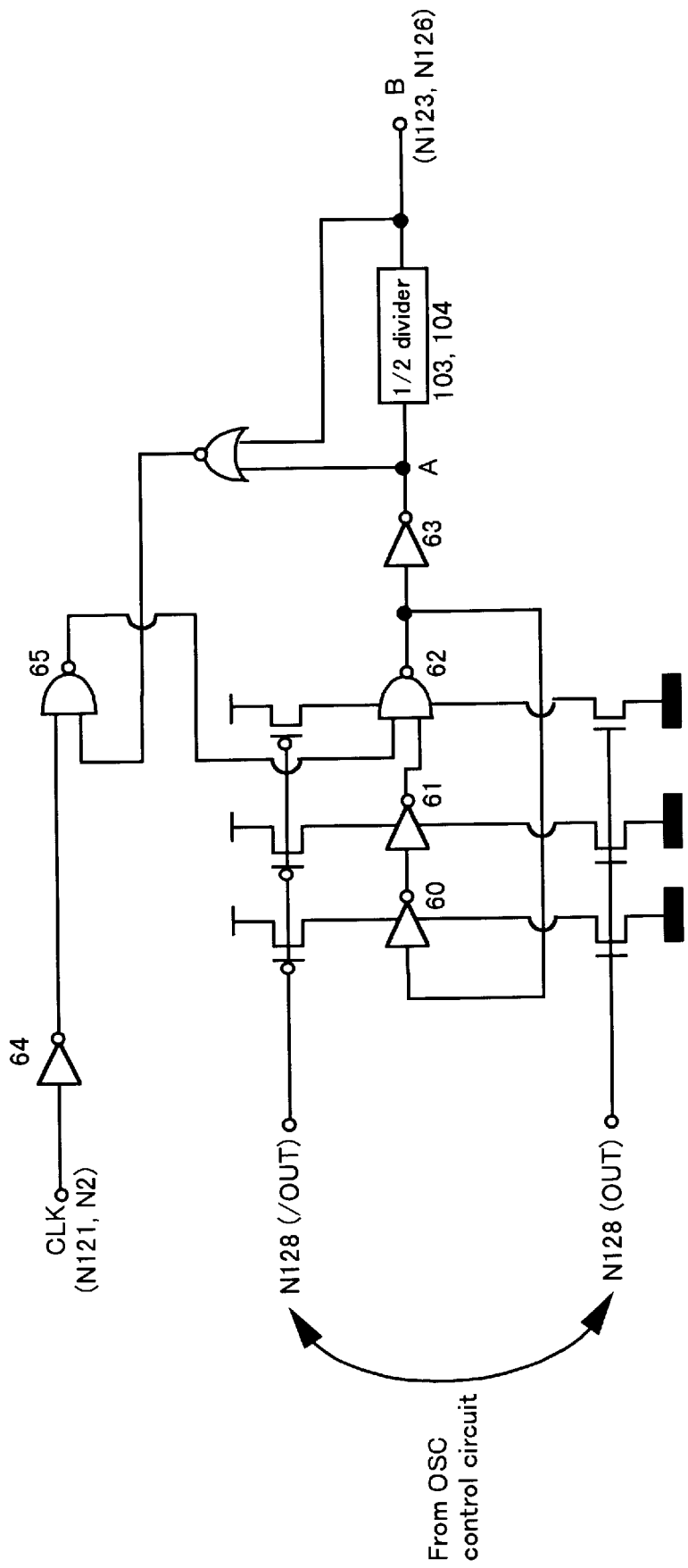
FIG. 22 shows an example of the oscillators 119, 121.
Figure 23:
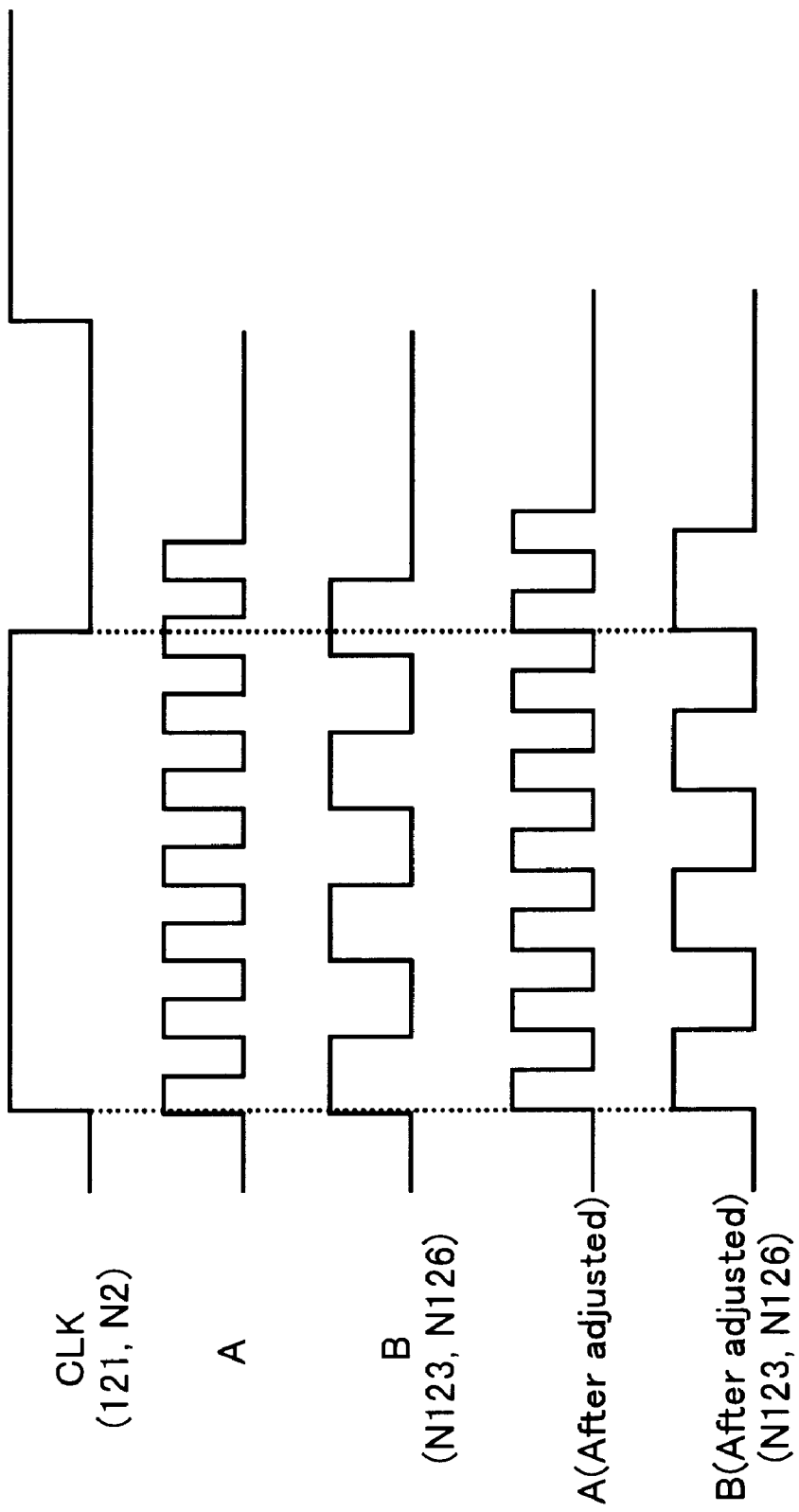
FIG. 23 is a timing chart for the oscillators 119, 121.

The structure and operations of the oscillators 19, 21, 25, and 28 are the same as in the first embodiment. FIG. 22 shows an example of the oscillators 119, 121. Also, FIG. 23 is a timing chart for the operations thereof. The basic constitution and operations are the same as for the oscillator 3, in the first embodiment shown in FIGS. 10 and 11. Unlike the example in FIG. 10, however, the ½ frequency dividers 103, 104 are provided on the output side A of the oscillator; these output pulse signals B (N123, N126) having twice the cycle of the oscillator pulse. In this example, the pulse output of the oscillator stops at the time when the clock signal CLK, output A and output B are all low level.

Figure 24:
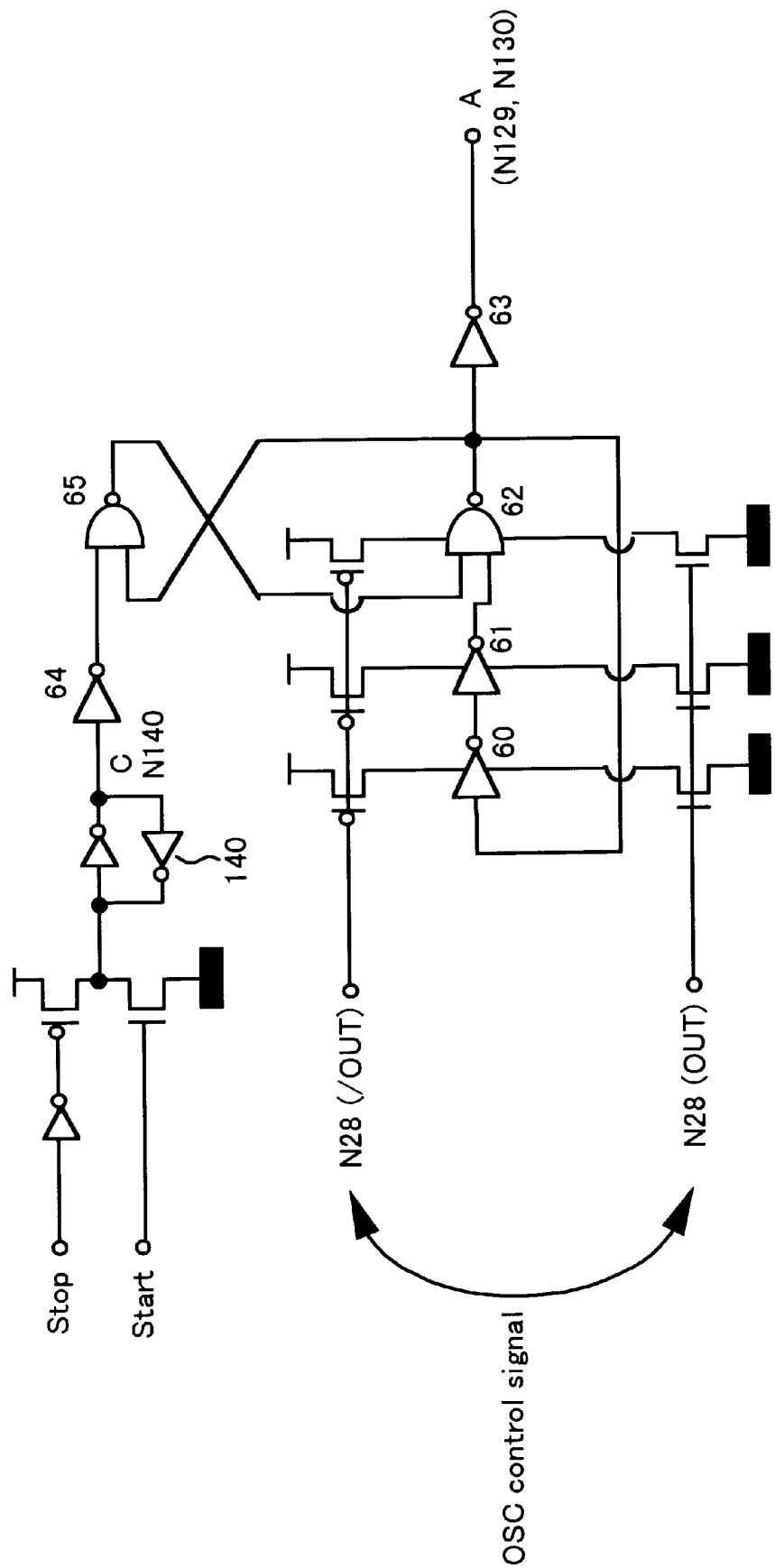
FIG. 24 shows an example of the oscillators 125, 128.
Figure 25:
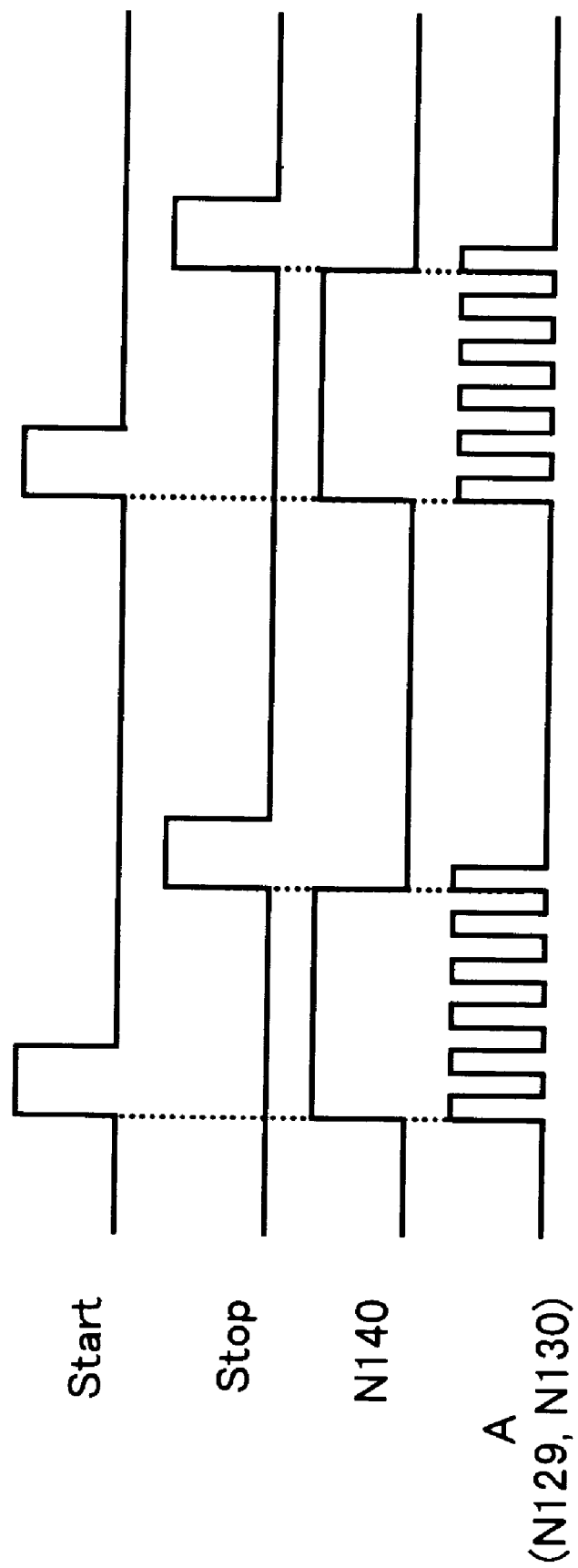
FIG. 25 is a timing chart for the oscillators 125, 128.

FIG. 24 shows an example of the oscillators 125, 128 in FIG. 19. FIG. 25 is a timing chart for the operations thereof. The basic operations are the same as above. The difference is in the use of a start signal Start and a stop signal Stop as the signals for starting and stopping oscillator output. When the start signal is high level and the stop signal is low level, the latch circuit 140 latches low level; the signal N140 becomes high level; and the set signal for the RS flip-flop circuit, comprising NAND circuit 65 and NAND circuit 62, becomes ON and the oscillator pulse signal A is emitted. When the start signal becomes low level and the stop signal becomes high level, the node N140 becomes low level, the output A becomes low level, specifically the output of the NAND circuit 65 becomes low level at the time when the output of the NAND circuit 62 becomes high level, and pulse emission from the oscillator stops.

As noted above, in the third embodiment, the control clock N134 is generated at every 180 degrees of the phase of the master clock CLK. Furthermore, expanding this constitution makes it possible to generate the control clock every 90 degrees of the phase of the master clock CLK.

Fourth Embodiment

In the first embodiment shown in FIG. 4, it is necessary to increase the count by the up counter and down counter when the cycle of the master clock CLK becomes long. Such a change to the constitution yields larger scale counter circuitry. In the fourth embodiment, therefore, the frequency of the oscillator is reduced when the cycle of the master clock CLK becomes long and increasing counter scale becomes unnecessary.

Overall Constitution and Operation of the Self-Timing Control Circuit

Figure 26:
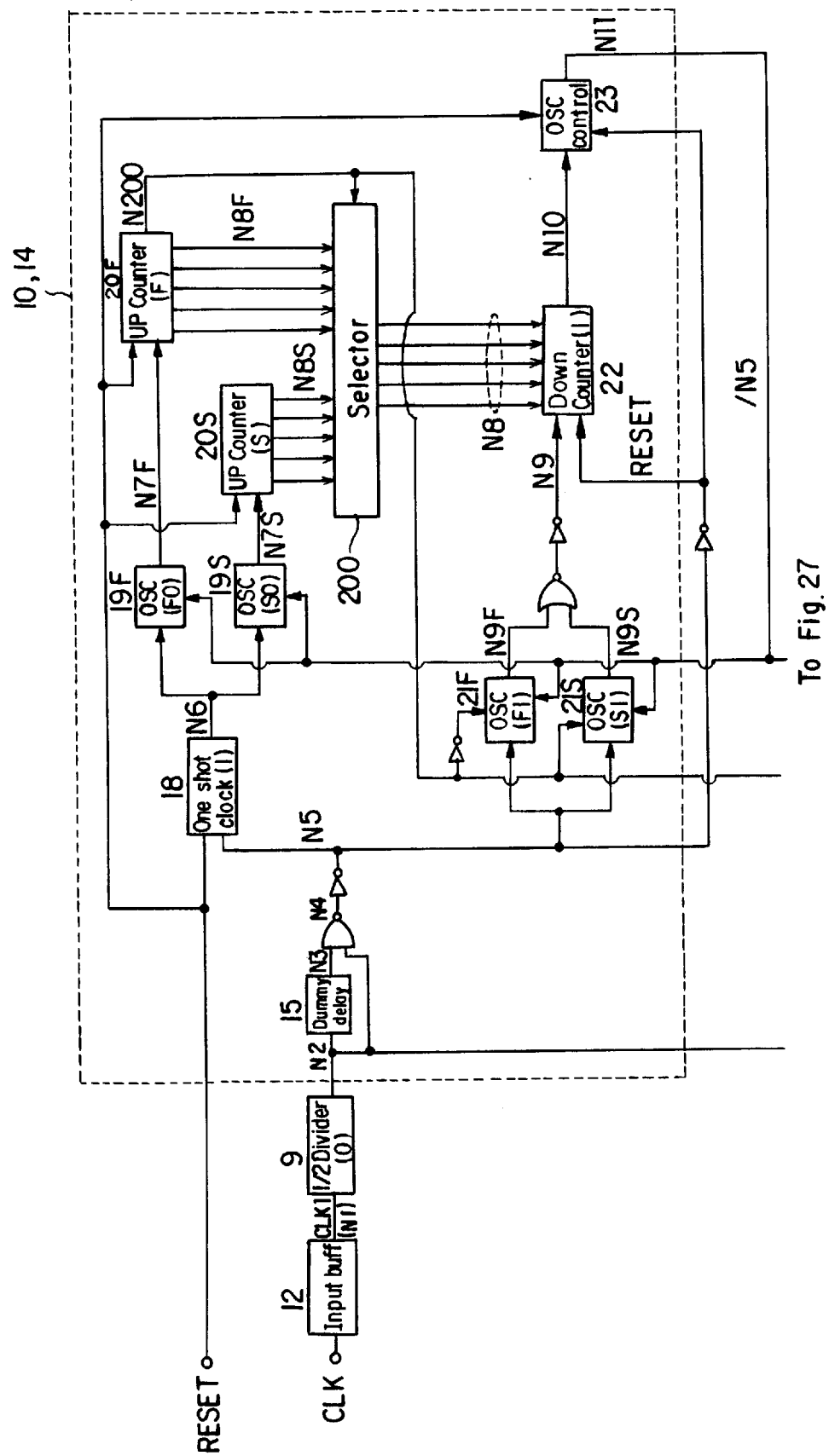
FIG. 26 shows half the self-timing control circuit for a fourth embodiment.
Figure 27:
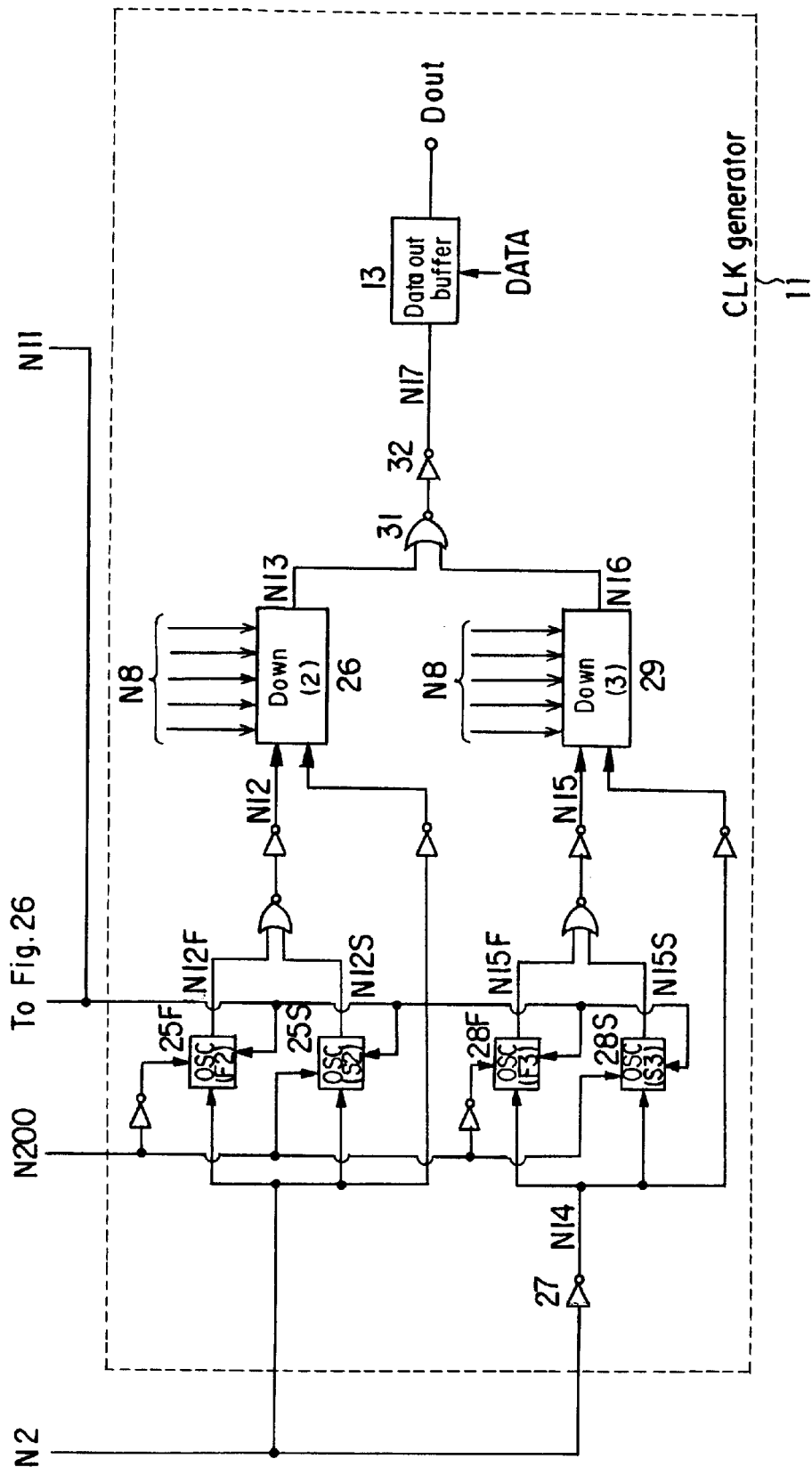
FIG. 27 shows half the self-timing control circuit for a fourth embodiment.
Figure 28:
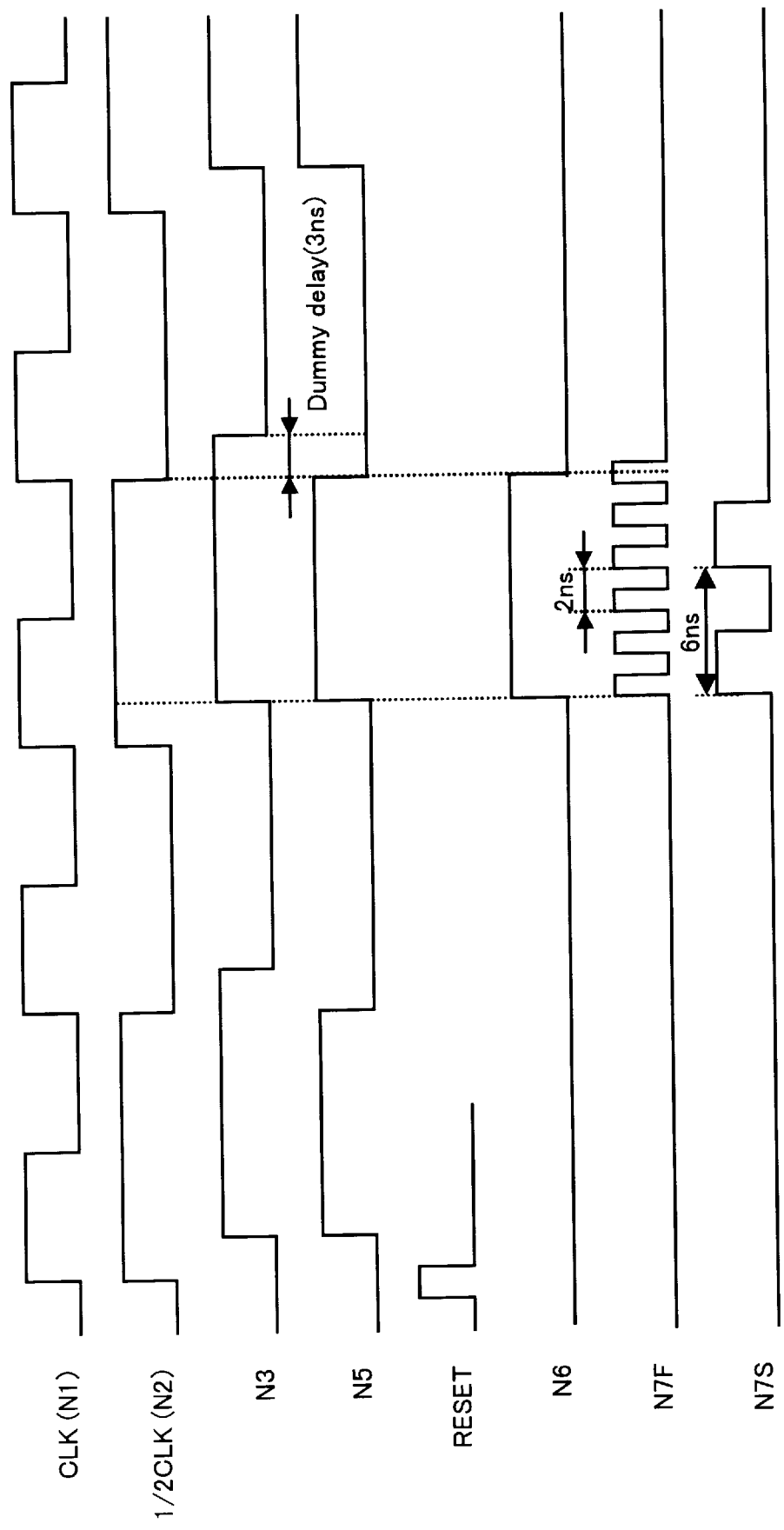
FIG. 28 is a timing chart for the self-timing control circuit of the fourth embodiment.

FIGS. 26 and 27 each show half the constitution of the self-timing control circuit relating to the fourth embodiment. FIG. 28 shows a timing chart for the operation thereof. The fourth embodiment has basically the same constitution as the first embodiment shown in FIG. 4. Unlike the first embodiment, the fourth embodiment in FIGS. 26 and 27 includes high speed oscillators 19F, 21F, 25F, 28F and low speed oscillators 19S, 21S, 25S, 28S as the oscillators. The up counter comprises a high speed up counter 20F and a low speed up counter 20S; a selector 200 is established for selecting the count values N8F, N8S of these up counters 20F, 20S. The count values N8 selected with the selector 200 are set in each down counter as initial values. Other portions are the same and the same reference numbers are used as in FIG. 4.

As shown in FIG. 28, the clock N5, which becomes high level for a period corresponding to a cycle of the master clock CLK, is generated; a pulse signal N6, for one pulse of the clock signal N5, is generated in response to the reset signal RESET. While this pulse signal N6 is high level, oscillators 19F, 19S oscillate and the oscillation pulse signals N7F, N7S thereof are counted by up counters 20F and 20S respectively. When the overflow signal N200 of the high speed up counter 20F is inactive (low level), the selector 200 selects the count value N8F on the up counter 20F side and supplies this to the down counter as the clock cycle count value N8. Also, when the cycle of the master clock CLK becomes long, the number of up counters 20F is insufficient, and overflow occurs, then the overflow signal N200 becomes active (high level) and the selector 200 selects the count value N8S for the slow up counter 20S.

For example, when the oscillation cycle of the high speed oscillator 19F is set to 2 ns, and the overflow of the up counter 20F occurs at a count value of 16, then the up counter 20F overflows when the cycle of the master clock signal CLK becomes 35 ns or greater as shown in FIG. 28. As a result, the count value N8S, counted by the up counter 20S with the pulse output of the low speed oscillator 19S set to an oscillation cycle of 6 ns, is selected as the clock cycle count value N8.

Selection of the other oscillators 21F, 21S, 25F, 25S, 28F, 28S is also carried out according to the overflow signal N200. In this way, selection of the high speed oscillators and low speed oscillators, established in advance, is carried out depending on the length of the master clock CLK cycle. When the master clock cycle becomes long, the low speed oscillators are used; when the cycle becomes short, the high speed oscillators are used. Otherwise, the operations of the delay time adjusting circuit 14 and control clock generating portion 11 are the same as in the first embodiment.

In the present embodiment, timing is controlled using the pulse signals from the high speed oscillators when the external clock signal has a high frequency, and using the pulse signals from the low speed oscillators when the frequency is low. For this reason, both high and low frequency clock signals can be handled without increasing the number of rows of up counters and down counters.

Example of Oscillator

Figure 29:
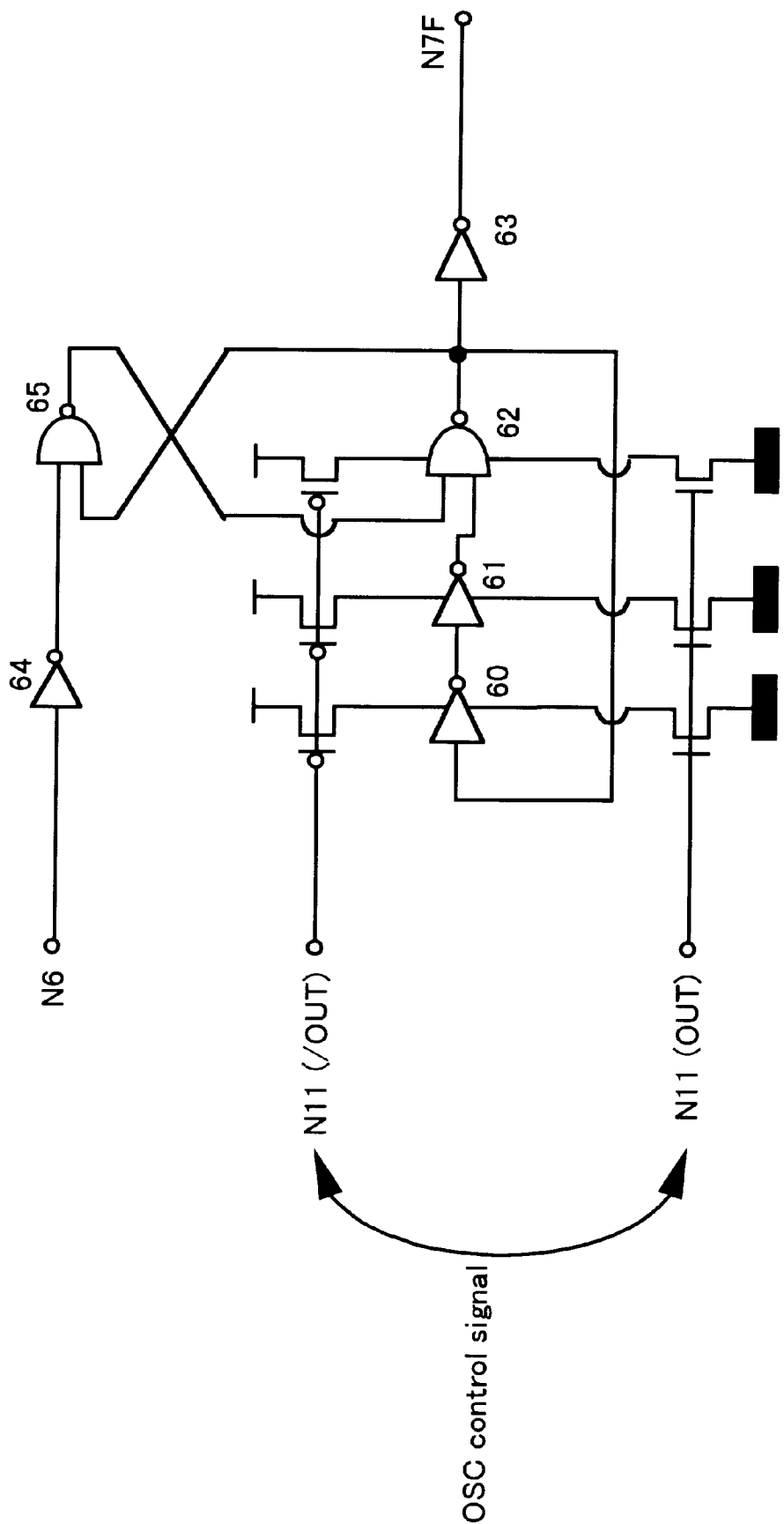
FIG. 29 shows the constitution of a high speed oscillator 19F.
Figure 30:
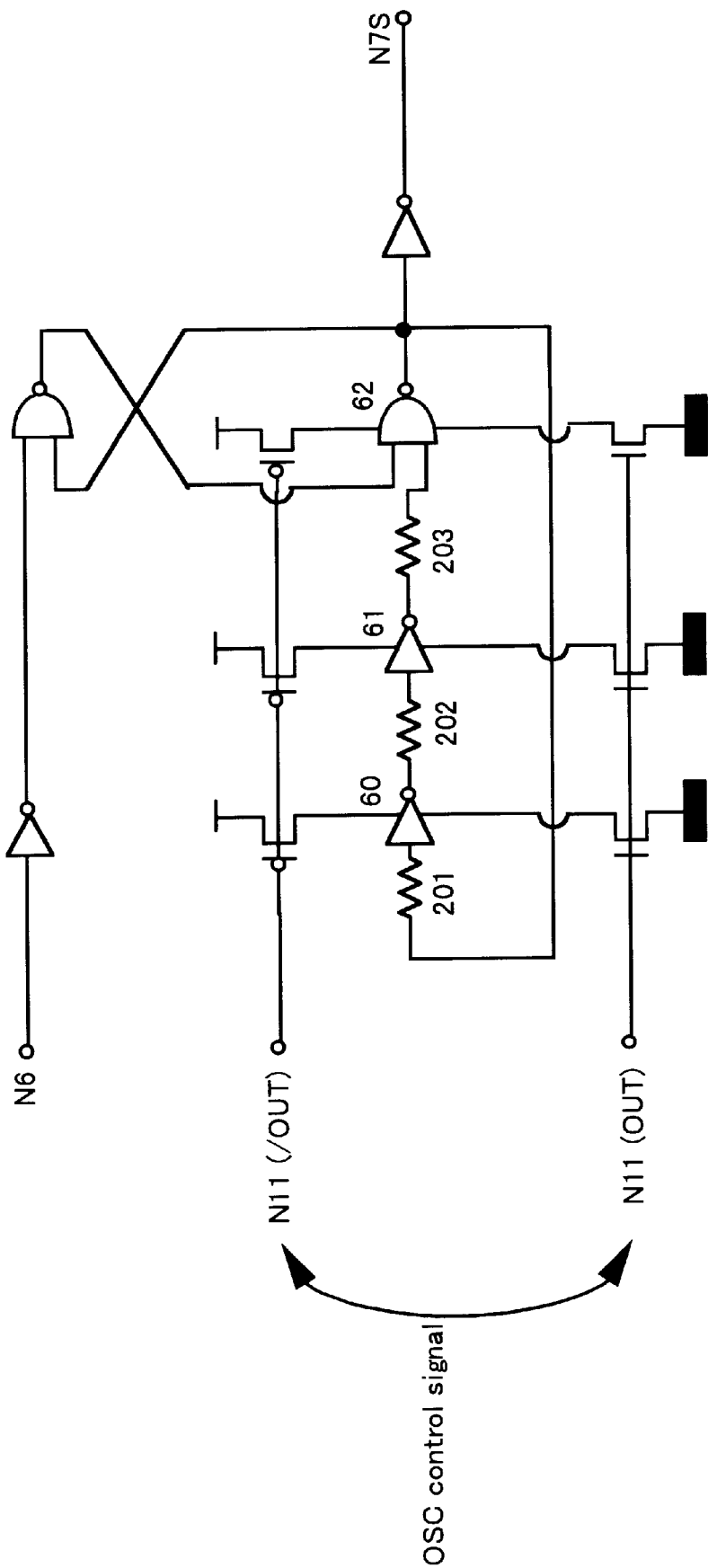
FIG. 30 shows the constitution of a low speed oscillator 19S.

FIG. 29 shows the constitution of the high speed oscillator 19F. FIG. 30 shows the constitution of the low speed oscillator 19S. The high speed oscillator 19F in FIG. 29 has the same constitution as the oscillator in FIG. 10; its operation is also the same. Meanwhile, the low speed oscillator shown in FIG. 30 has resistors 201–203, for slowing oscillation, inserted among the inverters 60, 61, and NAND gate 62. As a result, the oscillation of the multivibrator formed by the inverters 60, 61 and NAND gate 62 is slowed.

Figure 31:
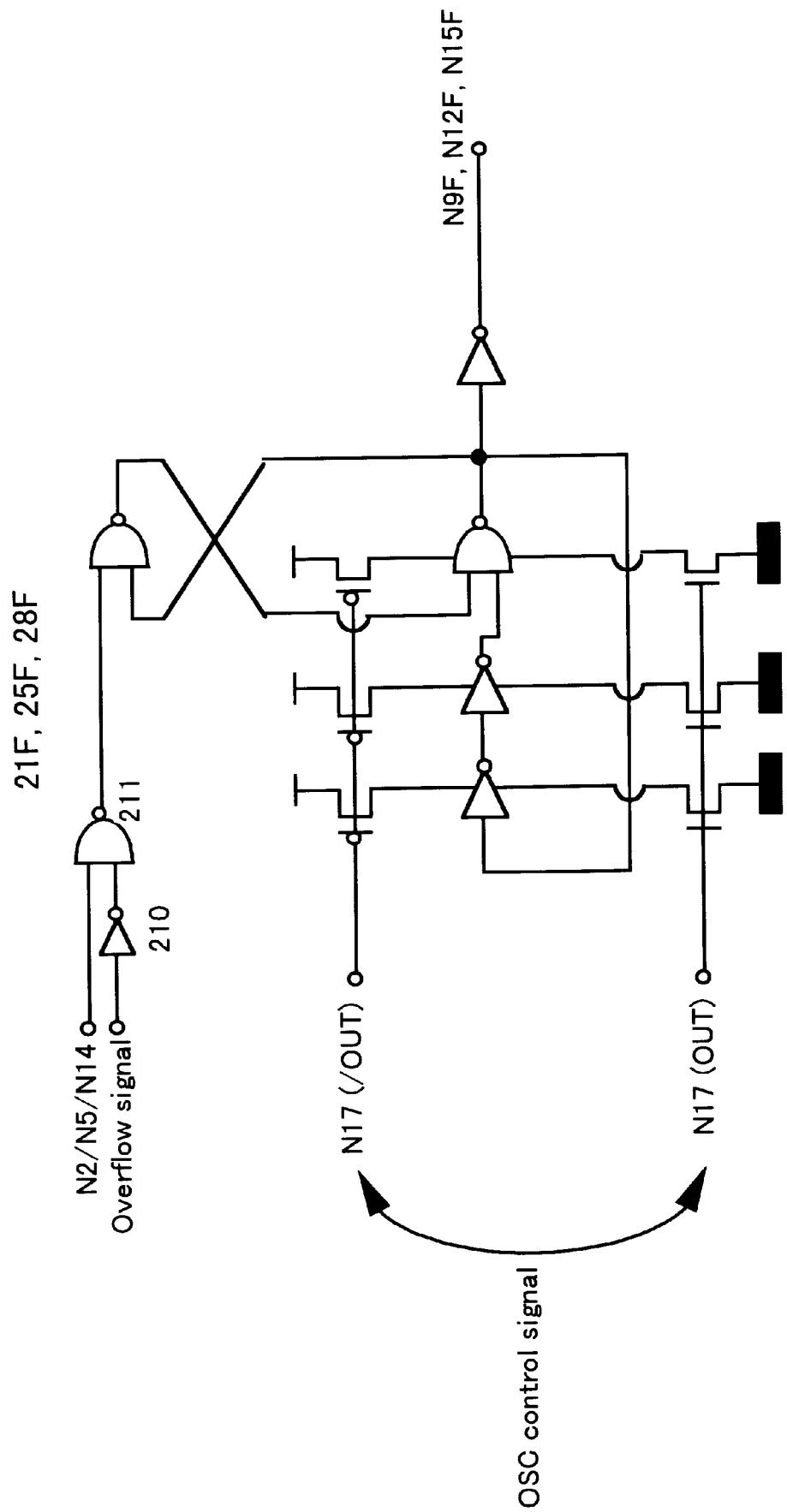
FIG. 31 shows examples of high speed oscillators 21F, 25F, and 28F.
Figure 32:
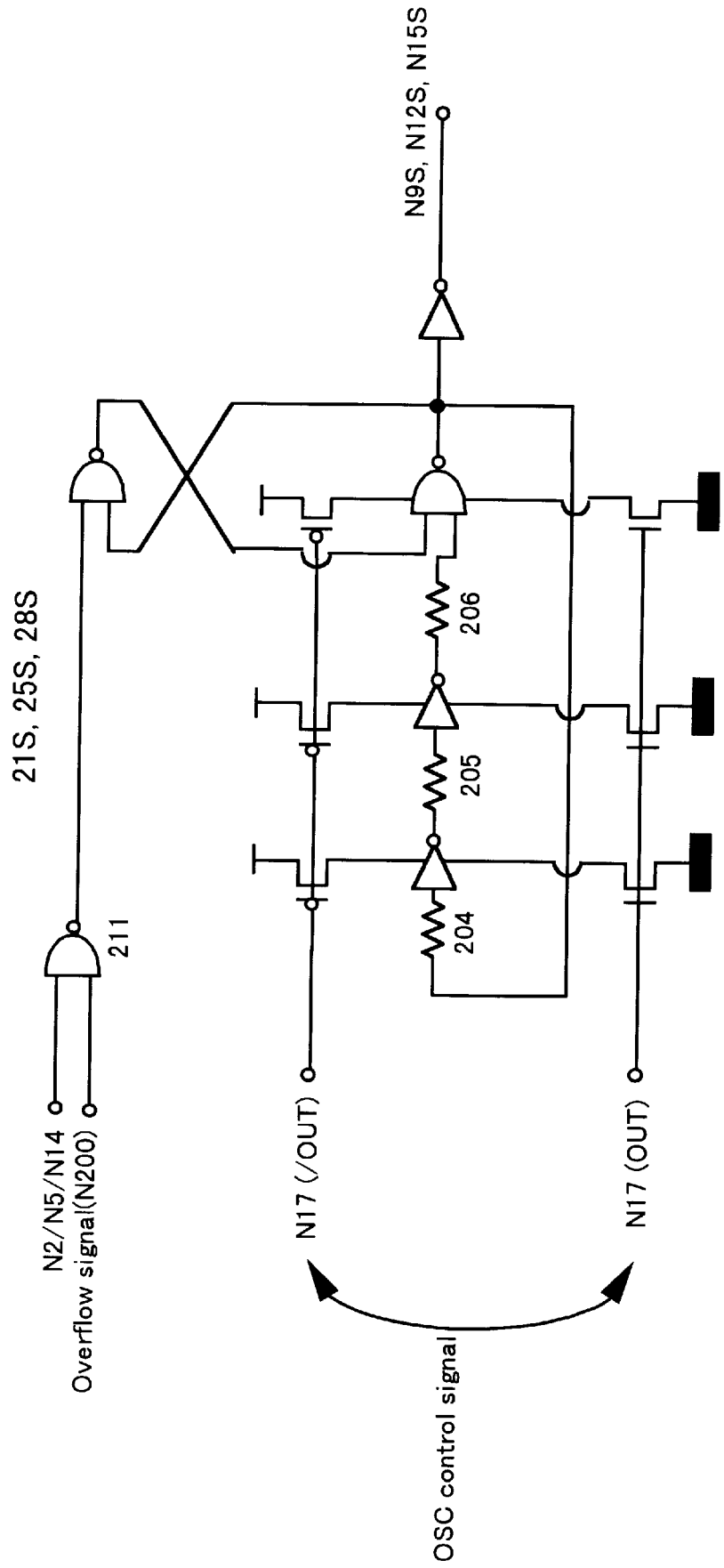
FIG. 32 shows examples of low speed oscillators 21S, 25S, 28S.

FIG. 31 shows an example of the high speed oscillators 21F, 25F, 28F. FIG. 32 shows an example of the low speed oscillators 21S, 25S, 28S. These constitutions are basically the same as those of the oscillators 19F and 19S. A difference is that the overflow signal N200 from the up counter 20F is used, in addition to clock signals N2, N5, N14, as a signal for initiating oscillation by the oscillators. When the overflow signal N200 is low level, the high speed oscillators 21F, 25F, 28F in FIG. 31 start emitting pulse signals N9F, N12F, N15F in synchronized with the rise of the clock signals N2, N5, N14. When the up counter 20F overflows and the signal N200 becomes high level, the pulse signals N9F, N12F, N15F are not emitted regardless of the levels of the clock signal N2, N5, N14.

When the up counter 20F overflows and the signal N200 becomes high level, the low speed oscillators 21S, 25S, 28S start emitting pulse signals N9S, N12S, N15S in synchronized with the rise of clock signals N2, N5, N14. When the overflow signal N200 becomes low level, pulse signals are not oscillated regardless of the levels of the clock signals N2, N5, N14.

Fifth Embodiment

Like the fourth embodiment, the fifth embodiment is a self-timing control circuit for controlling the cycle length of each oscillation pulse (low frequency) depending on the length of the master clock CLK cycle (lowness of frequency). The present embodiment uses oscillators for which oscillation frequency can be switched on the basis of the overflow signal N200 of the up counters.

Figure 33:
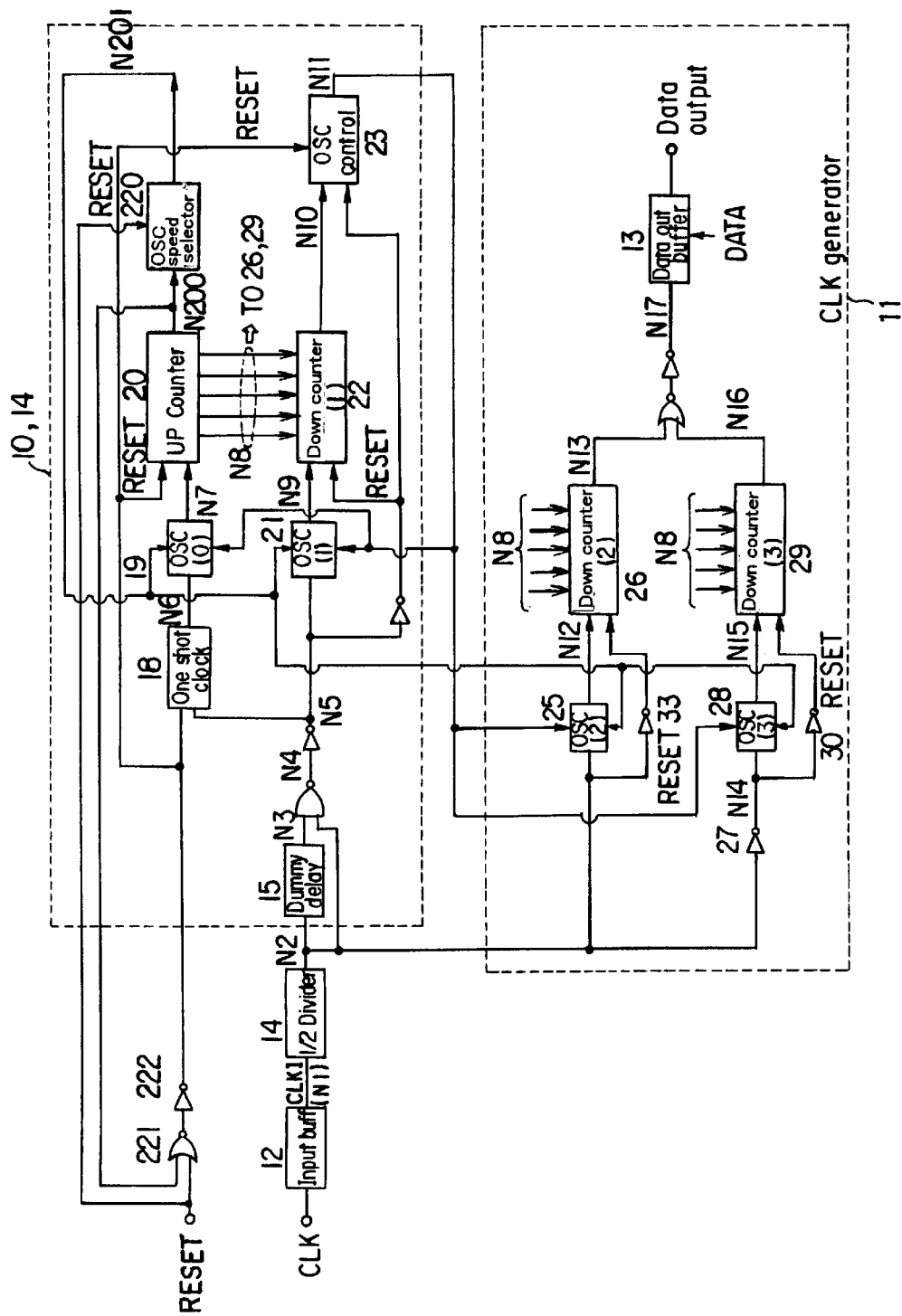
FIG. 33 shows the constitution of the self-timing control circuit of a fifth embodiment.

FIG. 33 shows the constitution of the self-timing control circuit relating to the fifth embodiment. The constitution is the same as that of the first embodiment shown in FIG. 4 and the same reference numbers are used. A difference in the fifth embodiment is that when the up counter 20 detects overflow, the oscillator speed selecting circuit 220 changes the speed selection signal N201 to a low speed level in response to the detected overflow signal N200, and each oscillator 19, 21, 25, 28 is switched to low speed operation.

When the first reset signal RESET is supplied, the speed selecting signal N201 is set for high speed operation and each oscillator oscillates in high speed operation initially. When the up counter 20 counts the oscillation pulses N7 from the oscillator 19 operating at high speed, so that the up counter overflows, and the overflow signal N200 reaches an active level, then the one-shot clock emitter 18 again generates a one shot pulse signal N6 by means of the NOR gate 221 and inverter 222. The up counter 20 again counts the low speed oscillation pulses N7 generated by the oscillator 19, which was switched to low speed operation. As a result, the clock cycle count value N8 counted thereby is set in each down counter 22, 26, 29. The subsequent operations are the same as in the first embodiment.

The overflow signal N200 is low level when the up counter does not overflow. The oscillator speed selection signal N201 output from the oscillator speed selecting circuit 220 therefore remains low level and the oscillators 19, 21, 25, 29 continue at high speeds.

When the up counter 20 does overflow, the overflow signal N200 becomes high level and the oscillator speed selection signal N201, output from the oscillator speed selecting circuit 220, becomes high level; the oscillators 19, 21, 25, 28 switch to low speeds.

Figure 34:
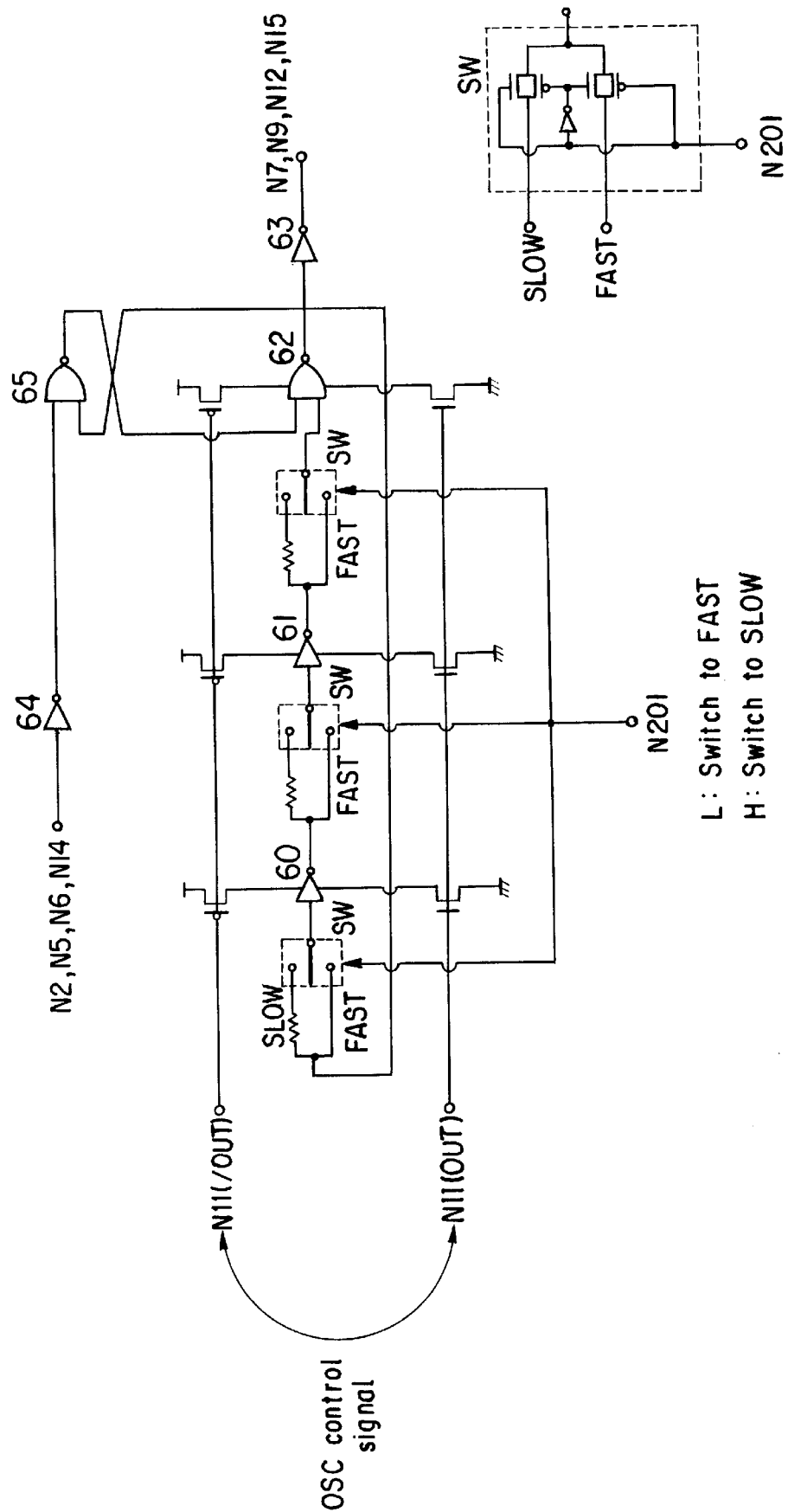
FIG. 34 shows an example of an oscillator in the fifth embodiment.

FIG. 34 shows an example of an oscillator in the fifth embodiment. The basic operation, as in the oscillators in FIG. 10, is oscillation due to multivibrators comprising inverters 60, 61 and NAND 62. Also, an RS flip-flop comprises NAND gates 65, 62. This oscillator has oscillator frequency switching portions SW provided ahead of the inverters 60, 61 and NAND circuit 62 comprising the multivibrator. This switching portion SW has the structure as in the lower right of FIG. 34 and sets the oscillation frequency of the oscillators to high speed or low speed, depending on the oscillator speed selection signal N201, supplied from the oscillator speed selecting circuit 220. When the oscillator speed selection signal N201 is low level, the switching portion SW selects a terminal without resistors and the oscillators are switched to the high speed side. When the oscillator speed selection signal N201 is high level, the switching portion SW selects a terminal with resistors and the oscillators are set to the low speed side.

Figure 35:
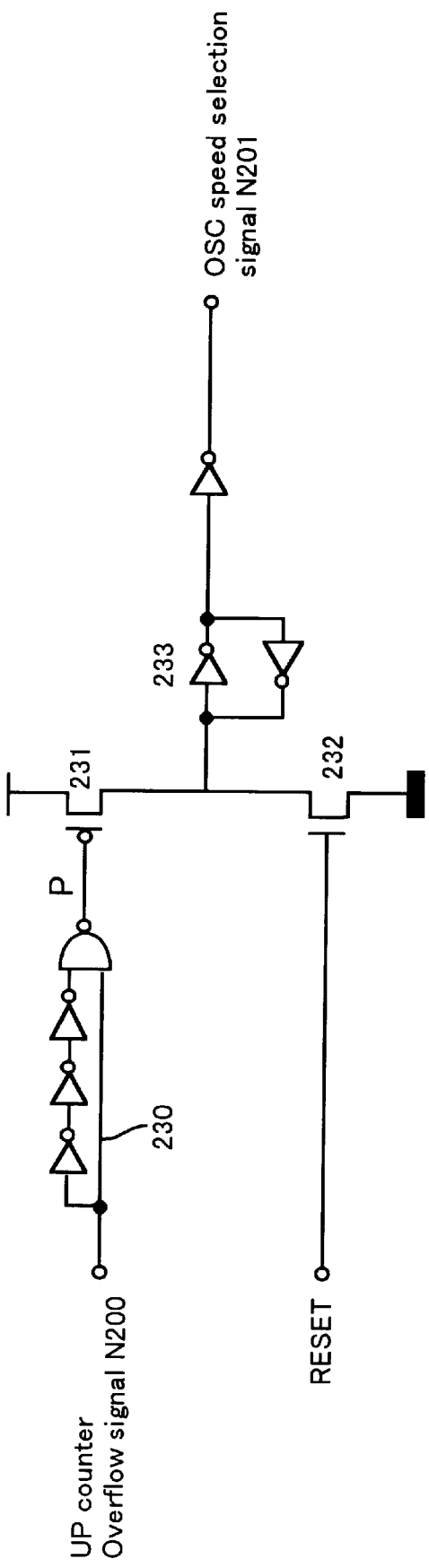
FIG. 35 shows an example of an oscillator speed selecting circuit.
Figure 36:
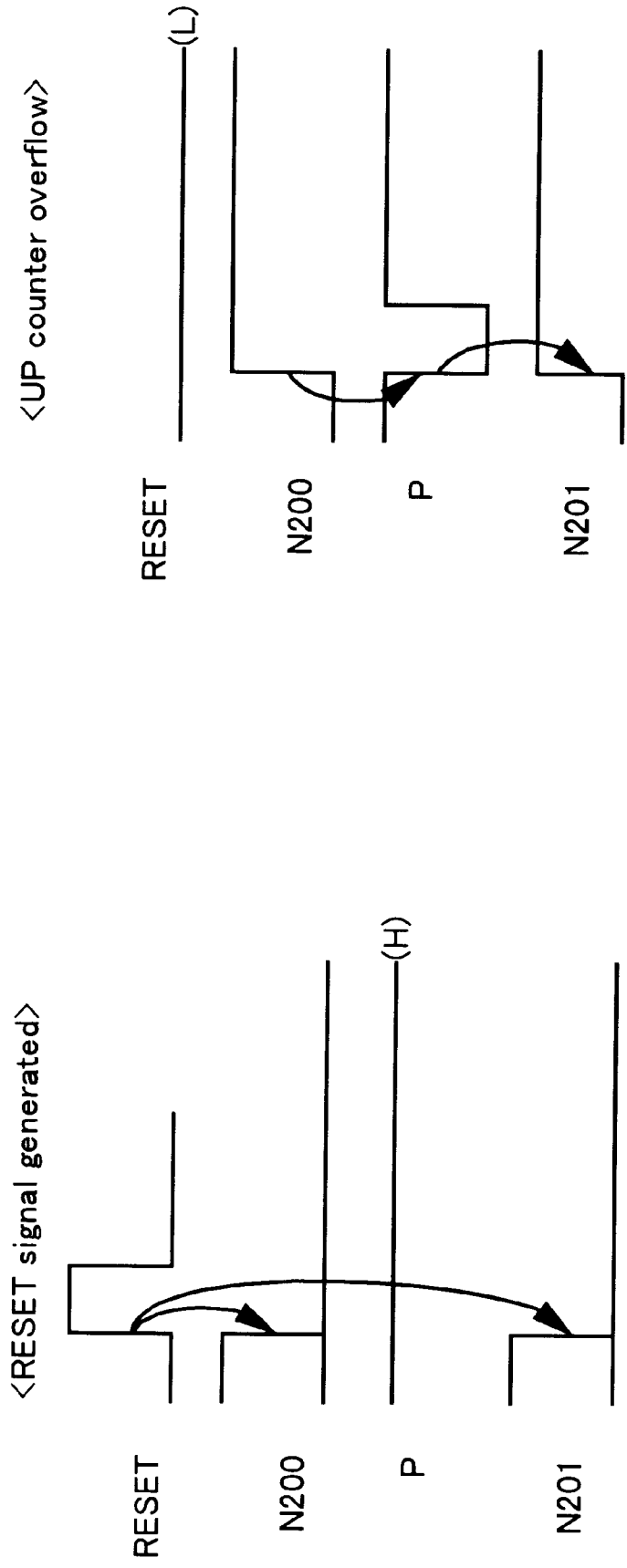
FIG. 36 shows a timing chart for an oscillator speed selecting circuit.

FIG. 35 shows an example of the oscillator speed selecting circuit 200. FIG. 36 shows the timing chart for the operation thereof.

When the reset signal RESET is emitted, the NMOS transistor 232 in the figure turns ON. At this time, the node P is high level and the PMOS transistor 231 remains OFF. For this reason, the reset signal RESET is latched by the latch circuit 233 and the oscillator speed selection signal N201 is reset to low level. As discussed above, the up counter 20 is reset when the reset signal RESET is emitted; as a result, the overflow signal N200 of the up counter 20 is also reset to low level.

Next, when the up counter 20 overflows, the overflow signal N200 becomes high level. A negative pulse signal P is accordingly emitted from the pulse emitting circuit 230 and the PMOS transistor 231 becomes ON. Because the reset signal RESET is low level at this time, the NMOS transistor 232 remains OFF. The oscillator speed selection signal N201 therefore becomes high level and is supplied to each oscillator, whereby they are switched to low speed operation.

In the fourth and fifth embodiments, the operation of the oscillators is controlled according to the frequency of the master clock CLK. In the aforementioned examples, a selection from two speeds was made, but it is also possible to select among a plurality of speeds.

Sixth Embodiment

Figure 37:
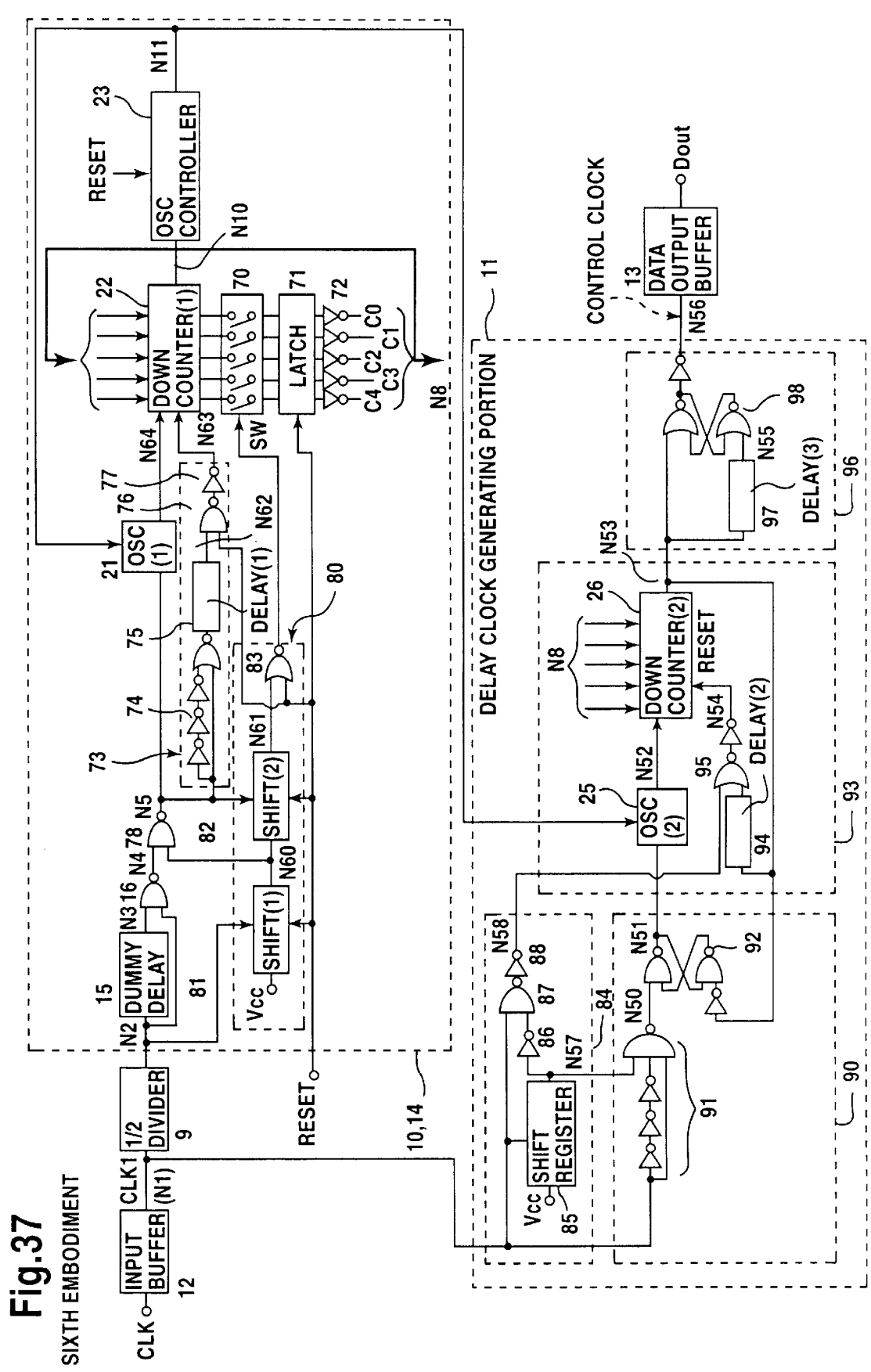
FIG. 37 shows a detail of the self-timing control circuit in the sixth embodiment.
Figure 38:
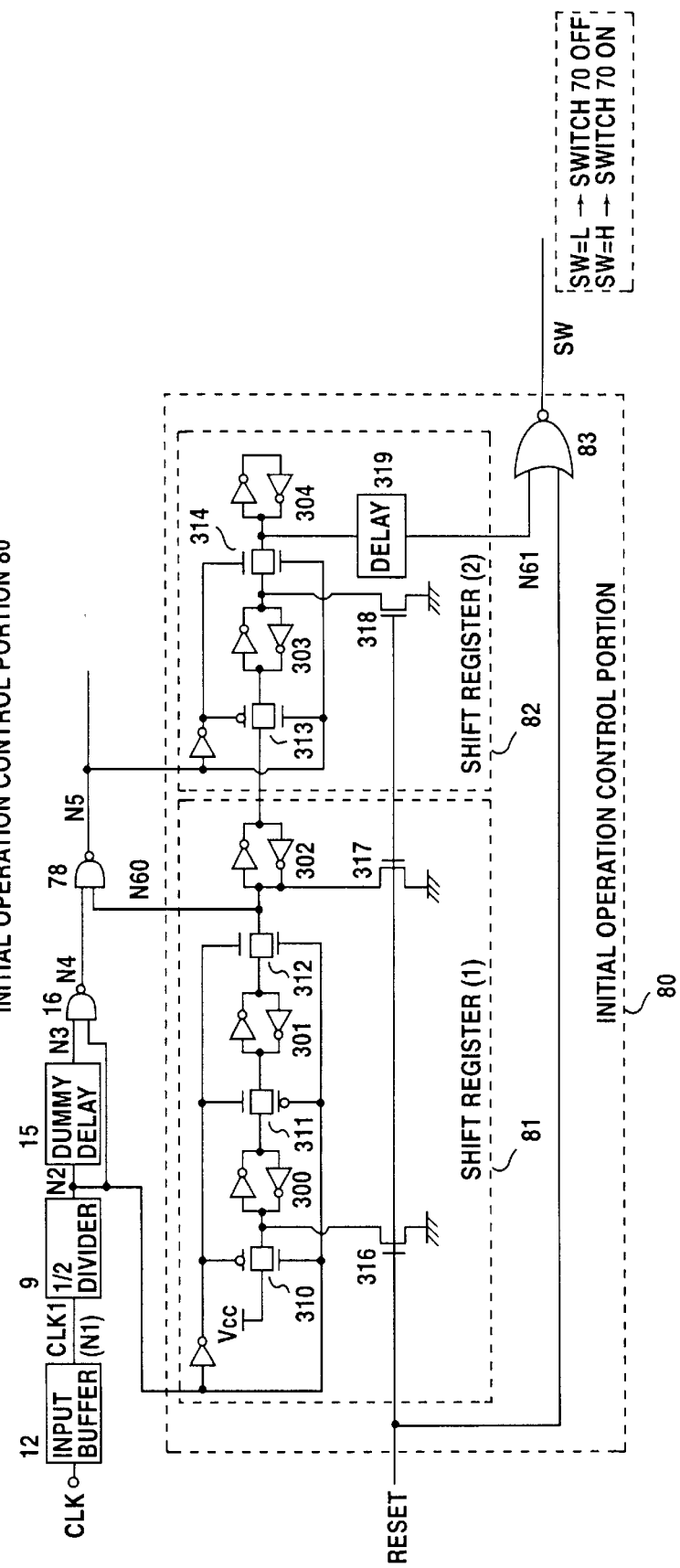
FIG. 38 shows a detailed circuit diagram of the initial operation control portion in the self-timing control circuit.
Figure 39:
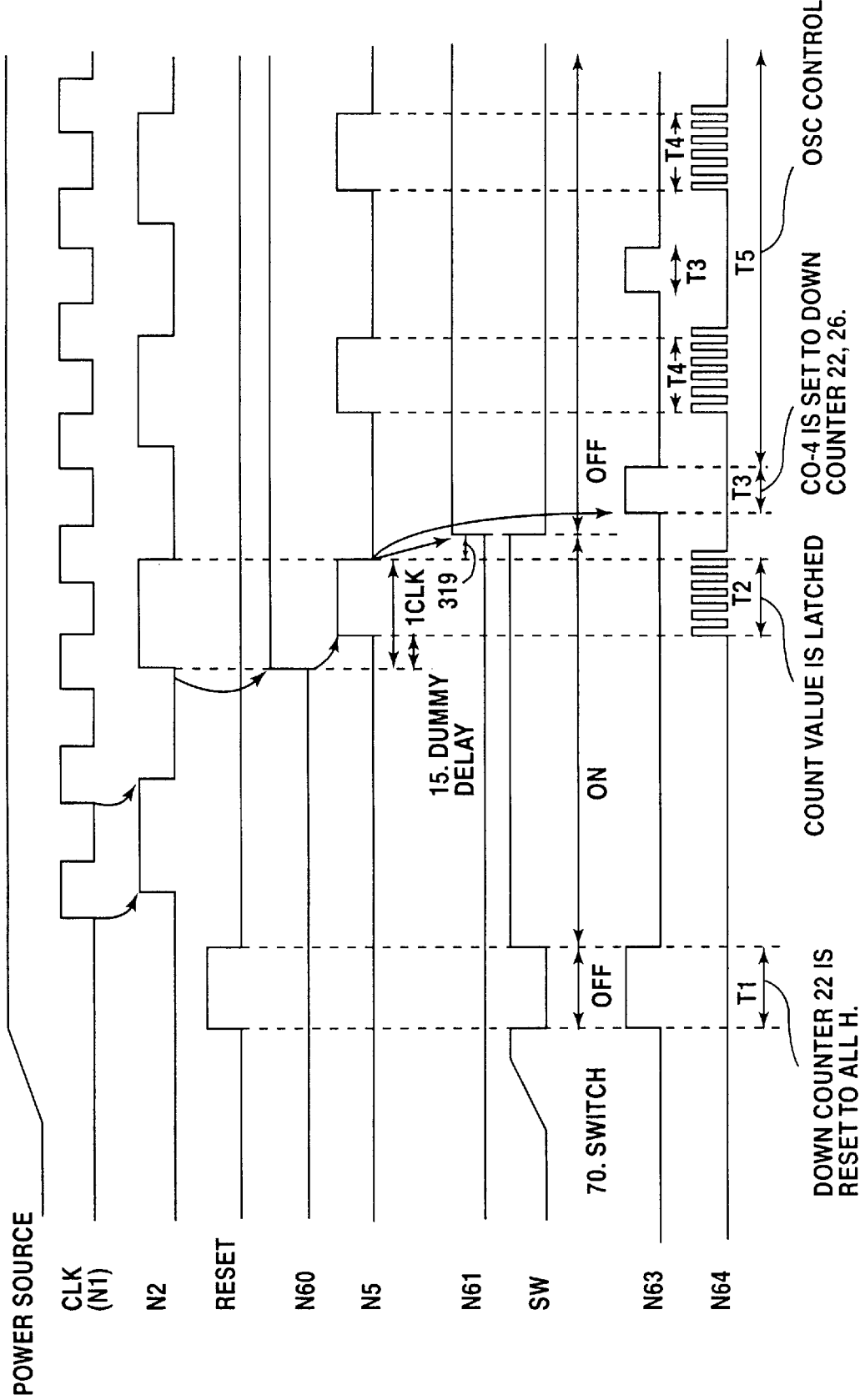

FIG. 37 shows a detail of the self-timing control circuit in the sixth embodiment. FIG. 38 shows a detailed circuit diagram of the initial operation control portion in the self-timing control circuit. Furthermore, FIGS. 39 and 40 are timing charts showing the operations of the self-timing control circuit in the sixth embodiment.

The sixth embodiment is an example wherein the self-timing control circuit in the first embodiment, shown in FIG. 4, is simplified in its structure. First of all, the self-timing control circuit in FIG. 4 comprises a clock cycle counting circuit 10 comprising an oscillator 19 and up counter 20, to generate the clock cycle count value, and a delay time adjusting circuit 14 for adjusting the speed of each oscillator so that clock cycle count value, as the initial value, matches a count value corresponding to a cycle of the master clock. The oscillator 19 and down counter 22 are established in the delay time adjusting circuit 14. In other words, the clock cycle counting circuit 10 and delay time adjusting circuit 14 of the self-timing control circuit in FIG. 4 each have oscillators 19, 21 and counters 20, 22.

The self-timing control circuit in this sixth embodiment has a simplified circuit wherein the oscillators and counters are shared. As shown in FIG. 37, the clock cycle counting circuit 10 and delay time adjusting circuit 14 have one oscillator 21 and down counter 22. The complement of the count value from the down counter 22 is generated by an inverter 72 and set as the initial value N8 to the down counters 22, 26. Use of the complement makes it possible to detect and set the clock cycle count value by using the down counter 22 which is the same as the one of the control clock generating portion 11. Furthermore, that down counter 22 carries out frequency control of the oscillator thereafter.

Secondly, the self-timing control circuit in FIG. 4 has two oscillators 25, 28 and two down counters 26, 29 in the control clock generating portion 11. These two sets of oscillators and down counters act alternately to generate the control clock N17, the phase of which is synchronized with the master clock CLK. On the other hand, the control clock generating portion 11 of the self-timing control circuit in the sixth embodiment has one oscillator 25 and one down counter 26. This one set comprising the oscillator 25 and down counter 26 begins and ends oscillation and down counting within the period of one cycle of the master clock CLK. For this reason, the oscillator 25 begins oscillating in synchronization with the leading edge of the master clock CLK1 (N1) having passed through the input buffer 12; the oscillation of the oscillator 25 is stopped by the signal N53 as timed by the down counter 26 completing its count. This operation is discussed in detail below.

The circuit structure of the sixth embodiment is explained using FIG. 37. In FIG. 37, the same references are used for circuits identical to FIG. 4. The master clock CLK is taken up by the input buffer 12 and the clock CLK1 (N1) delayed by the delay time of the input buffer 12 is generated. The frequency thereof is split in half by the ½ divider 9 and a clock N5 is generated with the dummy delay circuit 15, NAND gate 16, and NAND gate 78. The clock N5 has a cycle of the delay time of the input buffer 12 and data output buffer 13 subtracted from the cycle of the master clock CLK. While the clock N5 is high, the oscillator 21 oscillates and supplies a pulse signal N64 to the down counter 22; the down counter 22 counts down the pulse signal N64 and outputs a signal N10 showing whether the down count is finished. The oscillator control portion 23 controls the frequency of the oscillators 21, 25 according to this signal N10. Up to this point, the constitution is identical to that in FIG. 4.

The clock cycle counting circuit 10 and delay time controlling circuit 14 in the sixth embodiment carry out a clock cycle counting action with the down counter 22 and count down the pulses N64 while the clock N5 is high. The down counter is therefore connected to a latch circuit 71 via a switch 70; the latch data of the latch circuit 71 is inverted with the inverter 72; and the initial value N8 (C0–C4) is generated as a complement of the latch data.

In other words, when the power is turned on, the latch circuit 71 is reset, all the latch data becomes low, all the complement data C0–C4 becomes high, and the initial data (11111) are set to the down counter 22. The down counter 22 counts down the pulse signal N64 generated during the period when the following clock N5 is high. That count value is latched by the latch circuit 71 in response to the trailing edge of the clock N5. The complement of that latch data is set to the down counters 22, 26 as the clock cycle count value N8, in response to the reset signals N63, N54.

Afterwards, in response to the repeated clock N5, the down counter 22 counts down from the clock cycle count value N8 and the oscillator control portion 23 controls the frequency of the oscillators 21, 25. When the frequency of the oscillators 21, 25 is stabilized, the control clock generating portion 11 starts generating the control clock N56.

In order to carry out the abovementioned operations, the down counter-reset signal generating portion 73 and initial operation control portion 80 are established within the delay time controlling circuit 14. The down counter-reset signal generating portion 73 comprises an inverter 77, NAND gate 76, delay circuit 75, and pulse generating circuit 74 comprising an inverter and NOR gate. As shown in the initial operation timing chart in FIG. 39, the down counter-reset signal generating portion 73 generates a reset signal N63 in response to the reset signal RESET generated after the power is turned on (period T1) and sets the all high (11111) to the down counter 22. After that, the down counter 22 counts down and detects the clock cycle count value in period T2. In the subsequent oscillator control operations, the down counter-reset signal 25 generating portion 73 generates the reset signal N63 with circuits 74, 75, 76, 77 (period T3) in synchronization with the trailing edge of the clock N5 generated each time in response to the master clock CLK. The down counter-reset signal generating portion 73 sets the initial value N8, which is the complement of the latch data from the latch circuit 71, to the down counter 22.

Next, the down counter 22 repeats the down count operation T4 and the reset operation T3 for the initial value N8.

The initial operation control portion 80 comprises a shift register 81 which receives the power source Vcc (high) and shifts it in response to the clock N2, a shift register 82 which receives the clock N60 and shifts it in response to the clock N5, and a NOR gate 83. FIG. 38 shows a circuit diagram of this initial operation control portion 80. The first shift register 81 comprises latch circuits 300, 301, 302 comprising two inverters, CMOS transistor gates 310, 311, 312, and transistors 316, 317 for resetting. The later shift register 82 comprises latch circuits 303, 304, transistor gates 313, 314, a transistor 318 for resetting, and a delay circuit 319.

As shown in the timing chart in FIG. 39, the function of this initial operation control portion 80 is, first of all, as follows: the shift register 81 synchronizes with the leading edge and trailing edge of the clock N2, transfers the high level input, opens the NAND gate 78 following the leading edge of the second clock signal N2 after the power is turned on, and starts generating the clock N5. In other words, the transistors 316–318 become conductive with the reset signal RESET and make each node thereof (signal N60) low; the transfer gate 312 then becomes conductive in synchronization with the leading edge of the second clock N2 and the signal N60 changes from low to high. The NAND gate 78 is opened with this signal N60 and the clock N5 begins to be supplied to the oscillator 21.

The second function of the initial operation control portion 80 is to control whether the switch 70 is on or off. As shown in FIG. 39, the switch 70 is turned off in response to the reset signal RESET and during that time, the latch circuit 71 is reset (period T1). Next, the switch 70 is turned on when the reset signal RESET is then low; the count value of the down counter 22 is latched by the latch circuit 71. The signal N61 changes into H level after the first trailing edge of the clock N5, and the switch 70 is thereafter kept off. This off state is maintained by the latch circuit 304.

As above, the clock cycle counting circuit 10 and delay time adjusting circuit 14 reset the latch circuit 71 in period T1 and reset the down counter 22 to (1111) as shown in FIG. 39. Then, while the clock N5 generated using the second clock N2 is high (period T2), the down counter 22 counts down the pulse signal N64 from (1111) and that count value is latched by the latch circuit 71. The complement of that count value is then set to down counters 22, 26 as the clock cycle count value N8. Afterwards, the down counter 22 is reset with the reset signal N63 in period T3 and repeats the count down operation in period T4. With this operation, the oscillator control portion 23 adjusts the frequency of the oscillators 21, 25 as discussed above (period T5).

The constitution and operation of the control clock generating portion 11 in FIG. 37 are explained next. The control clock generating portion 11 comprises an initial operation control portion 84, oscillator clock generating portion 96, control clock delay generating portion 93, and control clock pulse width adjusting portion 96. The control clock generating portion 11 generates the control clock N56, the phase of which is synchronized with the leading edge of the master clock CLK.

The initial operation control portion 84 comprises a clock shift register 85, inverters 86, 88, and NAND gate 87. After power is turned on, the clock shift register transmits high level input synchronized with the clock N1; after 10 clocks, the initial operation control portion 84 changes the signal N57 from low to high and starts generation of the pulse N50 by the oscillator clock generating portion. During the frequency adjustment period until generation of the pulse N50 begins, the clock N58 is generated in synchronization with the clock N1; the initial operation control portion 84 supplies the reset signal N54 to the down counter 26 and sets the clock cycle count value N8 to the down counter 26.

The oscillator clock generating portion 90 comprises a flip-flop 92 and pulse generating circuit 91 for generating negative pulses N50 in synchronization with the leading edge of the clock CLK1 (N1). After the signal N57 is changed from low to high with the initial operation control portion 84, generation of the pulse signal N50 for starting the oscillators begins. As shown in the timing chart in FIG. 40, the pulse signal N50 for starting the oscillators drops after the delay (a) of the input buffer 12 from the leading edge of the master clock CLK. The flip-flop 92 is set with this pulse signal N50 and the clock N51 becomes high. In response thereto, the oscillator 25 begins to oscillate, generates the pulse signal N52, and supplies that to the down counter 26.

The down counter 26 counts down from the initial value N8 and generates the pulse signal N53 when the count value becomes zero. In synchronization with the leading edge of this pulse signal N53, the flip-flop 92 is reset, the clock N51 becomes low, and the oscillator 25 stops oscillating. In response to the pulse signal N53, the reset signal N54 is generated after the delay time of the delay circuit 94 and resets the down counter 26. The pulse signal N53 thereby becomes low once more and enters a state where the next down count is possible.

The signal N51 controlling the oscillator 25 synchronizes with the trailing edge of the start signal N50 and becomes high, and starts the operation of the oscillator 25. The oscillator control signal N51 becomes low again in synchronization with the pulse signal N53 generated as timed by the down counter 26 finishing the count down of the initial value N8. This operation is repeated. In other words, the down counter 26 generates a pulse signal N53 delayed from the leading edge of the clock N51 with the period for count down of the initial value N8.

The control clock pulse width adjusting portion 96 comprises a delay circuit 97 and flip-flop 98. The control clock pulse width adjusting portion 96 increases the pulse width of the pulse signal N53 generated by the down counter 26 and generates a control clock N56. The pulse width of the control clock N56 corresponds to the delay period of the delay circuit 97.

In one series of operations by the control clock generating portion 11, the start signal N50 drops after the delay time of the input buffer 12 from the leading edge of the master clock CLK. In response thereto, the oscillator control clock N51 becomes high. The down counter 26 counts down the pulse signal N52 from the initial value N8 and generates the pulse signal N53 upon reaching zero. The down counter 26 makes the oscillator control clock N51 low via the flip-flop 92 and stops the oscillator 25. Consequently, the oscillator 25 generates only the pulse signal N52 for the initial value N8 to prepare for the next oscillation operation. After a delay time due to a delay circuit 94 having a delay time greater than the pulse width of the oscillation pulse N52, the reset signal N54 resets the down counter 26 and prepares for the next operation.

In the sixth embodiment, the control clock generating portion 11 begins and completes the operation of the down counter within a period of one cycle of the master clock CLK. The pulse width of the pulse signal N53 for controlling the completion therefore becomes narrow. In effect, the signal N51 becomes low at the leading edge of the pulse signal N53 and the oscillator 25 stops; at the trailing edge of the pulse signal N53, the signal N51 enters a state where rising is possible and the oscillator 25 enters a state where starting is possible. Then the oscillator 25 begins the oscillation in synchronization with the trailing edge of the following s tart signal N50. Consequently the pulse width of the pulse signal N53 must be sufficiently narrow. The control clock N56, with increased pulse width of the pulse signal N53, is therefore generated by the control clock pulse width adjusting portion 96.

As shown in FIG. 40, the high period (b) of the signal N51 corresponds to the delay time of the oscillator 25 and down counter 26. The period (c), from the leading edge of the signal N53 to the leading edge of the next master clock CLK, corresponds to the delay period of the data output buffer 13.

The clock cycle counting circuit 10 and delay time adjusting circuit 14 in the sixth embodiment can be applied to the first embodiment as well. The control clock generating portion 11 in the sixth embodiment may also be applied to the first embodiment.

The down counters 22, 26 in the sixth embodiment may also both be up counters. In that case as well, the complement of the counter 22 is set as the initial value to the counter 26 and the pulse signal N53 should be generated as timed by the counter 26 counting up and overflowing.

Likewise, the counters in the first through fifth embodiments may also be up counters. In that case, the signals following the end of each count are generated as timed by the overflow. When the first through fifth down counters are used as up counters, the up counter in the clock cycle counting circuit is preferably a down counter.

As explained above, the present invention is a self-timing control circuit for generating a control clock, synchronized in a prescribed phase relationship to a master clock, and can provide a self-timing control circuit which can lock on in a short time and with high precision, without employing a large scale variable delay circuitry like a prior art.

What is claimed is:

1. A self-timing control circuit for generating a control clock, synchronized in a prescribed phase relationship to a master clock, comprising:
   a clock cycle counting circuit for counting oscillation pulses for a period corresponding to a cycle of said master clock and generating a clock cycle count value; and
   a control clock generating portion for starting a count of the oscillation pulses in synchronized with said master clock, and generating the control clock at a timing when counting up to said clock cycle count value.

2. A self-timing control circuit for generating a control clock, synchronized in a prescribed phase relationship to a master clock, comprising:
   a clock cycle counting circuit for counting oscillation pulses for a period corresponding to a cycle of said mater clock and generating a clock cycle count value;
   a control clock generating portion for starting a count of the oscillation pulses in synchronized with said master clock, and generating the control clock at a timing when counting up to said clock cycle count value; and
   wherein said clock cycle counting circuit comprises:
   a first oscillation circuit for generating said oscillation pulses in a period corresponding to a cycle of said master clock; and
   a first counter for counting said oscillation pulses generated by said first oscillation circuit.

3. The self-timing control circuit, according to claim 2, wherein said clock cycle counting circuit further comprises a counting clock generating circuit for generating a counting clock, with a pulse width corresponding to the cycle of said master clock, in response to a reset signal; and
   wherein said first oscillation circuit generates said oscillation pulses in response to said counting clock.

4. The self-timing control circuit, according to any of claims 1 through 3, wherein said control clock generating portion comprises:
   a second oscillation circuit for starting oscillation in response to said master clock; and
   a second counter for counting oscillation pulses generated by said second oscillation circuit and generating said control clock, at the timing when counting up to said clock cycle count value.

5. The self-timing control circuit, according to claim 4, wherein said control clock generating portion, said second oscillation circuit stops oscillating and said second counter is reset as timed by said second counter counting up to said clock cycle count value.

6. The self-timing control circuit, according to claim 4, further comprising;
   a frequency dividing circuit for generating a dividing clock, wherein the frequency of said master clock is multiplied by 1/N (N is an integer of 2 or greater);
   wherein said control clock generating portion comprises N layers of said second oscillator and second counter; the second oscillator in each layer starts oscillating in response to said dividing clock and a dividing clock with a phase opposite thereto; control clocks generated by the second counter in each layer are synthesized; and a synthesized control clock is generated.

7. The self-timing control circuit, according to any of claims 1 through 3, wherein said clock cycle count value is a count value corresponding to a period of the period of said master clock cycle minus a prescribed dummy delay time; and said prescribed dummy delay time comprises at least a delay time for said master clock at an input buffer.

8. The self-timing control circuit, according to any of claims 1 through 3, wherein the frequency of said oscillation pulses, counted by said clock cycle counting circuit and said control clock generating portion, is switched between a low frequency and high frequency, depending on whether said clock cycle count value is great or small.

9. The self-timing control circuit, according to claim 1, wherein said clock cycle counting circuit comprises a first counter for counting said oscillation pulses during a period corresponding to a cycle of said master clock;
   said control clock generating portion comprising a oscillation circuit which starts oscillation in response to said master clock, and a second counter which generates said control clock as timed by counting the oscillation pulses generated by said second oscillation circuit and counting up to said clock cycle count value; and
   the complement of the count value counted by said first counter is set as the initial value for said second counter.

10. A self-timing control circuit for generating a control clock, synchronized in a prescribed phase relationship to a master clock, comprising:
    a clock cycle counting circuit for counting oscillation pulses for a period corresponding to a cycle of said master clock and generating a clock cycle count value;
    a delay time adjusting circuit for starting a count of oscillation pulses in synchronized with said master clock, and generating an oscillator control signal, according to an adjusting count value at the end of the period corresponding to the cycle of said master clock; and a control clock generating portion for starting a count of the oscillation pulses in synchronized with said master clock, and generating said control clock at a timing when counting up to said clock cycle count value;

wherein the frequency of said oscillation pulses, counted by said delay time adjusting circuit and said control clock generating portion, is controlled by said oscillator control signal so that said adjusting count value is matched to said clock cycle count value.

11. The self-timing control circuit, according to claim 10, wherein said clock cycle count value is a count value corresponding to a period of the period of said master clock cycle minus a prescribed dummy delay time; and said prescribed dummy delay time comprises at least a delay time for said master clock at an input buffer.

12. The self-timing control circuit, according to claim 10, wherein said clock cycle count value is a count value corresponding to a period of the period of said master clock cycle minus a prescribed dummy delay time; and said prescribed dummy delay time comprises at least a delay time for said master clock at an input buffer and a delay time at an output buffer which output an output signal in response to said control clock.

13. The self-timing control circuit, according to claim 10, wherein said delay time adjusting circuit comprises a first oscillator for starting oscillation in response to said master clock and a first counter for counting said oscillation pulses generated by said first oscillator; and generates said oscillator control signal depending on the phase of said oscillation pulses at the end of the period corresponding to a cycle of said master clock; wherein the frequency of said first oscillator is controlled by said oscillator control signal.

14. The self-timing control circuit, according to claim 10 or 13, wherein said control clock generating portion comprises:
   a second oscillator for starting oscillation in response to said master clock; and
   a second counter for counting said oscillation pulses generated by said second oscillator and generating said control clock at a timing when counting up to said clock cycle count value;
   wherein the frequency of said second oscillator is controlled by said oscillator control signal.

15. The self-timing control circuit, according to claim 14, wherein said control clock generating portion, said second oscillation circuit stops oscillating and said second counter is reset as timed by said second counter counting up to said clock cycle count value.

16. The self-timing control circuit, according to claim 14, further comprising:
   a frequency dividing circuit for generating a dividing clock, wherein the frequency of said master clock is multiplied by 1/N (N is an integer of 2 or greater);
   wherein said control clock generating portion comprises N layers of said second oscillator and second counter; the second oscillator in each layer starts oscillating in response to said dividing clock and a dividing clock with a phase opposite thereto; control clocks generated by the second counter in each layer are synthesized; and a synthesized control clock is generated.

17. The self-timing control circuit, according to claim 10, further comprising:
   a clock half cycle counting circuit for counting oscillation pulses, for a period corresponding to said master clock cycle, in response to said reset signal and generating a half cycle count value corresponding to half of said master clock cycle;
   wherein said control clock generating portion further starts a count of the oscillation pulses synchronizing with said master clock and generates a half cycle control clock at a timing of when counting up to said half cycle count value.

18. The self-timing control circuit, according to claim 17, further comprising:
   a half cycle delay time adjusting circuit for starting a count of the oscillation pulses in synchronized with said master clock, and generating a half cycle oscillator control signal, according to a half cycle adjusting count value at the end of said master clock cycle;
   wherein the frequency of said oscillation pulses, counted by said half cycle counting circuit and half cycle delay time adjusting circuit, is controlled according to said half cycle oscillator control signal, so that said half cycle adjusting count value is matched to said half cycle count value.

19. The self-timing control circuit, according to claim 10, wherein the frequency of said oscillation pulses, counted by said delay time adjusting circuit and said control clock generating portion, is switched between a low frequency and high frequency, depending on whether said clock cycle count value is great or small.

20. A self-timing control circuit for generating a control clock, synchronized in a prescribed phase relationship to a master clock, comprising:
   a clock cycle counting circuit including a first oscillator for generating oscillation pulses for a period corresponding to said master clock cycle, and a first counter for counting the oscillation pulses generated by said first oscillator and generating a clock cycle count value; and
   a control clock generating portion including a second oscillator for starting oscillation in response to said master clock, and a second counter for counting the oscillation pulses generated by said second oscillator and generating said control clock at a timing when counting up to said clock cycle count value;
   wherein the frequency of said first and second oscillators is raised or lowered depending on the presence of an overflow operation of said first counter.

21. The self-timing control circuit, according to claim 20, wherein said first and second oscillators comprise a plurality of oscillators with different frequencies; and said plurality of oscillators is switched among low frequency oscillators and high frequency oscillators depending on the presence of an overflow operation of said first counter.

22. A self-timing control circuit for generating a control clock, synchronized in a prescribed phase relationship to a master clock, comprising:
   a clock cycle counting circuit including a first oscillator for generating oscillation pulses for a period corresponding to said master clock cycle, in response to a reset signal, and a first counter for counting the oscillation pulses generated by said first oscillator and generating a clock cycle count value;
   a control clock generating portion including a second oscillator for starting oscillation in response to said master clock, and a second counter for counting the oscillation pulses generated by said second oscillator and generating said control clock at a timing when counting up to said clock cycle count value; and
   a delay time adjusting circuit including a third oscillator for starting oscillation in response to said master clock and a third counter for counting the oscillation pulses generated by said third oscillator; and generates an oscillator control signal according to the phase of said oscillation pulses at the end of a period corresponding to said master clock cycle;

wherein the frequency of said oscillation pulses, counted by said delay time adjusting circuit and said control clock generating portion, is controlled by said oscillator control signal, so that a count value of the third counter at the end is matched to said clock cycle count value; and wherein the frequency of said first and second oscillators is raised or lowered according to the presence of an overflow operation of said first counter.

23. A self-timing control circuit for generating a control clock, synchronized with and having a prescribed phase relationship to a master clock, comprising:

a clock cycle count and delay time adjusting circuit comprising a first oscillator for generating oscillation pulses during a period corresponding to a cycle of said master clock in response to a reset signal, and a first counter for counting the oscillation pulses generated by said first oscillator and generating a clock cycle count value, wherein said clock cycle count value is set as the initial value for the first counter, the oscillation pulses generated by said first oscillator is counted by the first counter therefrom so that said clock cycle count and delay time adjusting circuit generates an oscillator control signal at the end of the period corresponding to a cycle of said master clock; and a control clock generating portion comprising a second oscillator which begins oscillation in response to said master clock, and a second counter which generates said control clock as timed by counting the oscillation pulses generated by said second oscillator and counting up to said clock cycle count value, wherein the frequency of said oscillators are controlled by said oscillator control signal so that the count value of the first counter at said ending time matches said clock cycle count value.

24. The self-timing control circuit, according to claim 23, wherein said first counter and second counter are both constituted with down counters or up counters;

wherein the complement of the count value of said first counter is set as said initial value to said first and second counters.

* * * * *